US010957690B2

(12) United States Patent
Naito

(10) Patent No.: US 10,957,690 B2
(45) Date of Patent: Mar. 23, 2021

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/296,096

(22) Filed: Mar. 7, 2019

(65) Prior Publication Data

US 2019/0287962 A1 Sep. 19, 2019

(30) Foreign Application Priority Data

Mar. 15, 2018 (JP) ............................ JP2018-048618

(51) Int. Cl.
*H01L 27/06* (2006.01)
*H01L 21/8234* (2006.01)
*H01L 29/06* (2006.01)
*H01L 29/08* (2006.01)
*H01L 29/739* (2006.01)

(52) U.S. Cl.
CPC .. *H01L 27/0635* (2013.01); *H01L 21/823481* (2013.01); *H01L 27/0629* (2013.01); *H01L 29/0619* (2013.01); *H01L 29/083* (2013.01); *H01L 29/7397* (2013.01)

(58) Field of Classification Search
None
See application file for complete search history.

(56) References Cited

U.S. PATENT DOCUMENTS 10,050,645 B2 8/2018 Kouno
10,060,275 B2 8/2018 Kouno
10,170,060 B2 1/2019 Kouno
2009/0242931 A1* 10/2009 Tsuzuki ................ H01L 29/167 257/143
2010/0187567 A1 7/2010 Tanabe
2014/0361333 A1 12/2014 Kimura
2017/0084610 A1* 3/2017 Kouno .................... H01L 29/32
(Continued)

FOREIGN PATENT DOCUMENTS

JP 2009267394 A 11/2009
JP 2010199559 A 9/2010
(Continued)

*Primary Examiner* — Khaja Ahmad

(57) ABSTRACT

The reverse recovery withstand capability of a semiconductor device is improved. A semiconductor device is provided, including: a semiconductor substrate; an active portion that is provided in the substrate and through which current flows between upper and lower surfaces of the substrate; a transistor portion provided in the active portion; a diode portion provided in the active portion and arrayed next to the transistor portion along a predetermined array direction in a top view of the substrate; and an edge termination structure portion provided between a peripheral end of the substrate and the active portion in the top view. The lifetime control region including a lifetime killer is provided on an upper-surface side of the substrate and in a range from the diode portion to at least part of the edge termination structure portion, facing the diode portion in a direction of extension orthogonal to the array direction.

21 Claims, 56 Drawing Sheets

(56) References Cited

U.S. PATENT DOCUMENTS

| | | | | |
|---|---|---|---|---|
| 2017/0263603 | A1* | 9/2017 | Hata | ...................... H01L 29/32 |
| 2019/0019885 | A1 | 1/2019 | Naito | |

FOREIGN PATENT DOCUMENTS

| | | | |
|---|---|---|---|
| JP | 2011086852 | A | 4/2011 |
| JP | 2013152996 | A | 8/2013 |
| JP | 2015185742 | A | 10/2015 |
| JP | 2017045949 | A | 3/2017 |
| JP | 2017059711 | A | 3/2017 |
| WO | 2018074425 | A1 | 4/2018 |

* cited by examiner

100

200

200 e - e'

200 j-j'
200

200 n−n'
200

200

200

200

SEMICONDUCTOR DEVICE

The contents of the following Japanese patent application(s) are incorporated herein by reference:

NO. 2018-48618 filed on Mar. 15, 2018.

BACKGROUND

1. Technical Field

The present invention relates to a semiconductor device.

2. Related Art

A semiconductor device such as an insulated gate bipolar transistor (IGBT) has conventionally been known (see Patent Literature 1, for example).

Patent Literature 1: Japanese Patent Application Publication No. 2013-152996

A semiconductor device preferably has an improved reverse recovery withstand capability.

SUMMARY

One aspect of the present invention provides a semiconductor device including: a semiconductor substrate; an active portion that is provided in the semiconductor substrate and through which current flows between an upper surface and a lower surface of the semiconductor substrate; a transistor portion provided in the active portion; a diode portion that is provided in the active portion and arrayed next to the transistor portion along a predetermined array direction in a top view of the semiconductor substrate; and an edge termination structure portion provided between a peripheral end of the semiconductor substrate and the active portion in the top view of the semiconductor substrate. A lifetime control region including a lifetime killer is provided on an upper-surface side of the semiconductor substrate and in a range from the diode portion to at least part of the edge termination structure portion, and the lifetime control region faces the diode portion in a direction of extension orthogonal to the array direction in the top view of the semiconductor substrate.

The lifetime control region may be provided below the well region and terminate at a position closer to the peripheral end than the well region terminates.

The diode portion may have:

- a second-conductivity type contact region (for example, a second contact region 19) provided in contact with the upper surface of the semiconductor substrate;
- a first-conductivity type cathode region (for example, a second cathode region 82) provided in contact with the lower surface of the semiconductor substrate; and
- an electrically floating, second-conductivity type first floating region provided above the cathode region, and in the top view, at least part of the first floating region and the contact region may overlap in the direction of extension.

In the top view, a distance in the direction of extension between an end portion, in the direction of extension, of the first floating region which is closer to the active portion and an end portion, in the direction of extension, of the contact region which is closer to the active portion may be longer than a distance in the direction of extension between an end portion, in the direction of extension, of the first floating region which is closer to the peripheral end and an end portion, in the direction of extension, of the contact region which is closer to the peripheral end.

The diode portion may have an electrically floating, second-conductivity type second floating region above the cathode region. The first floating region and the second floating region may be arrayed next to each other in the direction of extension.

In the direction of extension, a width of the first floating region may be larger than a width of the second floating region. The lifetime control region may be provided below the contact region.

A second-conductivity type collector region may be provided in contact with the lower surface of the semiconductor substrate at a position closer to the peripheral end than the cathode region is, in the top view, the first floating region may be provided above the cathode region and above the collector region, and in the top view, at least part of the lifetime control region and at least part of the first floating region may overlap in the direction of extension.

The cathode region and the collector region may be provided in contact with each other, and in the top view, an end portion, in the direction of extension, of the lifetime control region which is closer to the active portion may terminate between a boundary between the cathode region and the collector region and an end portion, in the direction of extension, of the first floating region which is closer to the active portion.

A first-conductivity type termination region may be provided at a position closer to the peripheral end than the collector region is, in the top view, and in contact with the lower surface of the semiconductor substrate.

In the top view, a distance in the direction of extension between an end portion, in the direction of extension, of the contact region which is closer to the peripheral end and an end portion, in the direction of extension, of the termination region which is closer to the active portion may be longer than a thickness of the semiconductor substrate.

In the top view, a distance in the direction of extension between an end portion, in the direction of extension, of the contact region which is closer to the active portion and an end portion, in the direction of extension, of the cathode region which is closer to the peripheral end may be longer than a distance in the direction of extension between an end portion, in the direction of extension, of the contact region which is closer to the peripheral end and an end portion, in the direction of extension, of the termination region which is closer to the active portion.

In the top view, a distance in the direction of extension between an end portion, in the direction of extension, of the contact region which is closer to the active portion and an end portion, in the direction of extension, of the cathode region which is closer to the peripheral end may be longer than a thickness of the semiconductor substrate.

in the top view, a distance in the direction of extension between an end portion, in the direction of extension, of the contact region which is closer to the active portion and an end portion, in the direction of extension, of the cathode region which is closer to the peripheral end may be 100 μm or longer.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In the present specification, one side in a direction parallel to the depth direction of a semiconductor substrate is referred as the upward (upper) side, and the other side is referred to as the downward (lower) side. Among two principal surfaces of a substrate, a layer or another member, one surface is referred to as the upper surface, and the other surface is referred to as the lower surface. The "upward" and "downward" directions are not limited by the direction of gravity, or the direction of attachment to a substrate or the like at the time of implementation of a semiconductor device.

In the present specification, technical matters are explained using orthogonal coordinates axes, including an X-axis, a Y-axis and a Z-axis, in some cases. In the present specification, a plane parallel with the upper surface of a semiconductor substrate is defined as an X-Y plane, and the depth direction of the semiconductor substrate is defined as the Z-axis.

Although, in each example, the first-conductivity type is N type, and the second-conductivity type is P type, the first-conductivity type may be P type, and the second-conductivity type may be N type. In this case, the conductivity type of a substrate, a layer, a region or the like in each example becomes the opposite polarity, respectively.

In the present specification, a doping concentration refers to the concentration of impurities that have turned into a donor or acceptor. In the present specification the difference in concentration between a donor and an acceptor is used as a doping concentration in some cases. In addition, if a doping concentration distribution in a doped region has a peak, the value of the peak may be used as the doping concentration in the doped region. If doping concentrations in a doped region are almost uniform or in other cases, the average value of the doping concentrations in the doped region may be used as the doping concentration.

Figure 1A:
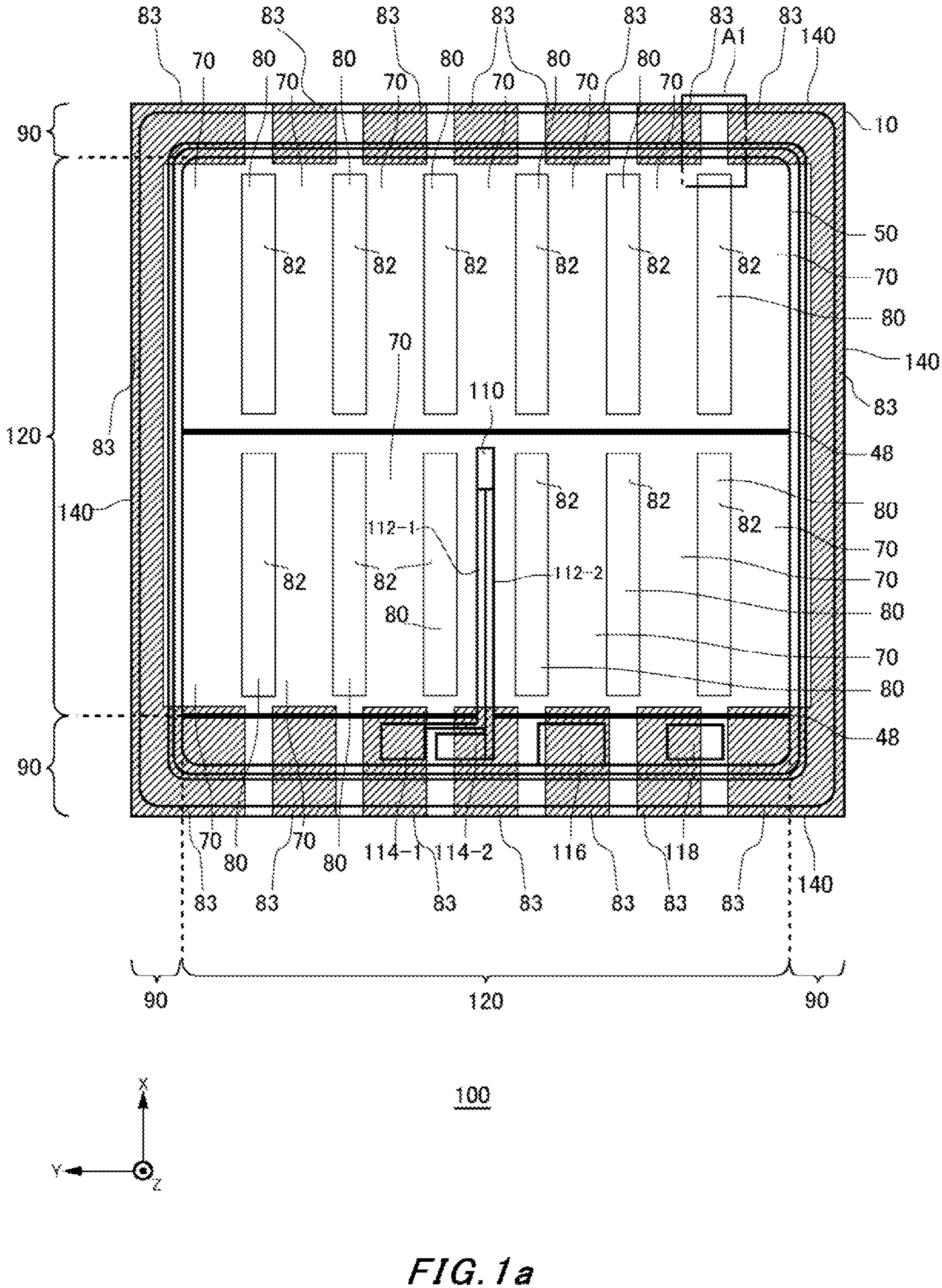
FIG. 1*a* is a figure showing an exemplary upper surface of a semiconductor device 100 according to the present embodiment.

FIG. 1*a* is a figure showing an exemplary upper surface of a semiconductor device 100 according to the present embodiment. The semiconductor device 100 in the present example is a semiconductor chip including transistor portions 70 and diode portions 80. The transistor portions 70 include transistor such as IGBTs. The diode portions 80 include diodes such as FWDs (Free Wheel Diodes) that are provided adjacent to the transistor portions 70 on the upper surface of a semiconductor substrate 10.

The semiconductor substrate 10 is provided with an active portion 120. The active portion 120 is a region where main current flows between the upper surface and lower surface of the semiconductor substrate 10 when the semiconductor device 100 is controlled to enter the ON state. That is, it is a region where current flows in the depth direction within the semiconductor substrate 10, from the upper surface of the semiconductor substrate 10 to its lower surface, or from the lower surface to the upper surface. In the present specification, the transistor portions 70 and diode portions 80 are individually referred to as element portions or element regions. A region provided with the element portions may be defined as the active portion 120.

Note that a region in the top view of the semiconductor substrate 10 which is sandwiched by two element portions also is defined as the active portion 120. In the example shown in FIG. 1*a*, a region that is provided with a gate runner 48 sandwiched by element portions also is included in the active portion 120. The active portion 120 can be defined also as regions provided with emitter electrodes and a region that is sandwiched by the emitter electrodes in the top view of the semiconductor substrate 10. In the example shown in FIG. 1*a*, emitter electrodes are provided above the transistor portions 70 and diode portions 80.

A region between the active portion 120 and a peripheral end 140 of the semiconductor substrate 10 in the top view of the semiconductor substrate 10 is defined as an edge termination structure portion 90. The edge termination structure portion 90 is provided to surround the active portion 120 in the top view of the semiconductor substrate 10. In the edge termination structure portion 90, one or more metal pads for connecting the semiconductor device 100 and external devices through wires or the like may be arranged. The semiconductor device 100 may have the edge termination structure portion 90 that surrounds the active portion 120. The edge termination structure portion 90 relaxes electric field concentration on the upper-surface side of the semiconductor substrate 10. The edge termination structure portion 90 may have, for example, a guard ring, a field plate, a RESURF, or a structure obtained by combining them.

The active portion 120 may be provided with a plurality of transistor portions 70 and a plurality of diode portions 80. A transistor portion 70 refers to a region in the active portion 120 in which region a second-conductivity type collector region is provided at the lower surface of the semiconductor substrate 10. A diode portion 80 refers to a region in the active portion in which region a first-conductivity type second cathode region 82 is provided at the lower surface of the semiconductor substrate 10. The second cathode region 82 in the present example is of N+ type, for example. The second cathode region 82 is provided in a range that does not contact the edge termination structure portion 90 as indicated by frames of thin solid lines in FIG. 1*a*. In addition, a gate metal layer 50 may be provided to surround the active portion 120 in the top view in FIG. 1*a*.

The transistor portions 70 and diode portions 80 may be provided next to each other in the Y-axis direction in the top view of the semiconductor substrate 10. In the present specification, the direction in which the transistor portions 70 and diode portions 80 are arrayed is referred to as the array direction (Y-axis direction). The diode portions 80 may be sandwiched by the transistor portions 70 in the Y-axis direction.

A plurality of transistor portions 70 and a plurality of diode portions 80 may be provided in the X-axis direction and Y-axis direction. In the example shown in FIG. 1*a*, two transistor portions 70 are provided in the X-axis direction, seven transistor portions 70 are provided in the Y-axis direction, two diode portions 80 are provided in the X-axis direction, and six diode portions 80 are provided in the Y-axis direction. The gate runner 48 may be provided between two transistor portions 70 in the X-axis direction.

The gate metal layer 50 may be provided to surround the active portion 120 in the top view of the semiconductor substrate 10. The gate metal layer 50 is electrically connected with a gate pad 116 provided in the edge termination structure portion 90. The gate metal layer 50 may be formed of aluminum or an aluminum-silicon alloy. The gate metal layer 50 is electrically connected to the transistor portions 70 and supplies a gate voltage to the transistor portions 70. The edge termination structure portion 90 may be provided with pads such as an emitter pad 118 electrically connected with an emitter electrode.

The semiconductor device 100 in the present example includes a temperature sensing portion 110, temperature sensing wires 112 and temperature measuring pads 114. The temperature sensing portion 110 is provided above the active portion 120. The temperature sensing portion 110 may be provided at the middle of the active portion 120 in the top view of the semiconductor substrate 10. The temperature sensing portion 110 senses temperature of the active portion 120. The temperature sensing portion 110 may be a pn temperature sensing diode formed of a single crystal or polycrystal silicon.

The temperature sensing wires 112 are provided above the active portion 120 in the top view of the semiconductor substrate 10. The temperature sensing wires 112 are connected with the temperature sensing portion 110. The temperature sensing wires 112 extend to a region between the active portion 120 and the peripheral end 140 on the upper surface of the semiconductor substrate 10, and are connected with the temperature measuring pads 114. The temperature sensing wires 112 may include a wire 112-1 of an anode electrode electrically connected to a p type layer of the pn temperature sensing diode, and a wire 112-2 of a cathode electrode electrically connected to its n type layer. The temperature measuring pads 114 may include an anode pad 114-1 and a cathode pad 114-2.

The semiconductor device 100 in the present example is provided with first-conductivity type first cathode regions 83 in contact with the lower surface of the semiconductor substrate 10. The first cathode regions 83 are provided in at least part of the edge termination structure portion 90. The first cathode regions 83 in the present example are arranged to face transistor portions 70 in the direction of extension (X-axis direction) in the top view of the semiconductor substrate 10. The first cathode regions 83 in the present example are of N+ type, for example. In FIG. 1*a*, regions provided with the first cathode regions 83 are indicated by shaded portions.

The array direction refers to a direction in which transistor portions 70 and diode portions 80 are arrayed alternately in the top view of the semiconductor substrate 10 shown in FIG. 1*a*, that is, the Y-axis direction. The direction of extension refers to a direction in which trench portions provided in transistor portions 70 and diode portions 80 extend, that is, the X-axis direction. The trench portions are described below in detail in explanations with reference to FIG. 1*c*. The direction of extension and the array direction may be directions that are orthogonal to each other.

The first cathode regions 83 may be provided in regions extending in the X-axis direction from the peripheral end 140 to part of the active portion 120. The first cathode regions 83 may not be provided in regions of the edge termination structure portion 90 which face diode portions 80 in the X-axis direction, but may be provided in the regions. In the semiconductor device 100 in the present example, the first cathode regions 83 are provided also in part of regions of the edge termination structure portion 90 which face diode portions 80 in the X-axis direction. The first cathode regions 83 may be provided also in regions of the edge termination structure portion 90 which extend in the X-axis direction on the in the Y-axis direction positive side and negative side of the active portion 120. In the present specification, relative positions in each axis direction are referred to as the positive side and negative side in some cases. In each figure, the side to which the arrow of each axis points is defined as the positive side, and the opposite side is defined as the negative side.

Figure 1B:
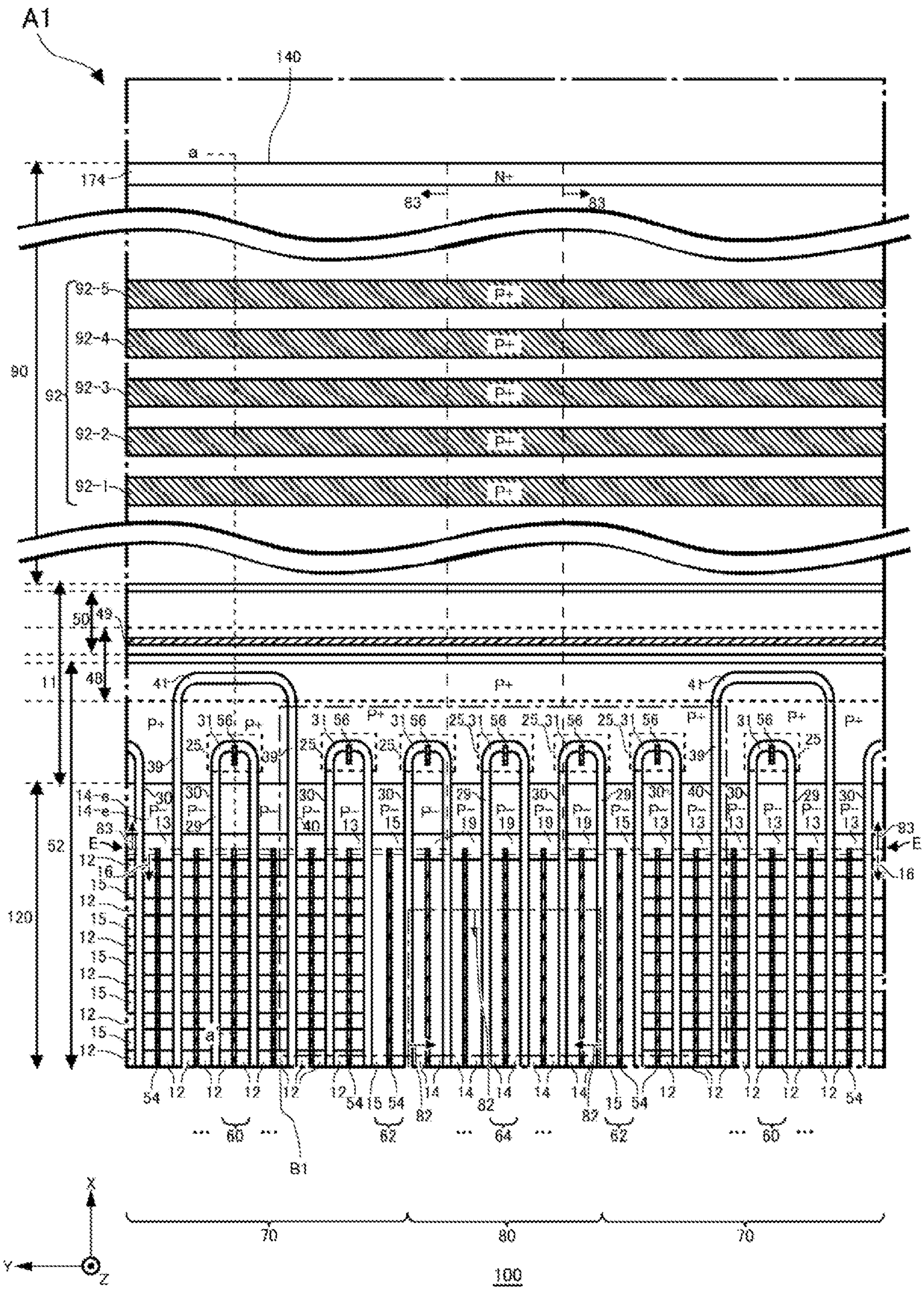
FIG. 1*b* is an enlarged view of a region A1 in FIG. 1*a*.

FIG. 1*b* is an enlarged view of a region A1 in FIG. 1*a*. The region A1 includes two transistor portions 70, and a diode portion 80 sandwiched by the two transistor portions 70. In addition, the region A1 is a region that includes the edge termination structure portion 90 that faces the two transistor portions 70 and the diode portion 80 in the X-axis direction. Note that regions A2 to A10 shown in other figures also are similar regions. Note that in each figure such as FIG. 1*b*, shaded portions representing first cathode regions 83 are omitted in some cases for visibility of the drawing. In each figure such as FIG. 1*b*, regions of first cathode regions 83 are indicated by portions indicated by broken lines and or are indicated by arrows instead of shaded portions in some cases.

As shown in FIG. 1*b*, the semiconductor device 100 in the present example is provided with the active portion 120 and the edge termination structure portion 90. A second-conductivity type well region 11 is sandwiched by the active portion 120 and the edge termination structure portion 90 in the X-axis direction.

The edge termination structure portion 90 is provided with second-conductivity type guard rings 92 and a first-conductivity type channel stopper 174 in contact with the peripheral end 140. The guard rings 92 in the present example are of P+ type, for example. In addition, the channel stopper 174 in the present example is of N+ type, for example. A plurality of guard rings 92 may be provided in the X-axis direction. In the present example, five guard rings, a guard ring 92-1 to a guard ring 92-5, are provided.

The guard rings 92 may be provided to surround the active portion 120 in the top view of FIG. 1*a*. The innermost guard ring 92-1 may be surrounded by the guard ring 92-2 to the guard ring 92-5 arranged on the outer side of the guard ring 92-1. The outermost guard ring 92-5 may surround the guard rings 92-1 to 92-4. The doping concentrations of the five guard ring 92-1 to the guard ring 92-5 may be the same.

As shown in FIG. 1*b*, the transistor portions 70 in the present example are provided with gate trench portions 40 and dummy trench portions 30 exposed to the upper surface of the semiconductor substrate 10. In addition, the diode portion 80 is provided with dummy trench portions 30 exposed to the upper surface of the semiconductor substrate 10. The gate trench portions 40 and dummy trench portions 30 extend in the direction of extension (the X-axis direction in the present example) in the top view of the semiconductor substrate 10.

A transistor portion 70 is provided with one or more gate trench portions 40 and one or more dummy trench portions 30. A gate trench portion 40 may have two extending parts 39 that extend in the direction of extension, and a connecting part 41 that connects the two extending parts 39. A dummy trench portion 30 may have two extending parts 29 that extend in the direction of extension, and a connecting part 31 that connects the two extending parts 29. In a transistor portion 70, one or more gate trench portions 40 and one or more dummy trench portions 30 are arrayed at predetermined intervals along a predetermined array direction (the Y-axis direction in the present example). In a transistor portion 70, at least one dummy trench portion 30 may be provided between individual extending parts 39 of a gate trench portion(s) 40.

The diode portion 80 is provided with one or more dummy trench portions 30. A dummy trench portion 30 may have two extending parts 29 that extend in the direction of extension, and a connecting part 31 that connects the two extending parts 29. In the diode portion 80, one or more dummy trench portions 30 are arrayed at predetermined intervals along a predetermined array direction (the Y-axis direction in the present example).

An emitter electrode 52 and the gate metal layer 50 are provided above the upper surface of the semiconductor substrate 10. The emitter electrode 52 and gate metal layer 50 are separated from each other. The emitter electrode 52 and gate metal layer 50 are provided to both the transistor portions 70 and the diode portion 80. The emitter electrode 52 is provided above gate trench portions 40, dummy trench portions 30, the well region 11, emitter regions 12, base regions 14, first contact regions 13, second contact regions 19 and third contact regions 15.

Although an interlayer dielectric film is provided between the emitter electrode 52 and gate metal layer 50, and the upper surface of the semiconductor substrate 10, it is omitted in FIG. 1*b*. The interlayer dielectric film in the present example is provided with contact holes 56, a contact hole 49 and contact holes 54 penetrating the interlayer dielectric film.

The emitter electrode 52 passes the contact holes 56 and is connected with dummy conductive portions in dummy trench portions 30. Connection portions 25 formed of a conductive material such as polysilicon doped with impurities may be provided between the emitter electrode 52 and the dummy conductive portions. An insulating film such as an oxide film is provided between the connection portions 25 and the upper surface of the semiconductor substrate 10.

The gate metal layer 50 passes the contact hole 49 and contacts the gate runner 48. The gate runner 48 is formed of polysilicon or the like doped with impurities. The gate runner 48 is connected with gate conductive portions in the gate trench portions 40 at the upper surface of the semiconductor substrate 10. The gate runner 48 is not connected with the dummy conductive portions in the dummy trench portions 30. The gate runner 48 in the present example is provided in a range from below the contact hole 49 to the leading end portions of the gate trench portions 40. An insulating film such as an oxide film is provided between the gate runner 48 and the upper surface of the semiconductor substrate 10. The gate conductive portions are, at the leading end portions of the gate trench portions 40, exposed to the upper surface of the semiconductor substrate 10 and contact the gate runner 48.

The emitter electrode 52 and gate metal layer 50 are formed of metal-containing materials. For example, at least a partial region of each electrode is formed of aluminum or an aluminum-silicon alloy. Each electrode may have a barrier metal formed of titanium, a titanium compound or the like in a layer underlying the region formed of aluminum or the like, and may have a plug formed of tungsten or the like in a contact hole.

A transistor portion 70 is provided with contact holes 54 that overlap the transistor portion 70 above the semiconductor substrate 10. The contact holes 54 are provided above first contact regions 13, third contact regions 15 and emitter regions 12. In a transistor portion 70, none of the contact holes 54 are arranged above base regions 14 and the well region 11 arranged on the X-axis direction positive side.

The diode portion 80 is provided with contact holes 54 that overlap the diode portion 80 above the semiconductor substrate 10. The contact holes 54 are provided above base regions 14 and second contact regions 19.

A mesa portion is provided in contact with each trench portion in a direction parallel to the upper surface of the semiconductor substrate 10. A mesa portion may be part of the semiconductor substrate 10 which is sandwiched by two adjacent trench portions, and may be part that extends from the upper surface of the semiconductor substrate 10 to the depth of the deepest bottom portion of each trench portion. In the semiconductor device 100 in the present example, a region in a transistor portion 70 which is sandwiched by a gate trench portion 40 and a dummy trench portion 30 may be defined as a mesa portion. A region in the diode portion 80 which is sandwiched by dummy trench portions 30 may be defined as a mesa portion.

In a transistor portion 70, a second mesa portion 62 is provided in a region adjacent to the diode portion 80 in the Y-axis direction. In a transistor portion 70, regions excluding a second mesa portion 62 and sandwiched by individual trench portions are provided with first mesa portions 60. In the diode portion 80, regions sandwiched by individual trench portions are provided with third mesa portions 64.

Both end portions, in the X-axis direction, of the first mesa portions 60, second mesa portions 62 and third mesa portions 64 are provided with second-conductivity type base regions 14-*e* exposed to the upper surface of the semiconductor substrate 10. On the side closer to the edge termination structure portion 90 than the base regions 14-*e* are, the well region 11 is provided in contact with the base regions 14-*e*. The doping concentration of the base regions 14-*e* is lower than the doping concentration of the well region 11.

In a first mesa portion 60, on the opposite side of a base region 14-*e* to the well region 11 in the X-axis direction, a first contact region 13 is provided in contact with the base region 14-*e*. In a second mesa portion 62, on the opposite side of a base region 14-*e* to the well region 11 in the X-axis direction, a third contact region 15 is provided in contact with the base region 14-*e*. In a second mesa portion 62, a third contact region 15 may be sandwiched by base regions 14-*e* provided at the both end portions of the second mesa portion 62 in the X-axis direction. In addition, in a third mesa portion 64, on the opposite side of a base region 14-*e* to the well region 11 in the X-axis direction, a second contact region 19 is provided in contact with the base region 14-*e*.

The first contact regions 13, second contact regions 19 and third contact regions 15 are of P+ type, for example. The doping concentrations of the first contact regions 13, second contact regions 19 and third contact regions 15 are higher than the doping concentration of the base regions 14-*e*. The first contact regions 13, second contact regions 19 and third contact regions 15 may have the same doping concentration.

The upper surface of a first mesa portion 60 is provided with first-conductivity type emitter regions 12 in contact with a gate trench portion 40 and a dummy trench portion 30. Emitter regions 12 in the present example are of N+ type, for example. In addition, the upper surface of a first mesa portion 60 is provided with third contact regions 15 in contact with a gate trench portion 40 and a dummy trench portion 30. Emitter regions 12 and third contact regions 15 may be provided not in contact with dummy trench portions 30.

In a first mesa portion 60, emitter regions 12 and third contact regions 15 may be provided alternately in the direction of extension of gate trench portions 40 and dummy trench portions 30 (X-axis direction). In a first mesa portion 60, a first contact region 13 is the contact region closest to a base region 14-*e* in the X-axis direction. A first contact region 13 may be sandwiched by a base region 14-*e* and an emitter region 12 which is provided closest to the edge termination structure portion 90. A first contact region 13 may contact a base region 14-*e*.

The upper surface of a first mesa portion 60 is provided with emitter regions 12, a first contact region 13 and third contact regions 15 also below a contact hole 54. That is, in the present example, at the upper surface of a first mesa portion 60, emitter regions 12, a first contact region 13 and third contact regions 15 contact both a gate trench portion 40 and a dummy trench portion 30 that sandwich the first mesa portion 60, and are continuous in the Y-axis direction from the gate trench portion 40 to the dummy trench portion 30. At the upper surface of the semiconductor substrate 10, the width of a first mesa portion 60 in the Y-axis direction equals the widths, in the Y-axis direction, of emitter regions 12, a first contact regions 13 and third contact regions 15 that are provided in the first mesa portion 60.

The upper surface of a second mesa portion 62 is provided with a third contact region 15 also below a contact hole 54. That is, in the present example, at the upper surface of a second mesa portion 62, a third contact regions 15 contacts both a gate trench portion 40 and a dummy trench portion 30 that sandwich the second mesa portion 62, and is continuous in the Y-axis direction from the gate trench portion 40 to the dummy trench portion 30. At the upper surface of the semiconductor substrate 10, the width of a second mesa portion 62 in the Y-axis direction equals the width, in the Y-axis direction, of a third contact region 15 that is provided in the second mesa portion 62.

The upper surface of a third mesa portion 64 is provided with a base region 14 in contact with a dummy trench portion 30. Base regions 14 in the present example are of P− type, for example. In a third mesa portion 64, a second contact region 19 may be sandwiched by a base region 14-*e* and a base region 14. Note that base regions 14-*e* are exposed to the upper surface of the semiconductor substrate 10. At the upper surface of the semiconductor substrate 10, a base region 14-*e* is sandwiched by the well region 11 and a second contact region 19 in the X-axis direction.

At the upper surface of a third mesa portion 64, a base region 14 is provided also below a contact hole 54. That is, in the present example, at the upper surface of a third mesa portion 64, a base region 14 contacts both two dummy trench portions 30 that sandwich the third mesa portion 64. The base region 14 is continuous in the Y-axis direction from one of the dummy trench portions 30 to the other dummy trench portion 30. At the upper surface of the semiconductor substrate 10, the width of a third mesa portion 64 in the Y-axis direction equals the width, in the Y-axis direction, of a base region 14 that is provided in the third mesa portion 64. Note that a third mesa portion 64 may not be or may be provided with emitter regions 12. In the present example, emitter regions 12 are not provided.

As has been explained above, in the present specification, first contact regions 13 refer to contact regions closest, in the X-axis direction, to base regions 14-*e* in the transistor portions 70. Second contact regions 19 refer to contact regions sandwiched by base regions 14-*e* and base regions 14 in the X-axis direction in the diode portion 80. Third contact regions 15 refer to contact regions that are provided in first mesa portions 60 in the transistor portions 70 and alternately with emitter regions 12 on the side closer to the middle of the active portion 120 than first contact regions 13 are (on the X-axis direction negative side). In addition, third contact regions 15 also include contact regions that are provided in second mesa portions 62 in the transistor portions 70 and contact base regions 14-*e* on the middle side of the active portion 120.

The diode portion 80 is provided with a first-conductivity type second cathode region 82 on the lower-surface side of the semiconductor substrate 10. The second cathode region 82 in the present example is of N+ type, for example. In FIG. 1*b*, the region provided with second cathode region 82 in the top view of the semiconductor substrate 10 is indicated by alternate long and short dash lines. A region of the upper surface of the semiconductor substrate 10 onto which the second cathode region 82 is projected may be apart from the well region 11 toward the X-axis direction negative side. Regions that are among regions contacting the lower surface of the semiconductor substrate 10 and are not provided with the second cathode region 82 may be provided with second-conductivity type collector regions.

A transistor portion 70 is provided with a second-conductivity type collector region on the lower-surface side of the semiconductor substrate 10. Collector regions in the present example are of P+ type, for example. On the lower-surface side of the semiconductor substrate 10, a collector region in a transistor portion 70 may be continuous with a collector region in the diode portion 80.

In a transistor portion 70, a first-conductivity type accumulation region 16 may be provided below emitter regions 12, first contact regions 13 and third contact region 15 and in contact with gate trench portions 40. The accumulation region 16 of in the present example is of P+ type, for example. The accumulation region 16 may be arranged above the lower ends of individual trench portions. By providing the accumulation region 16, the carrier injection-enhancement effect (IE effect) can be enhanced to lower the ON voltage. In FIG. 1*b*, the range in which the accumulation region 16 is provided is indicated by a broken line.

In the diode portion 80, the accumulation region 16 may be provided below base regions 14 and second contact regions 19 and in contact with dummy trench portions 30. The accumulation region 16 may be arranged above the lower ends of individual trench portions. In FIG. 1*b*, the range in which the accumulation region 16 is provided is indicated by an alternate long and short dash line. The diode portion 80 may not be provided with the accumulation region 16. Note that, although in FIG. 1*b* the dashed line traverses the regions of individual trench portions in the transistor portions 70 and diode portion 80, the accumulation region 16 may not be formed in regions overlapping the individual trench portions.

First cathode regions 83 are provided in regions that are in the edge termination structure portion 90 and face the transistor portions 70 in the X-axis direction. First cathode regions 83 may be provided also in part of regions that are in the edge termination structure portion 90 and face the diode portion 80 in the X-axis direction. The end portions E of the first cathode regions 83 on the active portion 120 side may overlap first contact regions 13, second contact regions 19 and third contact regions 15 in the top view in FIG. 1*b*. That is, the first cathode regions 83 may extend in the X-axis direction from the edge termination structure portion 90 to the end portions E in the active portion 120. The first cathode regions 83 may extend in the X-axis direction from the end portions E to the peripheral end 140.

Figure 1C:
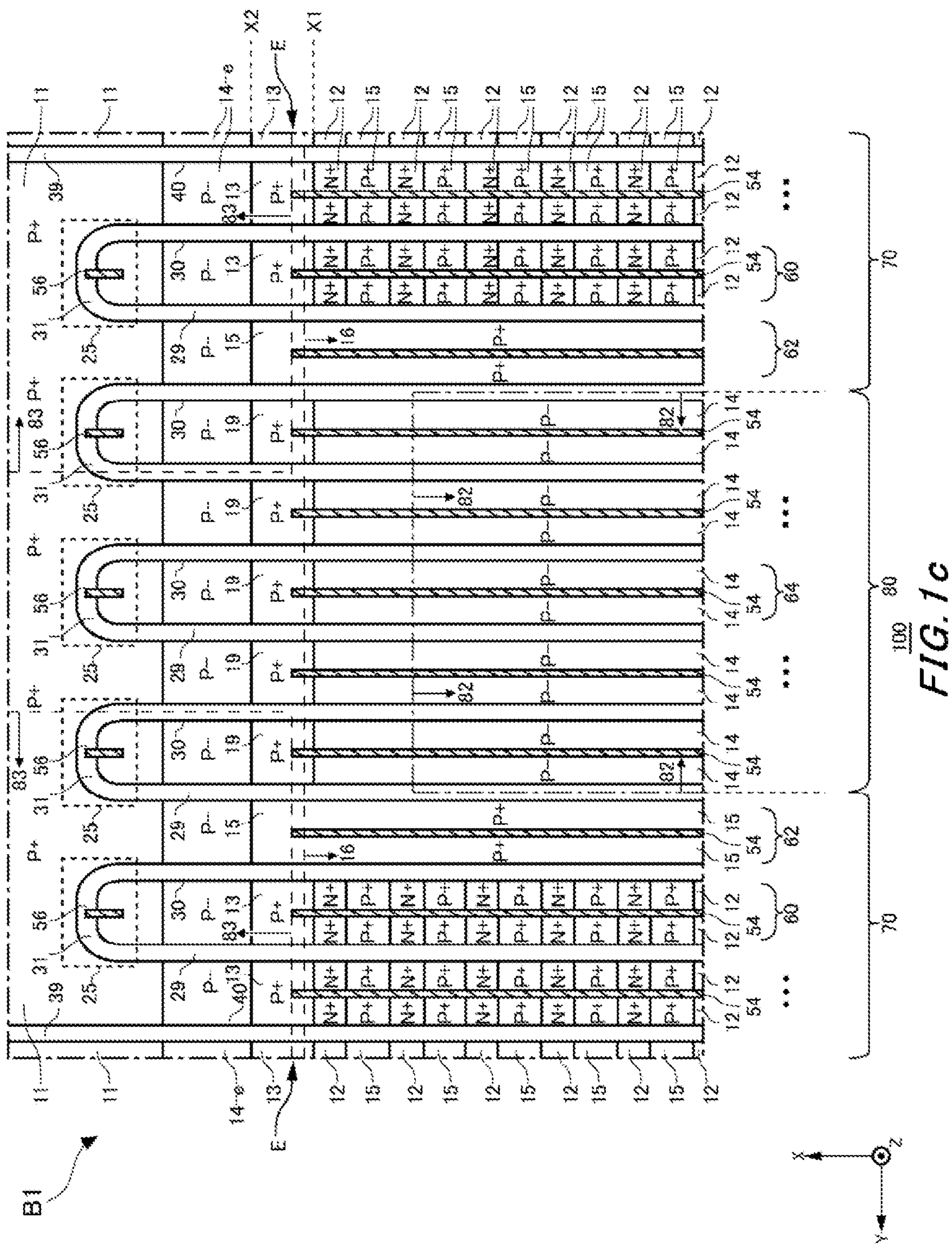
FIG. 1*c* is an enlarged view of a region B1 in FIG. 1*b*.

FIG. 1*c* is an enlarged view of a region B1 in FIG. 1*b*. FIG. 1*c* shows an enlarged view of a region in which the diode portion 80 and the transistor portions 70 are adjacent to each other in the Y-axis direction. Note that regions B2 to B9' shown in other figures also are similar regions. Both end portions, in the X-axis direction, of the first mesa portions 60, second mesa portions 62 and third mesa portions 64 are provided with second-conductivity type base regions 14-*e* exposed to the upper surface of the semiconductor substrate 10. On the side closer to the edge termination structure portion 90 than the base regions 14-*e* are, the well region 11 is provided in contact with the base regions 14-*e*.

A first mesa portion 60 is provided with a first contact region 13 in contact with a base region 14-*e*. The first contact region 13 and well region 11 sandwich the base region 14-*e* in the X-axis direction. A second mesa portion 62 is provided with a third contact region 15 in contact with a base region 14-*e*. The third contact region 15 and well region 11 sandwich the base region 14-*e* in the X-axis direction. A third mesa portion 64 is provided with a second contact region 19 in contact with a base region 14-*e*. The second contact region 19 and well region 11 sandwich the base region 14-*e* in the X-axis direction.

The upper surface of a first mesa portion 60 is provided with emitter regions 12 and third contact regions 15 in contact with a gate trench portion 40 and a dummy trench portion 30. The upper surface of a second mesa portion 62 is provided with third contact regions 15 in contact with a dummy trench portion 30. The upper surface of a third mesa portion 64 is provided with a base region 14 in contact with a dummy trench portion 30.

The accumulation region 16 is provided below emitter regions 12, first contact regions 13 and third contact regions 15 in the transistor portions 70. In addition, the accumulation region 16 may be provided below base regions 14 and second contact regions 19 in the diode portion 80.

The second cathode region 82 is provided at the lower surface of the semiconductor substrate 10 in the diode portion 80. The second cathode region 82 may be provided apart from the well region 11 toward the X-axis direction negative side.

In the present specification, first cathode regions 83 refer to cathode regions provided in the edge termination structure portion 90. First cathode regions 83 may extend in the X-axis direction from the edge termination structure portion 90 to part of the active portion 120. The second cathode region 82 refers to a cathode region provided in the active portion 120.

The end portions E, in the X-axis direction and on the active portion 120 side, of the first cathode regions 83 in the top view of the semiconductor substrate 10 may be provided closer to the peripheral end 140 in the X-axis direction than the end portions X1, in the X-axis direction and on the peripheral end 140 side, of emitter regions 12 are. In addition, in the top view of the semiconductor substrate 10, at least part of first contact regions 13 and at least part of the first cathode regions 83 may overlap in the X-axis direction. In the present example, the positions X2 of individual end portions, in the X-axis direction, of first contact regions 13, second contact regions 19 and third contact regions 15 in second mesa portions 62 are the same. The end portions E of the first cathode regions 83 in the present example may be provided between the end portions X2 and X1 in the X-axis direction. The end portions E of the first cathode regions 83 may match ends of contact holes 54 on the X-axis direction positive side in the top view in FIG. 1*c*.

The first cathode regions 83 may be continuous in the Y-axis direction from regions that face the transistor portions 70 in the X-axis direction to regions that face the diode portion 80 in the X-axis direction. The first cathode regions 83 may be provided in part of regions that are in the edge termination structure portion 90 and face the diode portion 80 in the X-axis direction. The first cathode regions 83 may not be provided in other part of regions that face the diode portion 80 in the X-axis direction. The doping concentration of the first cathode regions 83 may equal the doping concentration of the second cathode region 82.

Figure 1D:
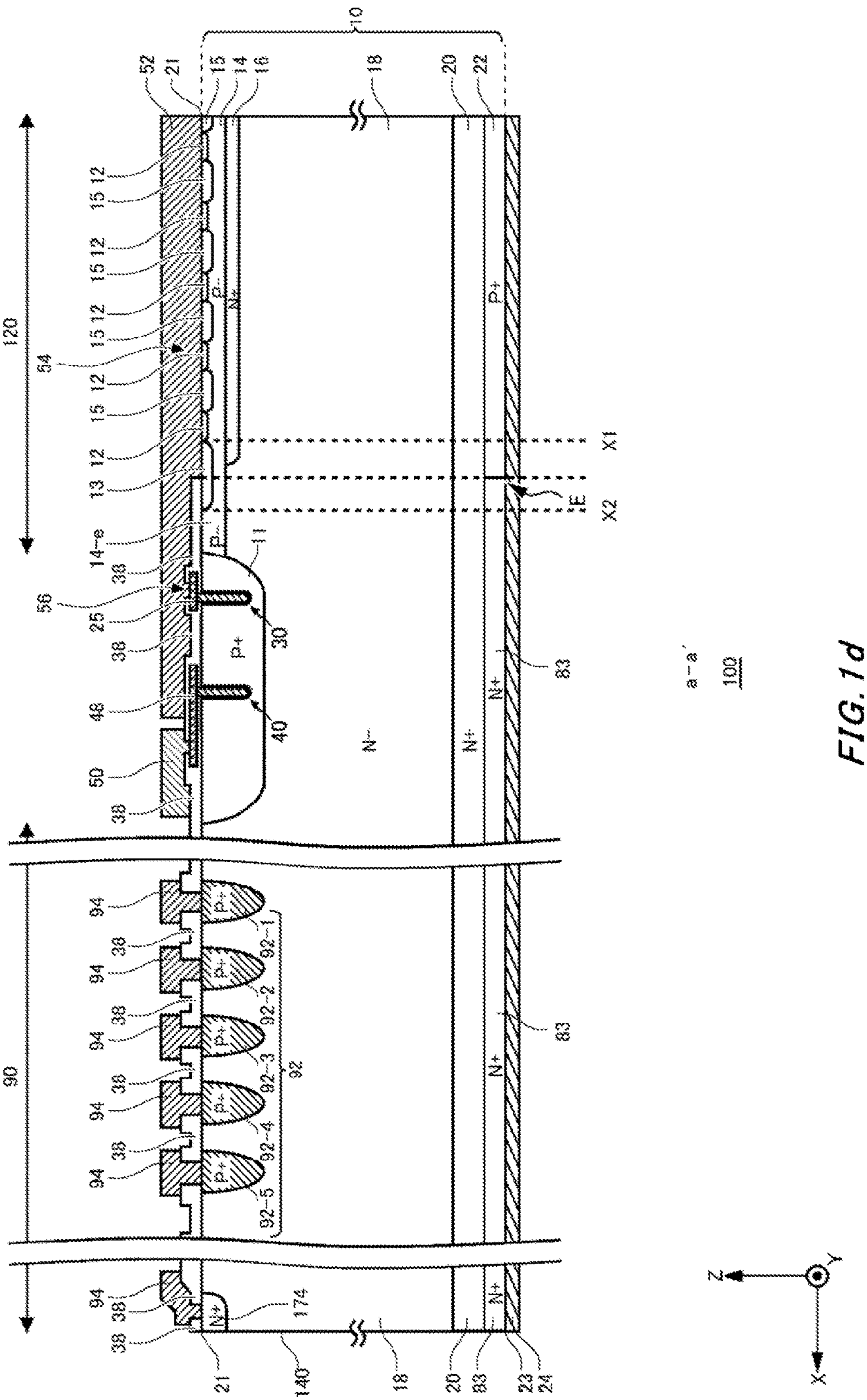
FIG. 1*d* is a figure showing an exemplary cross-section taken along a-a' in FIG. 1*b*.

FIG. 1*d* is a figure showing an exemplary cross-section taken along a-a' in FIG. 1*b*. The a-a' cross-section is an X-Z plane that passes through the channel stopper 174, the guard rings 92, the well region 11, a gate trench portion 40, a dummy trench portion 30, a base region 14-*e*, a first contact region 13, emitter regions 12 and third contact regions 15. In addition, the a-a' cross-section is an X-Z plane that passes through a contact hole 54 and a contact hole 56 above the upper surface 21 of the semiconductor substrate 10.

The semiconductor device 100 in the present example has, in the a-a' cross-section, the semiconductor substrate 10, interlayer dielectric films 38, the gate runner 48, a connection portion 25, the emitter electrode 52, the gate metal layer 50, field plates 94 and a collector electrode 24. The emitter electrode 52 and field plates 94 are provided at the upper surface 21 of the semiconductor substrate 10 and the upper surfaces of the interlayer dielectric films 38.

The collector electrode 24 is provided at a lower surface 23 of the semiconductor substrate 10. The emitter electrode 52 and collector electrode 24 are formed of conductive materials such as metals. In the present specification, the direction linking the emitter electrode 52 and the collector electrode 24 is referred to as the depth direction (Z-axis direction).

The semiconductor substrate 10 may be a silicon substrate, may be a silicon carbide substrate, may be a nitride semiconductor substrate such as a gallium nitride substrate, may be a gallium oxide substrate, and so on. The semiconductor substrate 10 in the present example is a silicon substrate.

The semiconductor substrate 10 includes a first-conductivity type drift region 18. The drift region 18 in the present example is of N− type, for example. The drift region 18 may be a region in the semiconductor substrate 10 left free of other doped regions.

The active portion 120 may be provided with one or more accumulation regions 16 above the drift region 18. The semiconductor device 100 shown in FIG. 1*d* depicts one example in which one accumulation region 16 is provided in the Z-axis direction. If a plurality of accumulation regions 16 are provided, the individual accumulation regions 16 may be arranged next to each other in the Z-axis direction. The doping concentration of accumulation regions 16 is higher than the doping concentration of the drift region 18. By providing the accumulation region 16, the carrier injection-enhancement effect (IE effect) can be enhanced to lower the ON voltage.

The active portion 120 is provided with a base region 14 above the accumulation region 16. The emitter regions 12, first contact region 13 and third contact regions 15 are provided above the base region 14 and in contact with the upper surface 21 of the semiconductor substrate 10. The emitter regions 12 and third contact regions 15 may be provided alternately in the X-axis direction. Note that the base region 14-*e* in FIG. 1*d* is sandwiched by the well region 11 and the first contact region 13 in the X-axis direction.

The edge termination structure portion 90 is provided with the guard rings 92 in contact with the upper surface 21. In addition, the edge termination structure portion 90 is provided with the channel stopper 174 in contact with the upper surface 21 and the peripheral end 140.

The well region 11 is provided between the active portion 120 and the edge termination structure portion 90 in the X-axis direction. In the a-a' cross-section, the well region 11 is provided with the gate trench portion 40 and the dummy trench portion 30. The cross-section of the gate trench portion 40 in the a-a' cross-section is a cross-section of a connecting part 41 of a gate trench portion 40 in the top view in FIG. 1*b*. The cross-section of the dummy trench portion 30 in the a-a' cross-section is a cross-section of a connecting part 31 of a dummy trench portion 30 in the top view in FIG. 1*b*. The gate conductive portion is connected with the gate runner 48. The dummy conductive portion is connected with the connection portion 25. The well region 11 may be provided deeper in the Z-axis direction than the gate trench portion 40 and dummy trench portion 30 are.

A first-conductivity type buffer region 20 may be provided below the drift region 18. The buffer region 20 in the present example is of N+ type, for example. The doping concentration of the buffer region 20 is higher than the doping concentration of the drift region 18. The buffer region 20 may function as a field-stop layer that prevents a depletion layer spreading from the lower-surface side of base regions 14 from reaching a P+ type collector region 22 and the N+ type second cathode region 82.

The lower surface 23 of the semiconductor substrate 10 is provided with the collector region 22 and first cathode region 83. The doping concentration of the first cathode region 83 may be higher than the doping concentration of the drift region 18. The first cathode region 83 may contact the collector region 22 at the end portion E.

In the X-axis direction, the end portion E of the first cathode region 83 may be provided closer to the peripheral end 140 than the end portion X1 of the emitter region 12 on the peripheral end 140 side is. In addition, in the top view of the semiconductor substrate 10, at least part of the first contact region 13 and at least part of the first cathode region 83 may overlap in the X-axis direction. That is, the end portion E of the first cathode region 83 may be provided, in the X-axis direction, between the end portion X1 and the end portion X2 of the first contact region 13 on the peripheral end 140 side. The end portion E of the first cathode region 83 may match an end of the contact hole 54 on the X-axis direction positive side.

The semiconductor device 100 in the present example is provided, in the transistor portion 70, with the first-conductivity type (N+ type) first cathode region 83 at the lower surface 23, in a range from the first contact region 13 to the edge termination structure portion 90. Because of this, at the time of turning off of the transistor portion 70, an increase of carriers (holes in the present example) to be injected from the lower surface 23 side can be suppressed at an end portion of the first contact region 13 on the edge termination structure portion 90 side. Because of this, the turn-off withstand capability of the transistor portion 70 can be improved.

Figure 2A:
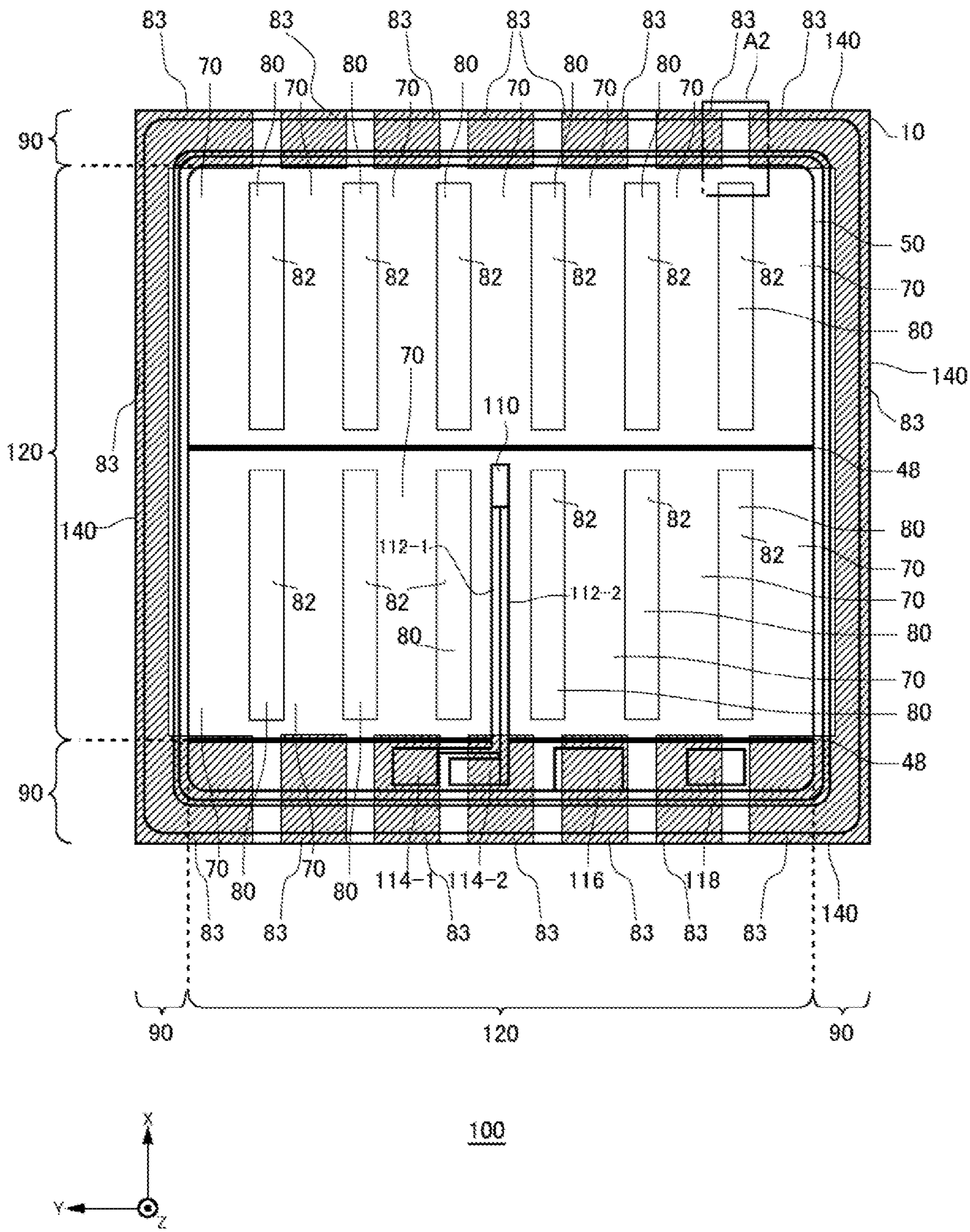
FIG. 2*a* is a figure showing another exemplary upper surface of the semiconductor device 100 according to the present embodiment.

FIG. 2*a* is a figure showing another exemplary upper surface of the semiconductor device 100 according to the present embodiment. The semiconductor device 100 in the present example is different from the semiconductor device 100 shown in FIG. 1*a* in that end portions of first cathode regions 83 on the active portion 120 side are provided closer to the peripheral end 140 than the end portions in the semiconductor device 100 shown in FIG. 1*a* are.

Figure 2B:
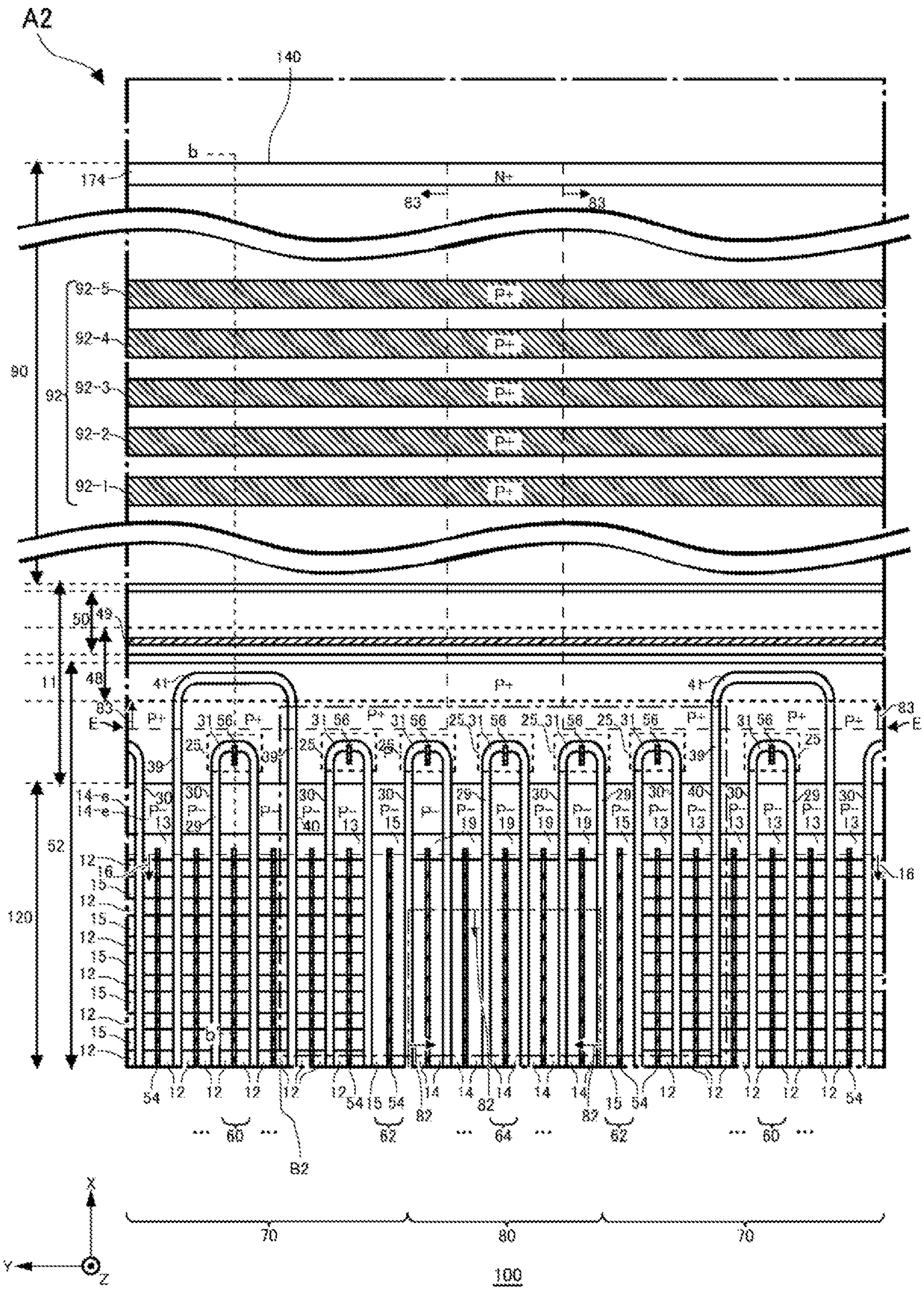
FIG. 2*b* is an enlarged view of a region A2 in FIG. 2*a*.

FIG. 2*b* is an enlarged view of a region A2 in FIG. 2*a*. First cathode regions 83 in the present example are provided over the entire edge termination structure portion 90 in the X-axis direction. In addition, the first cathode regions 83 are provided to face the transistor portions 70 and part of the diode portion 80 in the X-axis direction. The end portions E of the first cathode regions 83 on the active portion 120 side may overlap the well region 11 in the top view. The first cathode regions 83 may be provided in a range in the X-axis direction from the end portions E to the peripheral end 140.

Figure 2C:
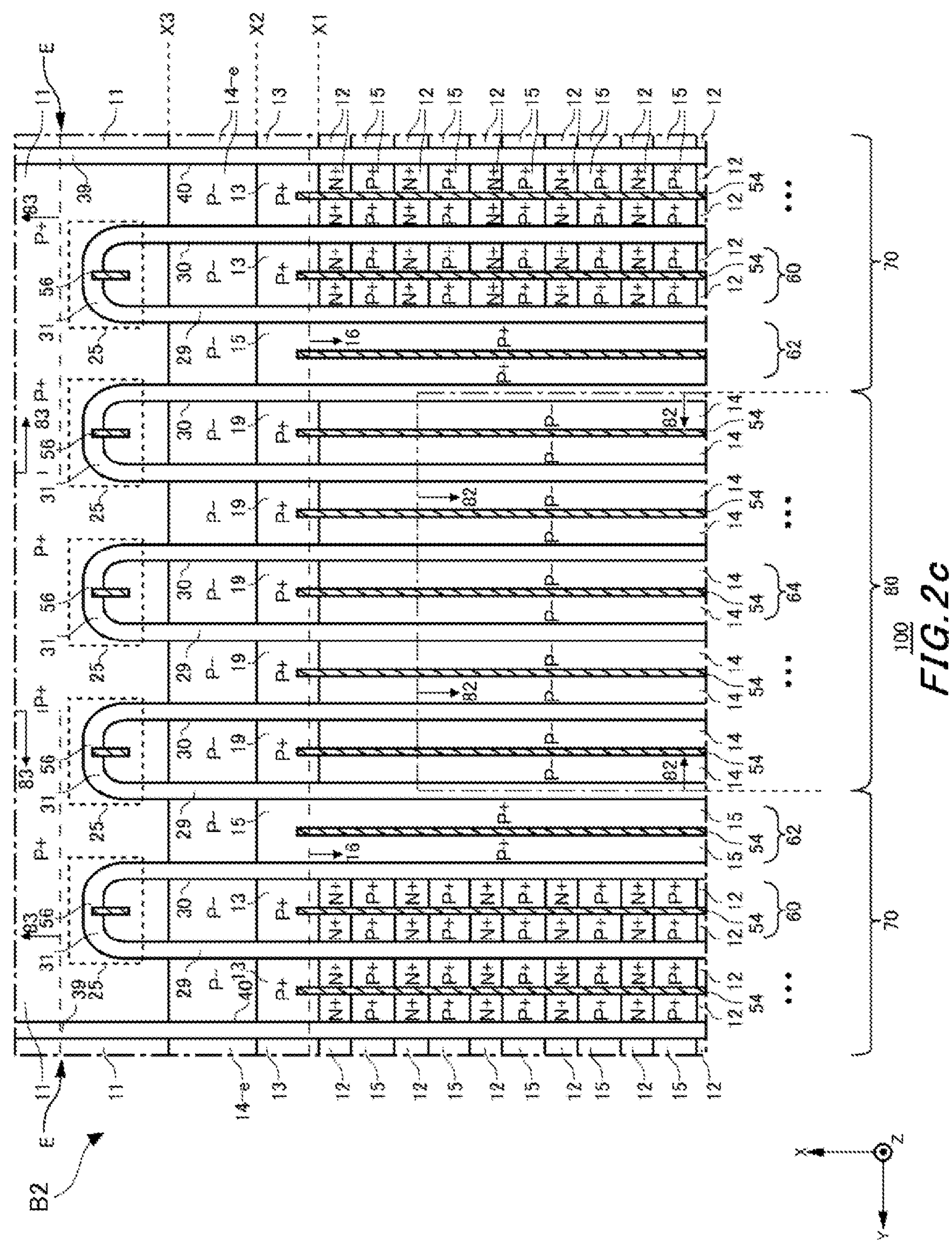
FIG. 2*c* is an enlarged view of a region B2 in FIG. 2*b*.

FIG. 2*c* is an enlarged view of a region B2 in FIG. 2*b*. As shown in FIG. 2*c*, in the X-axis direction, the end portions E of the first cathode regions 83 are provided closer to the peripheral end 140 than the end portions X1 of the emitter regions 12 on the peripheral end 140 side are. In the present example, the end portions E of the first cathode regions 83 overlap the well region 11 in the top view. That is, the end portions E are provided below the well region 11. The end portions E are provided on the X-axis direction positive side relative to the end portion X3 of the well region 11 on the X-axis direction negative side in the top view.

Figure 2D:
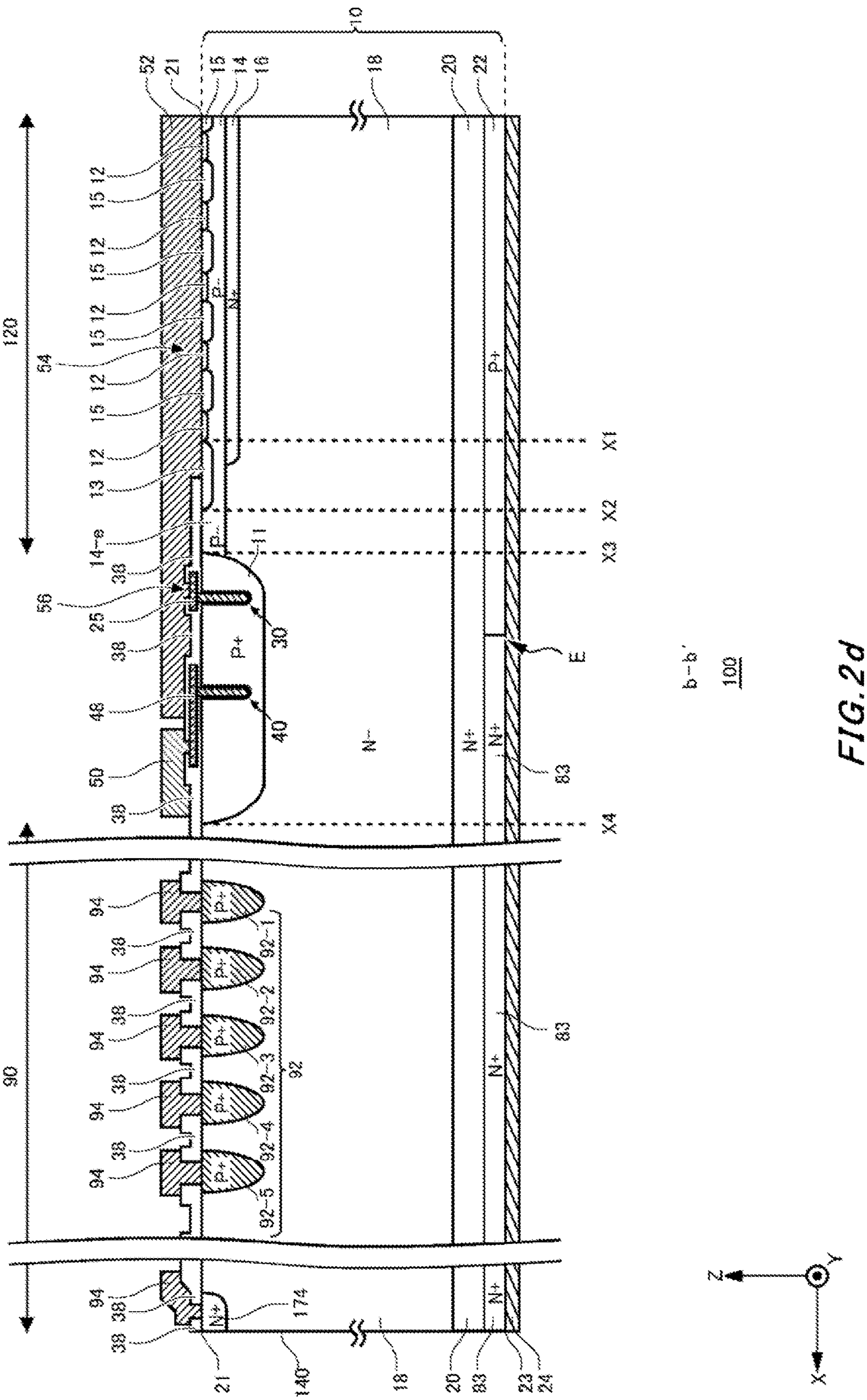
FIG. 2*d* is a figure showing an exemplary cross-section taken along b-b' in FIG. 2*b*.

FIG. 2*d* is a figure showing an exemplary cross-section taken along b-b' in FIG. 2*b*. In FIG. 2*d*, the end portion X3 is an end portion of the well region 11 on the X-axis direction negative side, and the end portion X4 is an end portion of the well region 11 on the X-axis direction positive side. The configuration of the b-b' cross-section in the semiconductor device 100 in the present example is different from the configuration of the a-a' cross-section shown in FIG. 1*d* in that the end portion E is provided between the end portion X3 and the end portion X4. That is, in the present example, the end portion E overlaps the well region 11 in the Z-axis direction.

In the present example, a first cathode region 83 is provided at the lower surface 23, in a range from a first contact region 13 in the transistor portion 70 to the edge termination structure portion 90. Because of this, at the time of operation of the transistor portion 70, movement of carriers (holes in the present example) from the lower surface 23 of the edge termination structure portion 90 toward the first contact region 13 can be suppressed. Because of this, the turn-off withstand capability of the transistor portion 70 can be improved.

Figure 3A:
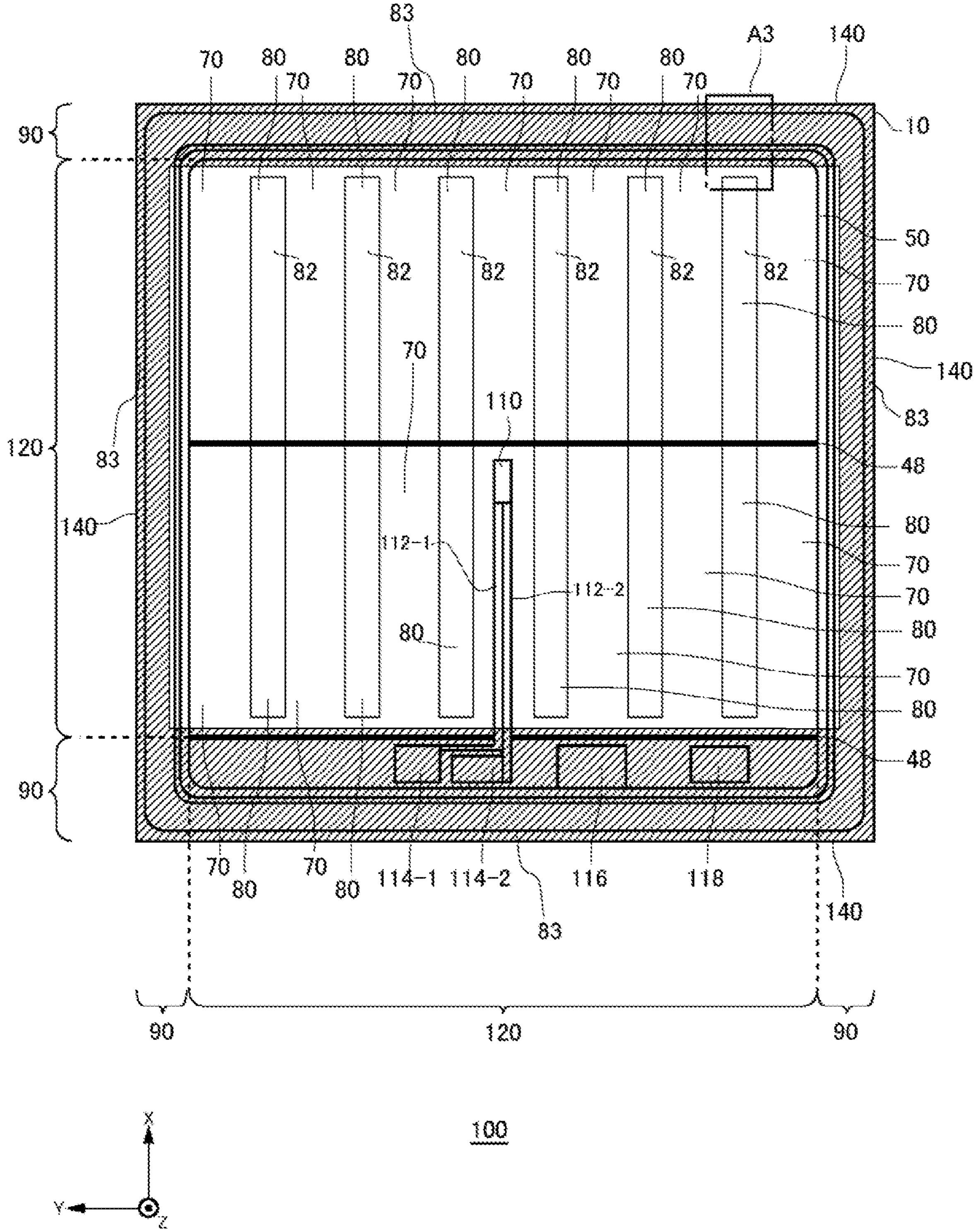
FIG. 3*a* is a figure showing another exemplary upper surface of the semiconductor device 100 according to the present embodiment.

FIG. 3*a* is a figure showing another exemplary upper surface of the semiconductor device 100 according to the present embodiment. The semiconductor device 100 in the present example is different from the semiconductor device 100 shown in FIG. 1*a* in that a first cathode region 83 is provided in an entire region of the edge termination structure portion 90 that faces transistor portions 70 and diode portions 80 in the X-axis direction. That is, the first cathode region 83 in the present example is provided to face the entire diode portions 80. In the present example, the first cathode region 83 may be provided to surround the active portion 120 in the top view. In addition, the semiconductor device 100 in the present example is different from the semiconductor device 100 shown in FIG. 1*a* in that the second cathode region 82 is continuous in the X-axis direction from the X-axis direction positive side of the gate runner 48 to the X-axis negative side of the gate runner 48 in the top view in FIG. 3*a*.

Figure 3B:
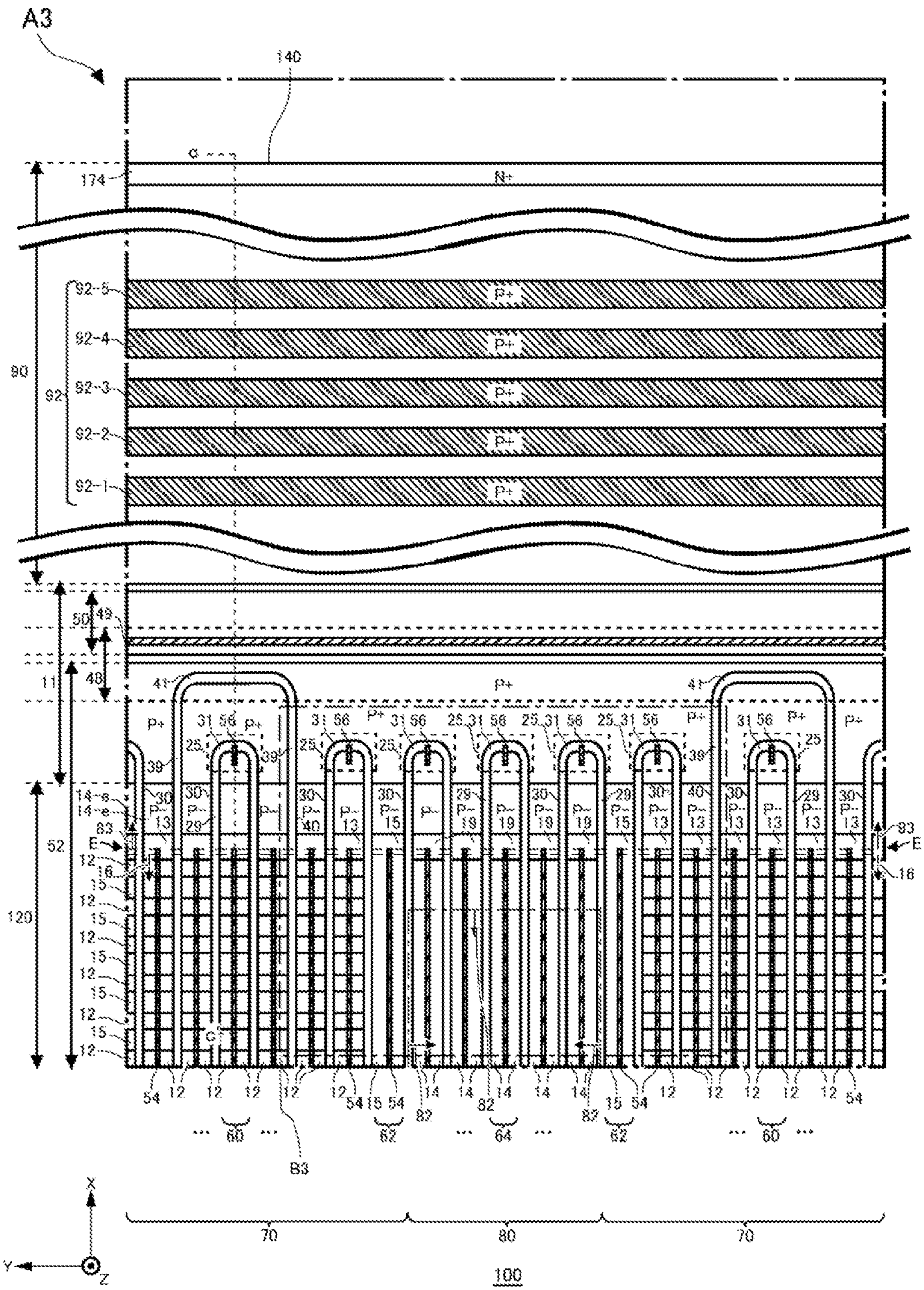
FIG. 3*b* is an enlarged view of a region A3 in FIG. 3*a*.

FIG. 3*b* is an enlarged view of a region A3 in FIG. 3*a*. The first cathode region 83 in the present example is provided over the entire edge termination structure portion 90 in the X-axis direction. In addition, the first cathode region 83 faces, in the X-axis direction, the entire transistor portions 70 and the entire diode portion 80. The end portion E of the first cathode region 83 on the active portion 120 side may overlap first contact regions 13, second contact regions 19 and third contact regions 15 in the top view. That is, the first cathode region 83 may extend in the X-axis direction from the edge termination structure portion 90 to the end portion E in the active portion 120. The first cathode region 83 may extend in the X-axis direction from the end portion E to the peripheral end 140.

Figure 3C:
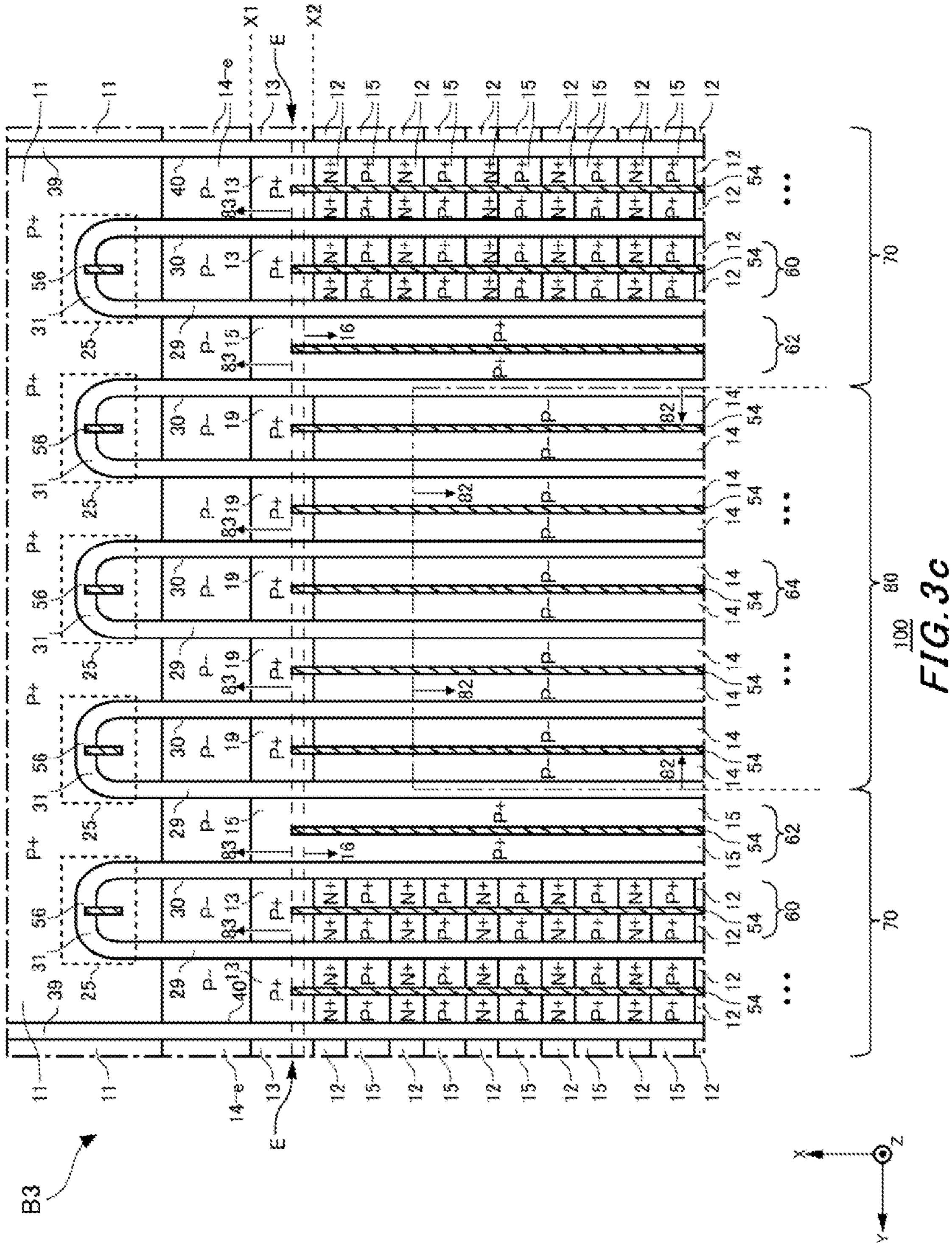
FIG. 3*c* is an enlarged view of a region B3 in FIG. 3*b*.

FIG. 3*c* is an enlarged view of a region B3 in FIG. 3*b*. In the semiconductor device 100 in the present example, the first cathode region 83 is provided to face, in the X-axis direction, the entire transistor portions 70 and the entire diode portion 80.

In the X-axis direction, the end portion E of the first cathode region 83 may be provided closer to the peripheral end 140 than the end portions X1 of the emitter regions 12 are. In addition, in the top view of the semiconductor substrate 10, at least part of the first contact regions 13 and at least part of the first cathode region 83 may overlap. The end portion E of the first cathode region 83 may be provided between the end portion X2 and the end portion X1 in the X-axis direction. The end portions X2 are end portions, on the peripheral end 140 side, of first contact regions 13, second contact regions 19 and third contact regions 15 in second mesa portions 62. The end portion E of the first cathode region 83 may match ends of contact holes 54 on the X-axis direction positive side in the top view in FIG. 3*c*.

In the semiconductor device 100 in the present example, the first cathode region 83 is provided in an entire region of the edge termination structure portion 90 that faces the transistor portions 70 and diode portion 80 in the X-axis direction. The doping concentration of the first cathode region 83 may equal the doping concentration of the second cathode region 82.

Figure 3D:
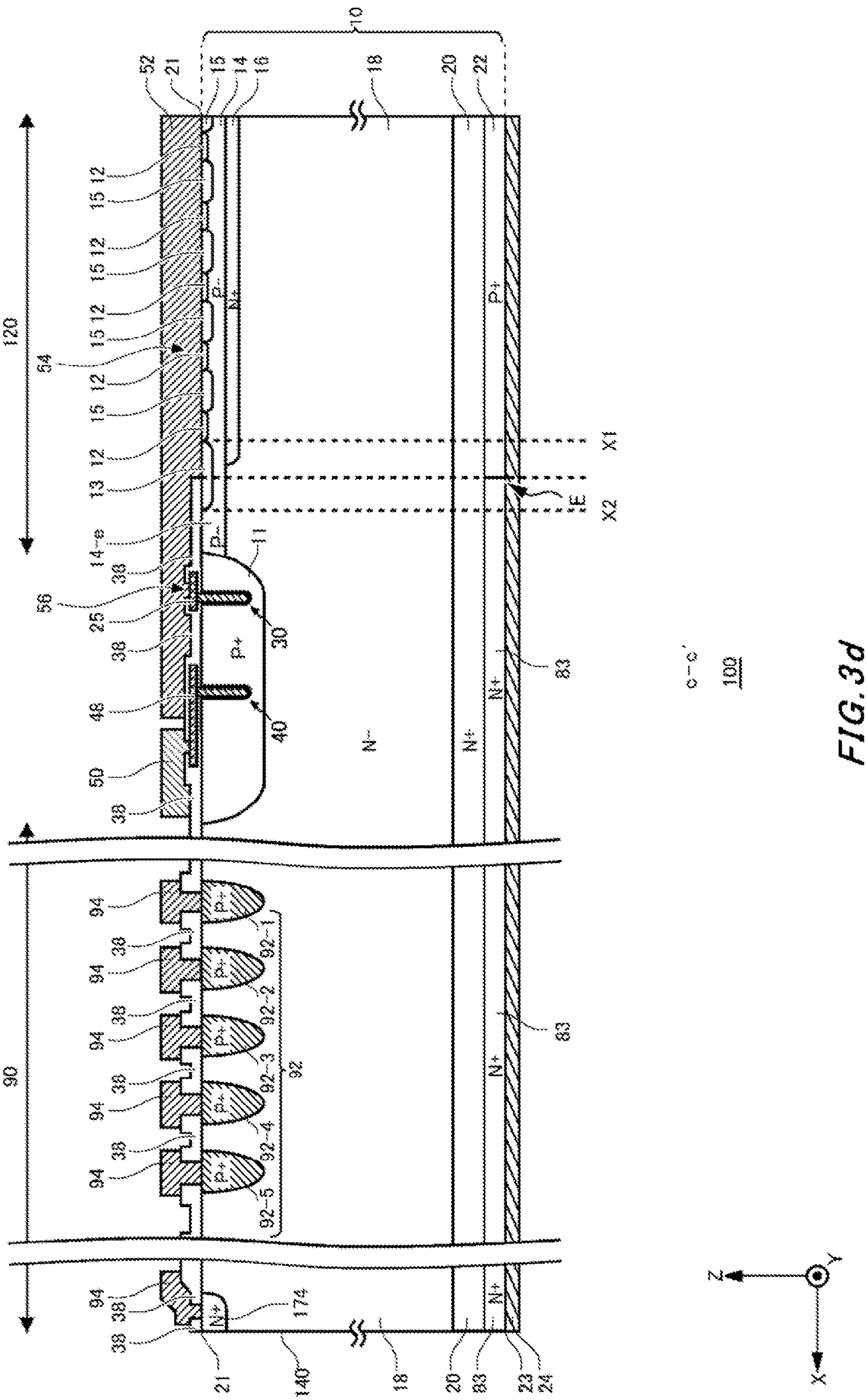
FIG. 3*d* is a figure showing an exemplary cross-section taken along c-c' in FIG. 3*b*.

FIG. 3*d* is a figure showing an exemplary cross-section taken along c-c' in FIG. 3*b*. The configuration of the c-c' cross-section in the semiconductor device 100 in the present example is the same as the configuration of the a-a' cross-section in the semiconductor device 100 shown in FIG. 1*d*.

In the present example, the first cathode region 83 is provided at the lower surface 23, in a range from a first contact region 13 in the transistor portion 70 to the edge termination structure portion 90. Because of this, at the time of operation of the transistor portion 70, movement of carriers (holes in the present example) from the lower surface 23 of the edge termination structure portion 90 toward the first contact region 13 can be suppressed. Because of this, the turn-off withstand capability of the transistor portion 70 can be improved.

Figure 4A:
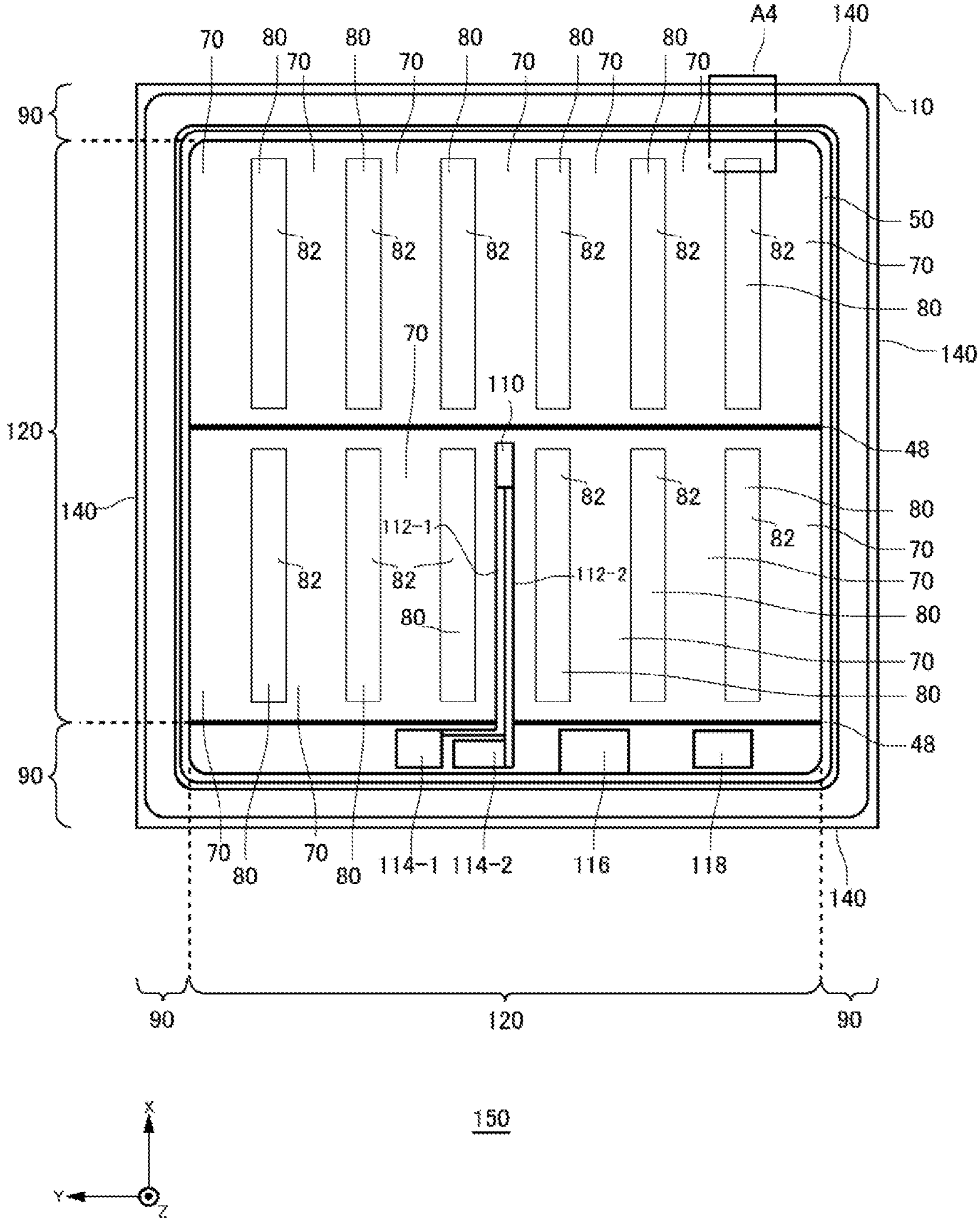
FIG. 4*a* is a figure showing the upper surface of a semiconductor device 150 in a first comparative example.

FIG. 4*a* is a figure showing the upper surface of a semiconductor device 150 in a first comparative example. The semiconductor device 150 is different from the semiconductor device 100 shown in FIG. 1*a* and FIG. 3*a* in that first cathode regions 83 are not provided.

Figure 4B:
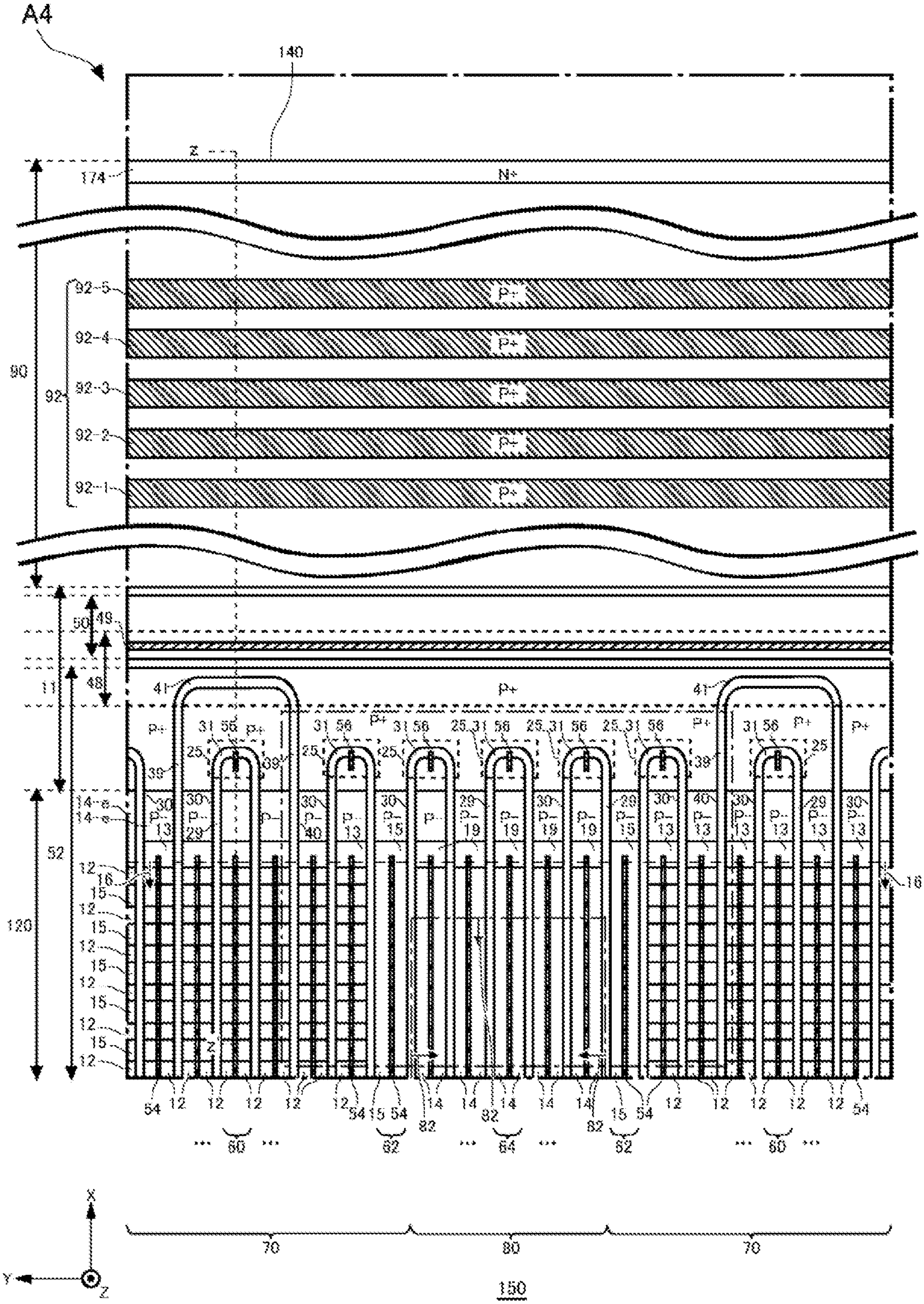
FIG. 4*b* is an enlarged view of a region A4 in FIG. 4*a*.

FIG. 4*b* is an enlarged view of a region A4 in FIG. 4*a*. As shown in FIG. 4*b*, the semiconductor device 150 is not provided with first cathode regions 83. The semiconductor device 150 has a collector region 22 in a region where a first cathode region/first cathode regions 83 is/are provided in the semiconductor device 100. The collector region 22 may be continuous with collector regions 22 provided at the lower surface 23 in transistor portions 70.

Figure 4C:
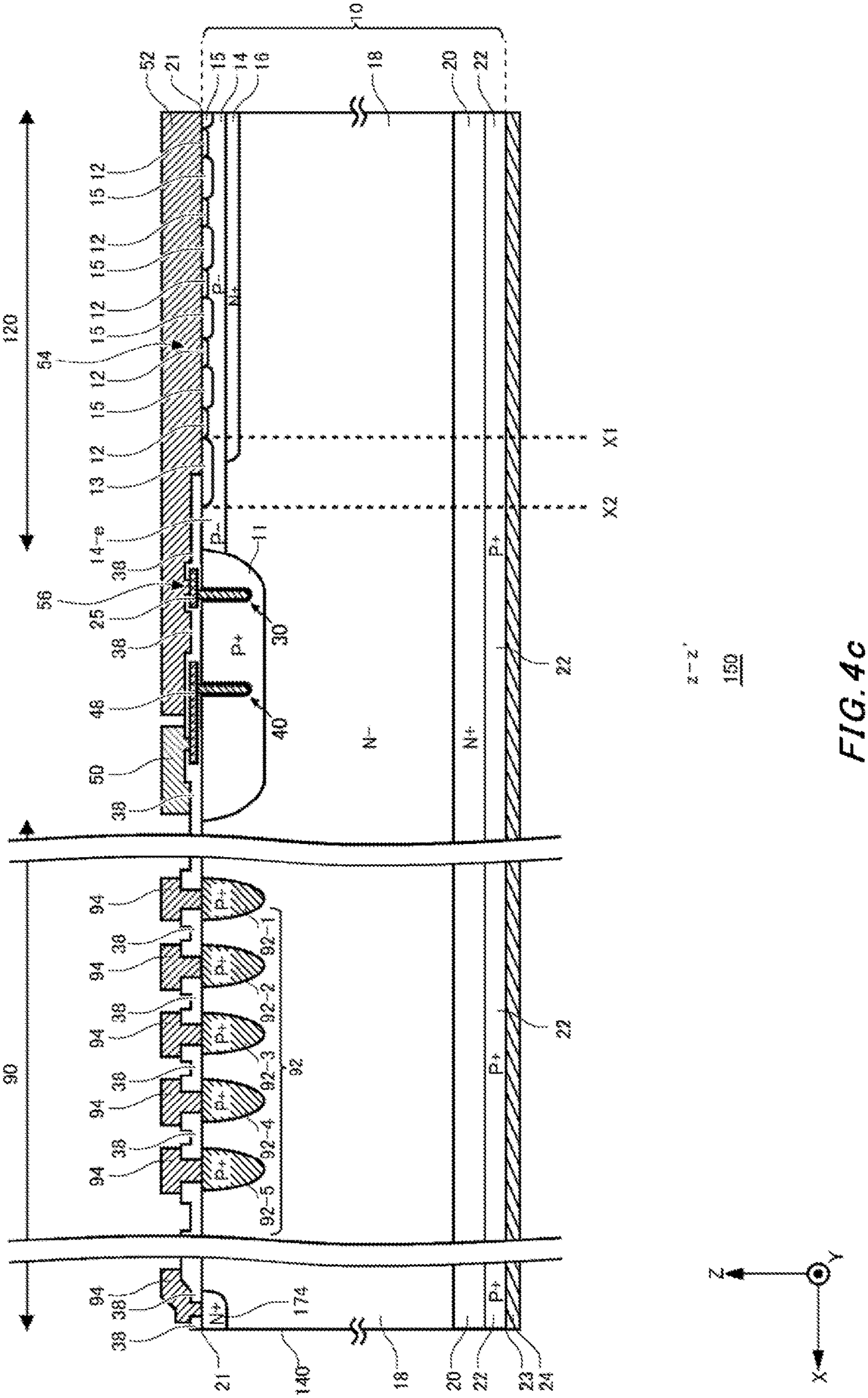
FIG. 4*c* is a figure showing an exemplary cross-section taken along z-z' in FIG. 4*b*.

FIG. 4*c* is a figure showing a cross-section taken along z-z' in FIG. 4*b*. As shown in FIG. 4*c*, the semiconductor device 150 in the first comparative example is provided with a collector region 22 at the lower surface 23. The collector region 22 is provided in a range in the X-axis direction from the active portion 120 to the peripheral end 140 of the edge termination structure portion 90.

The semiconductor device 150 in the first comparative example is provided not with a first cathode region 83, but with a collector region 22 at the lower surface 23 in a range from a first contact region 13 of a transistor portion 70 to the edge termination structure portion 90. Because of this, at the time of operation of the transistor portion 70, movement of carriers (holes) from the collector region 22 in the edge termination structure portion 90 to an end portion of the first contact region 13 on the edge termination structure portion 90 side cannot be suppressed. Because of this, the turn-off withstand capability of the transistor portion 70 degrades.

Figure 5A:
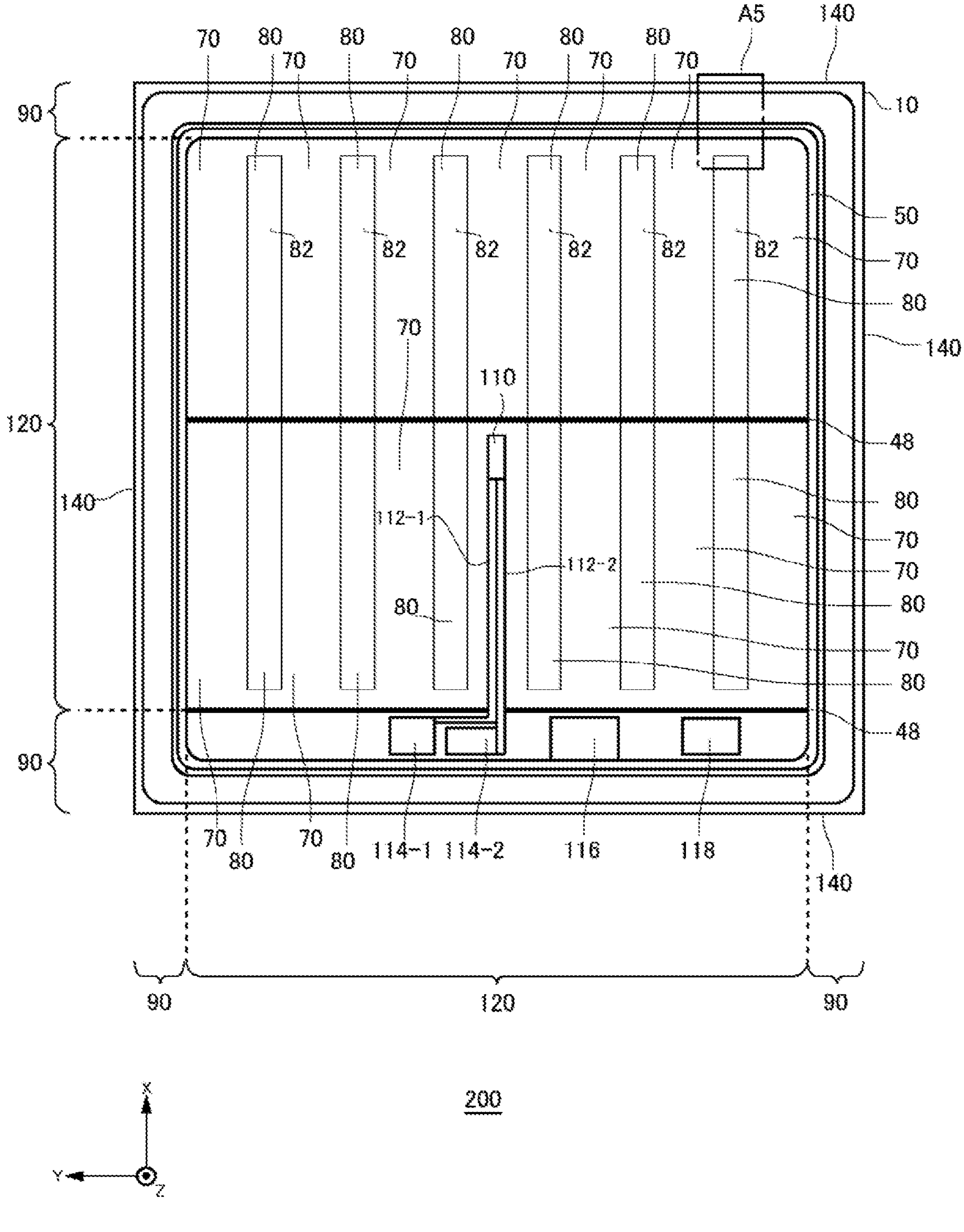
FIG. 5*a* is a figure showing an exemplary upper surface of a semiconductor device 200 according to the present embodiment.

FIG. 5*a* is a figure showing an exemplary upper surface of a semiconductor device 200 according to the present embodiment. The semiconductor device 200 in the present example is different from the semiconductor device 100 shown in FIG. 3*a* in that first cathode regions 83 are not provided.

Figure 5B:
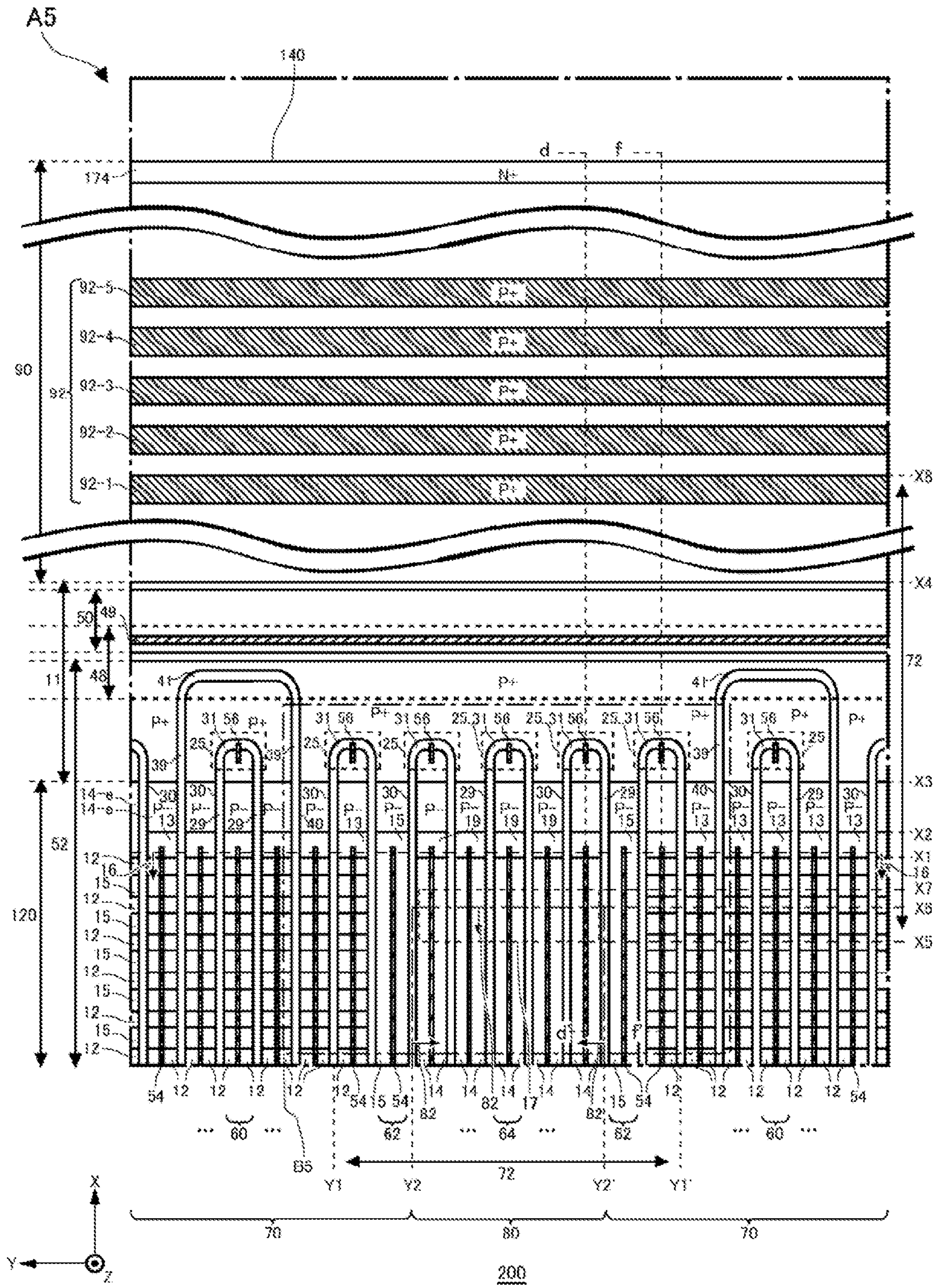
FIG. 5*b* is an enlarged view of a region A5 in FIG. 5*a*.

FIG. 5*b* is an enlarged view of a region A5 in FIG. 5*a*. The semiconductor device 200 in the present example is provided with a lifetime control region 72 including a lifetime killer, on the upper surface 21 side. The lifetime control region 72 is provided in a range from a diode portion 80 to at least part of the edge termination structure portion 90 that faces the diode portion 80 in the direction of extension (the X-axis direction in the present example). In the present example, the position of an end portion of the second cathode region 82 on the X-axis direction positive side is defined as X6. The lifetime control region 72 in the present example is provided in a range in the X-axis direction from a region on the X-axis direction negative side relative to the end portion X6 to the edge termination structure portion 90. The lifetime control region 72 in the present example is provided to reach the position of the guard ring 92-2 in the X-axis direction. The position X8 shown in FIG. 5*b* is the position of an end portion of the lifetime control region 72 on the edge termination structure portion 90 side.

The lifetime control region 72 may be continuous, in the Y-axis direction, with the diode portion 80 and part of transistor portions 70 contacting the diode portion 80. The lifetime control region 72 in the present example is provided to reach dummy trench portions 30 arranged at end portions of the transistor portions 70. End portions of the transistor portions 70 refer to regions between the diode portion 80 and gate trench portions 40 that are in the transistor portions 70 and arranged closest to the diode portion 80. The position of an end portion of the second cathode region 82 on the Y-axis direction positive side is defined as Y2. The position of a dummy trench portion 30 arranged at an end portion of a transistor portion 70 on the Y-axis direction positive side is defined as Y1. The position of an end portion of the second cathode region 82 on the Y-axis direction negative side is defined as Y2'. The position of a dummy trench portion 30 arranged at an end portion of a transistor portion 70 on the Y-axis direction negative side is defined as Y1'. The lifetime control region 72 in the present example is continuous, in the Y-axis direction, from a region between the positions Y2 and Y1 to a region between the positions Y2' and Y1'. In FIG. 5*b*, the range in which the lifetime control region 72 is provided is indicated by an arrow.

The semiconductor device 200 in the present example is provided with a second-conductivity type first floating region 17 on the lower surface 23 side in the diode portion 80. In FIG. 5*b*, the position of the first floating region 17 in the top view is indicated by a portion indicated by broken lines. The end portion X5 shown in FIG. 5*b* is an end portion of the first floating region 17 on the X-axis direction negative side. The end portion X7 shown in FIG. 5*b* is an end portion of the first floating region 17 on the X-axis direction positive side. The first floating region 17 in the present example is of P+ type, for example. The doping concentration of the first floating region 17 may be higher than the doping concentration of base regions 14.

Figure 5C:
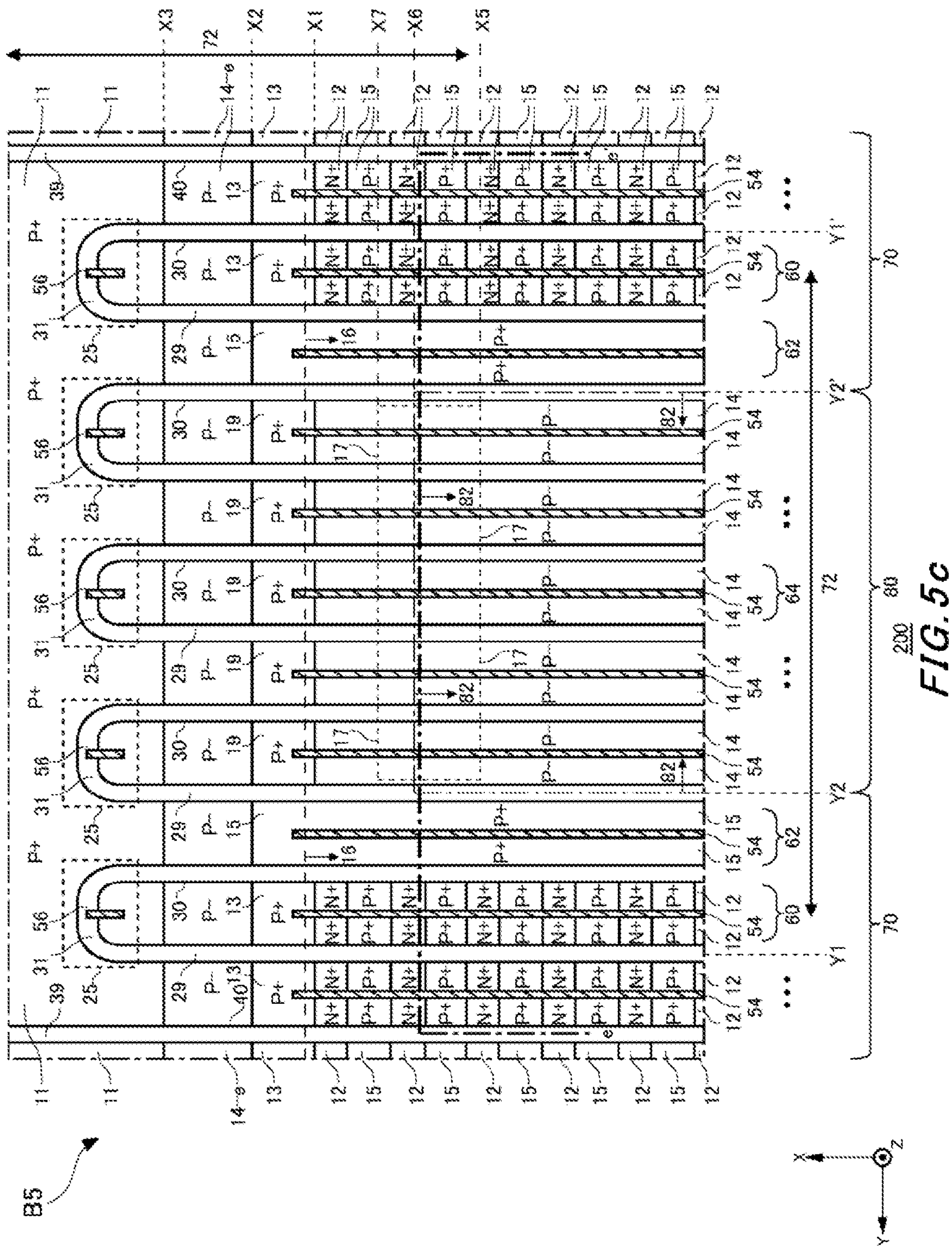
FIG. 5*c* is an enlarged view of a region B5 in FIG. 5*b*.

FIG. 5*c* is an enlarged view of a region B5 in FIG. 5*b*. In FIG. 5*c*, the range in which the lifetime control region 72 is provided is indicated by an arrow.

The first floating region 17 in the present example is provided in the region of a portion indicated by broken lines in FIG. 5*c*. As shown in FIG. 5*c*, the first floating region 17 in the present example overlaps the end portion X6 of the second cathode region 82 in the X-axis direction. That is, the end portion X5 of the first floating region 17 on the X-axis direction negative side is provided on the X-axis direction negative side of the end portion X6. In addition, an end portion of the first floating region 17 on the X-axis direction negative side is provided on the X-axis direction positive side of the end portion X6.

The first floating region 17 is provided on the inner side in the Y-axis direction relative to the second cathode region 82. That is, the first floating region 17 is not provided in transistor portions 70.

Figure 5D:
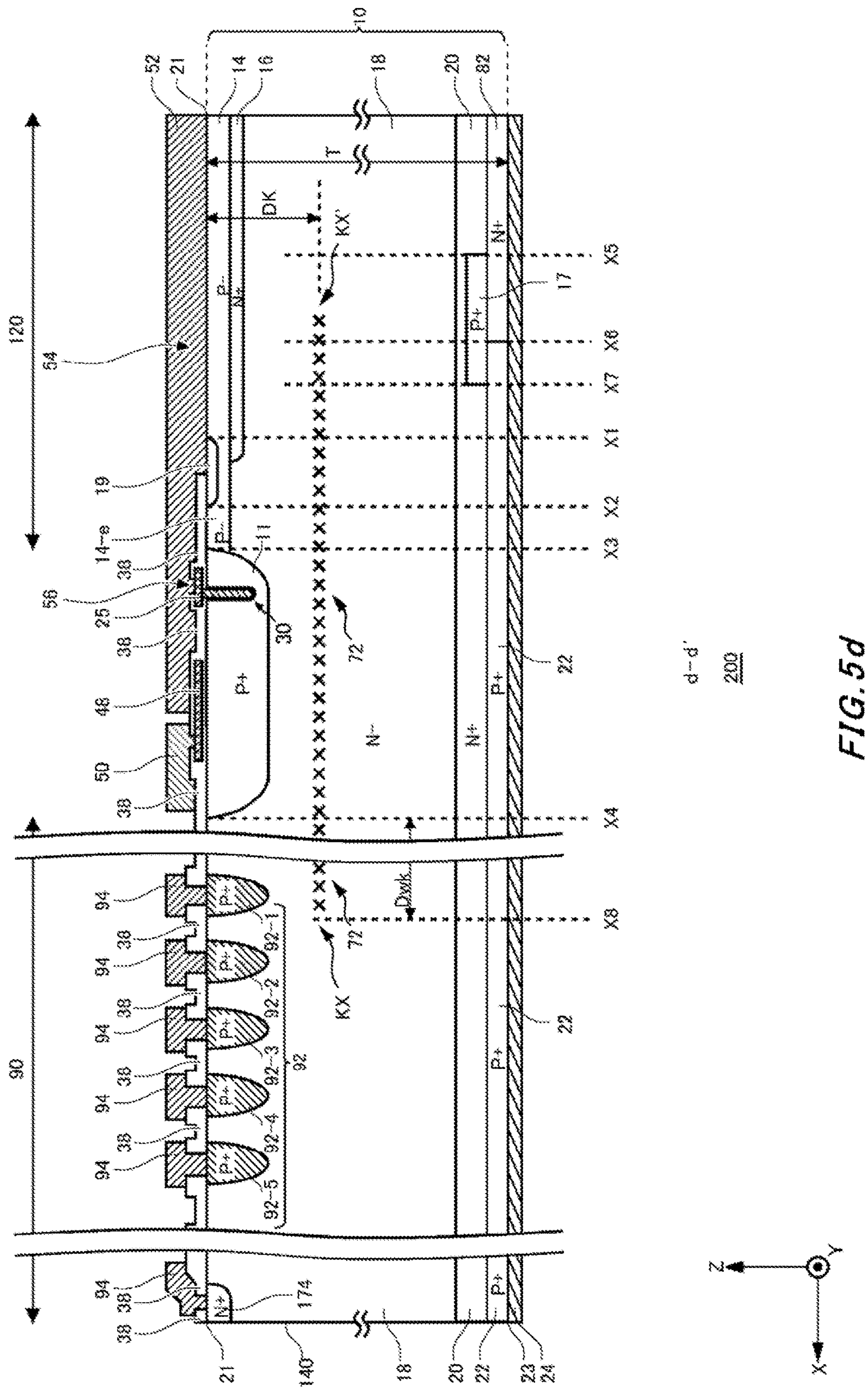
FIG. 5*d* is a figure showing an exemplary cross-section taken along d-d' in FIG. 5*b*.

FIG. 5*d* is a figure showing an exemplary cross-section taken along d-d' in FIG. 5*b*. The d-d' cross-section is an X-Z plane that passes through the channel stopper 174, the guard rings 92, the well region 11, a dummy trench portion 30, a base region 14-*e*, a second contact region 19 and a base region 14. In addition, the d-d' cross-section is an X-Z plane that passes through a contact hole 54 and a contact hole 56 above the upper surface of the semiconductor substrate 10.

The semiconductor device 200 in the present example has, in the d-d' cross-section, the semiconductor substrate 10, interlayer dielectric films 38, the gate runner 48, a connection portion 25, the emitter electrode 52, the gate metal layer 50, field plates 94 and the collector electrode 24. The emitter electrode 52 and field plates 94 are provided at the upper surface 21 of the semiconductor substrate 10 and the upper surfaces of the interlayer dielectric films 38. The collector electrode 24 is provided at the lower surface 23 of the semiconductor substrate 10.

The semiconductor substrate 10 includes the first-conductivity type drift region 18. The drift region 18 may be a region in the semiconductor substrate 10 left free of other doped regions.

The active portion 120 may be provided with one or more accumulation regions 16 above the drift region 18. The semiconductor device 200 shown in FIG. 5*d* depicts one example in which one accumulation region 16 is provided in the Z-axis direction. If a plurality of accumulation regions 16 are provided, the individual accumulation regions 16 may be arranged next to each other in the Z-axis direction. Note that, in the present example, the accumulation region 16 may not be provided.

The active portion 120 is provided with a base region 14 above the accumulation region 16 and in contact with the upper surface 21. The second contact region 19 is provided in contact with the upper surface 21. The second contact region 19 is provided to overlap the base region 14 in the X-axis direction. The base region 14 may be provided deeper than the second contact region 19 when seen from the upper surface 21. Note that the base region 14-*e* in FIG. 5*d* is sandwiched by the well region 11 and the second contact region 19 in the X-axis direction.

The structures of the guard rings 92 and channel stopper 174 in the edge termination structure portion 90 are the same as those of the edge termination structure portion 90 shown in FIG. 1*d*.

The well region 11 is provided between the active portion 120 and the edge termination structure portion 90 in the X-axis direction. In the d-d' cross-section, the well region 11 is provided with the dummy trench portion 30. The cross-section of the dummy trench portion 30 in the d-d' cross-section is a cross-section of a connecting part 31 of a dummy trench portion 30 in the top view in FIG. 5*b*. The well region 11 may be provided deeper in the Z-axis direction than the dummy trench portion 30 is.

As in the example shown in FIG. 1*d*, the buffer region 20 may be provided below the drift region 18.

The lower surface 23 of the semiconductor substrate 10 is provided with the second cathode region 82 and collector region 22. The second cathode region 82 and collector region 22 may contact each other in the X-axis direction. The boundary X6 between the second cathode region 82 and the collector region 22 in the X-axis direction is provided on the X-axis direction negative side relative to the end portion X1 of the second contact region 19 on the X-axis direction negative side.

The first floating region 17 is provided above the second cathode region 82 and collector region 22. The first floating region 17 is provided above the boundary X6. That is, the first floating region 17 is continuous in the X-axis direction from the second cathode region 82 to the collector region 22.

The semiconductor device 200 in the present example is provided with the lifetime control region 72 on the upper surface 21 side in the Z-axis direction. As shown in FIG. 5*d*, the lifetime control region 72 is continuous in the X-axis direction from an inner region of the active portion 120 relative to the second contact region 19 to the edge termination structure portion 90. An "inner region of the active portion 120" refers to a region that is close to the middle of the active portion 120. The lifetime control region 72 may be provided below the well region 11. The lifetime control region 72 may terminate at a position closer, in the X-axis direction, to the peripheral end 140 than the well region 11 terminates. That is, the end portion KX of the lifetime control region 72 on the X-axis direction positive side may be positioned in the edge termination structure portion 90 in the X-axis direction.

The position X8 is the position of the end portion KX in the X-axis direction. In the present example, the position X8 overlaps the guard ring 92-2 in the X-axis direction in the top view of the semiconductor substrate 10.

The distance Dwk is a distance in the X-axis direction between the end portion X4 of the well region 11 on the edge termination structure portion 90 side and the position X8. The distance Dwk may be 200 μm or shorter. The distance Dwk may be more preferably 100 μm or shorter.

In the semiconductor device 200 in the present example, in the top view of the semiconductor substrate 10, at least part of the lifetime control region 72 and at least part of the first floating region 17 may overlap in the X-axis direction. That is, at least part of the lifetime control region 72 may be provided in an at least partial range in the X-axis direction between the end portion X5 of the first floating region 17 on the X-axis direction negative side and the end portion X7 of the first floating region 17 on the X-axis direction positive side. In the present example, the end portion KX' of the lifetime control region 72 on the X-axis direction negative side is arranged in the X-axis direction between the boundary X6 and the end portion X5 of the first floating region 17 on the X-axis direction negative side.

The lifetime control region 72 is provided at a position shallower than ½ of the thickness T of the semiconductor substrate 10 in the Z-axis direction. The depth DK of the lifetime control region 72 from the upper surface of 21 may be 5 μm to 20 μm inclusive. The depth DK is 12 μm, for example.

In the semiconductor device 200 in the present example, the first floating region 17 is provided above the second cathode region 82 and collector region 22. In addition, in the top view of the semiconductor substrate 10, at least part of the lifetime control region 72 and at least part of the first floating region 17 overlap in the X-axis direction. Because of this, injection of carriers (holes in the present example) from the second contact region 19 to the second cathode region 82 can be suppressed. Because of this, the reverse recovery withstand capability of the diode portion 80 can be improved.

In addition, since, in the semiconductor device 200 in the present example, the first floating region 17 is provided above the second cathode region 82 and collector region 22, injection of carriers (electrons in the present example) from the second cathode region 82 to the second contact region 19 and well region 11 can be suppressed. Because of this, the reverse recovery withstand capability of the diode portion 80 can be improved.

Figure 5E:
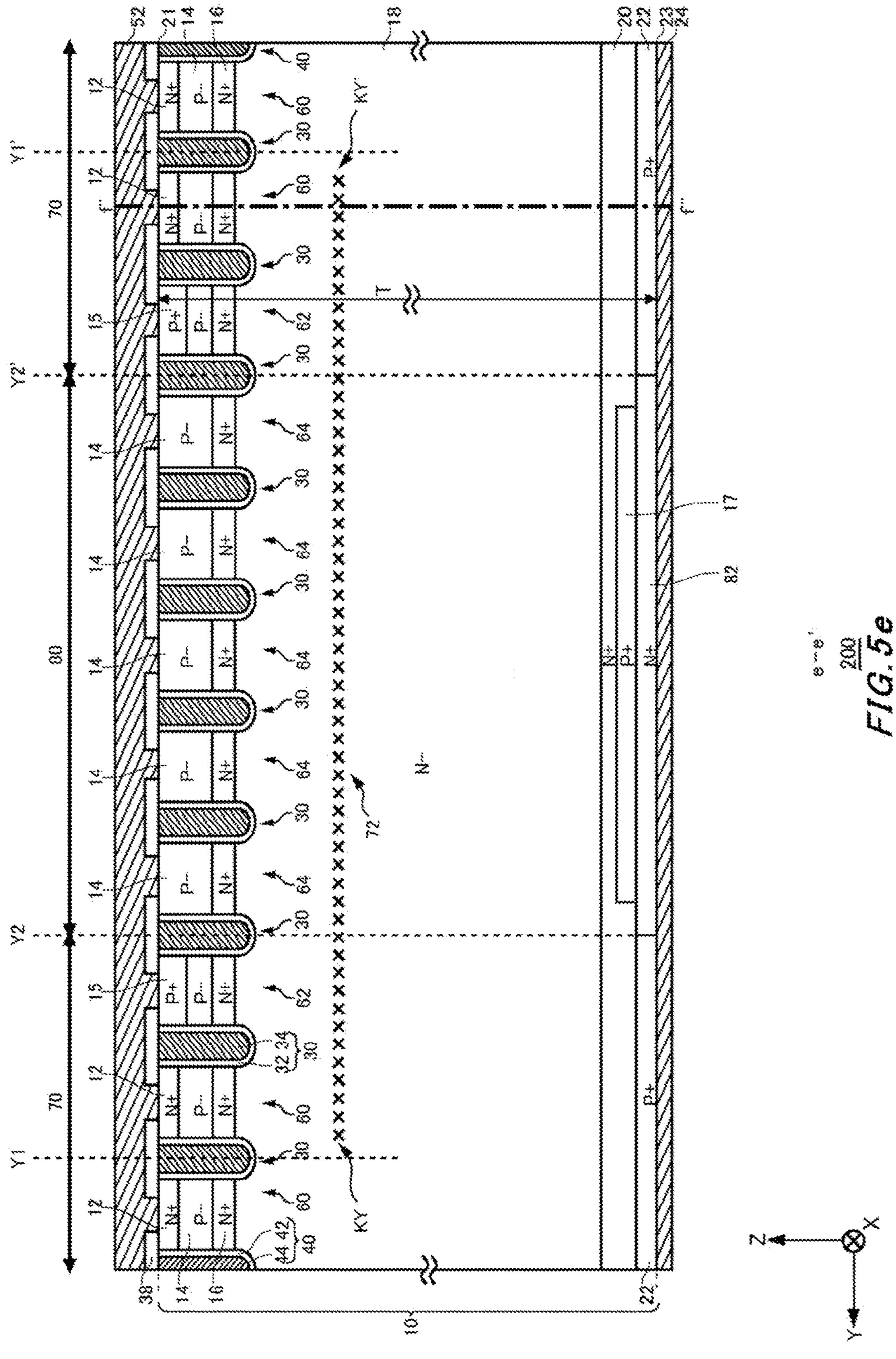
FIG. 5*e* is a figure showing an exemplary cross-section taken along e-e' in FIG. 5*c*.

FIG. 5*e* is a figure showing an exemplary cross-section taken along e-e' in FIG. 5*c*. The e-e' cross-section is a Y-Z cross-section from a transistor portion 70 contacting the diode portion 80 on the Y-axis direction positive side to a transistor portion 70 contacting the diode portion 80 on the Y-axis direction negative side. In addition, the e-e' cross-section is a Y-Z cross-section that passes through emitter regions 12, third contact regions 15 in second mesa portions, and base regions 14 in the diode portion 80.

In the e-e' cross-section, accumulation regions 16 may be provided above the drift region 18. In first mesa portions 60 and second mesa portions 62, base regions 14 are provided above the accumulation regions 16. In third mesa portions 64, base regions 14 are provided above the accumulation regions 16 and in contact with the upper surface 21. In the first mesa portions 60, emitter regions 12 are provided above the base regions 14 and in contact with the upper surface 21. In the second mesa portions 62, third contact regions 15 are provided above the base regions 14 and in contact with the upper surface 21.

A gate trench portion 40 has a gate trench formed at the upper surface 21, a gate insulating film 42 and a gate conductive portion 44. The gate insulating film 42 is formed to cover the inner wall of the gate trench. The gate insulating film 42 may be formed by oxidizing or nitriding a semiconductor at the inner wall of the gate trench. The gate conductive portion 44 is formed within the gate trench and on the inner side relative to the gate insulating film 42. The gate insulating film 42 insulates the gate conductive portion 44 from the semiconductor substrate 10. The gate conductive portion 44 is formed of a conductive material such as polysilicon. The gate trench portion 40 is covered with an interlayer dielectric film 38 at the upper surface 21.

The gate conductive portion 44 includes, in the depth direction of the semiconductor substrate 10, a region at which it faces a base region 14 with the gate insulating film 42 being sandwiched therebetween. If a predetermined voltage is applied to the gate conductive portion 44, a channel is formed at a surface layer of the interface of the base region 14 contacting the gate trench, due to an electron inversion layer.

In FIG. 5*e*, dummy trench portions 30 may have the same structure as that of gate trench portions 40. A dummy trench portion 30 has a dummy trench formed on the upper surface 21 side, a dummy insulating film 32 and a dummy conductive portion 34. The dummy insulating film 32 is formed to cover the inner wall of the dummy trench. The dummy conductive portion 34 is formed within the dummy trench and on the inner side relative to the dummy insulating film 32. The dummy insulating film 32 insulates the dummy conductive portion 34 from the semiconductor substrate 10. The dummy trench portion 30 is covered with an interlayer dielectric film 38 at the upper surface 21.

Gate trench portions 40 and dummy trench portions 30 may penetrate accumulation regions 16 from the upper surface 21. The gate trench portions 40 and dummy trench portions 30 may extend from the upper surface 21 to reach the drift region 18.

In the e-e' cross-section, the transistor portions 70 are provided with the collector region 22 at the lower surface 23. In addition, the diode portion 80 is provided with the second cathode region 82 at the lower surface 23.

The semiconductor device 200 in the present example is provided with the lifetime control region 72 on the upper surface 21 side in the e-e' cross-section. In the present example, the lifetime control region 72 is continuous in the Y-axis direction from between the position Y1 and the end portion Y2 of the second cathode region 82 on the Y-axis direction positive side to between the position Y1' and the end portion Y2' of the second cathode region 82 on the Y-axis direction negative side. The position Y1 is the position of a dummy trench portion 30 arranged at an end portion of a transistor portion 70 on the Y-axis direction positive side, and the position Y1' is the position of a dummy trench portion 30 arranged at an end portion of a transistor portion 70 on the Y-axis direction negative side. The end portion KY of the lifetime control region 72 on the Y-axis direction positive side is arranged between the end portion Y2 and the position Y1 in the Y-axis direction. The end portion KY' of the lifetime control region 72 on the Y-axis direction negative side is arranged between the end portion Y2' and the position Y1' in the Y-axis direction.

The lifetime control region 72 may not be provided below gate trench portions 40. By not providing the lifetime control region 72 below gate trench portions 40, leakage current of the transistor portions 70 can be suppressed.

Figure 5F:
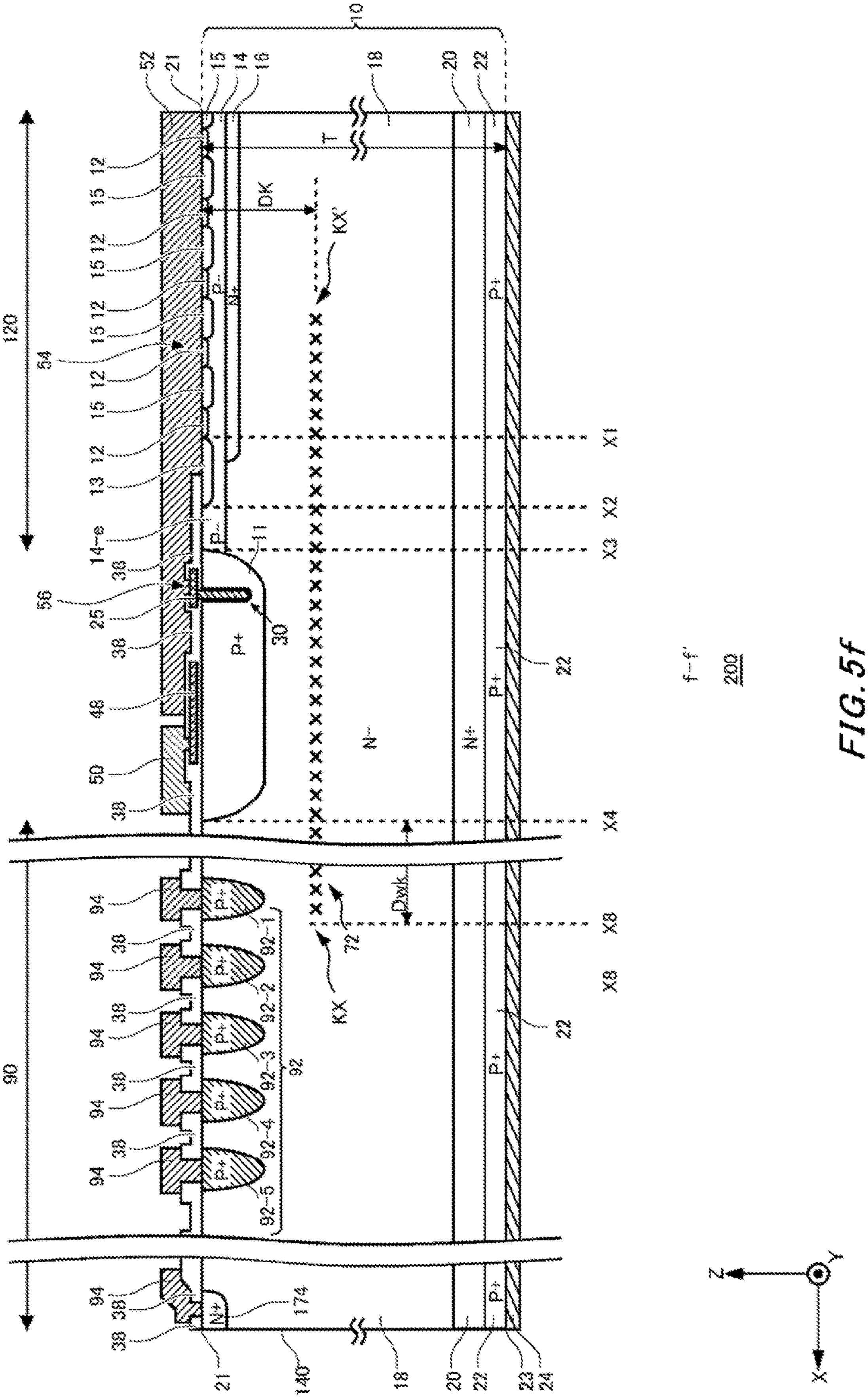
FIG. 5*f* is a figure showing an exemplary cross-section taken along f-f' in FIG. 5*b*.

FIG. 5*f* is a figure showing an exemplary cross-section taken along f-f' in FIG. 5*b*. The f-f' cross-section is an X-Z plane that passes the line f''-f''' in FIG. 5*e*. The f-f' cross-section is an X-Z plane that passes through the channel stopper 174, the guard rings 92, the well region 11, a dummy trench portion 30, a base region 14-*e*, a first contact region 13, emitter regions 12 and third contact regions 15 in a region that is in a transistor portion 70 and is in contact with the diode portion 80. In addition, the f-f' cross-section is an X-Z plane that passes through a contact hole 54 and a contact hole 56 above the upper surface 21.

The semiconductor device 200 in the present example has, in the f-f' cross-section, the semiconductor substrate 10, interlayer dielectric films 38, the gate runner 48, a connection portion 25, the emitter electrode 52, the gate metal layer 50, field plates 94 and the collector electrode 24. The emitter electrode 52 and field plates 94 are provided at the upper surface 21 of the semiconductor substrate 10 and the upper surfaces of the interlayer dielectric films 38.

The semiconductor device 200 in the present example is provided with the collector region 22 in contact with the lower surface 23 in the f-f' cross-section. The collector region 22 may be continuous in the X-axis direction from the active portion 120 to the peripheral end 140. In addition, the lower surface 23 is provided with the collector electrode 24.

In the f-f' cross-section, the end portion KX of the lifetime control region 72 is provided, in the X-axis direction, at the same position as the end portion KX in the d-d' cross-section shown in FIG. 5*d*. The end portion KX' of the lifetime control region 72 is provided, in the X-axis direction, at the same position as the end portion KX' in the d-d' cross-section shown in FIG. 5*d*.

Figure 6A:
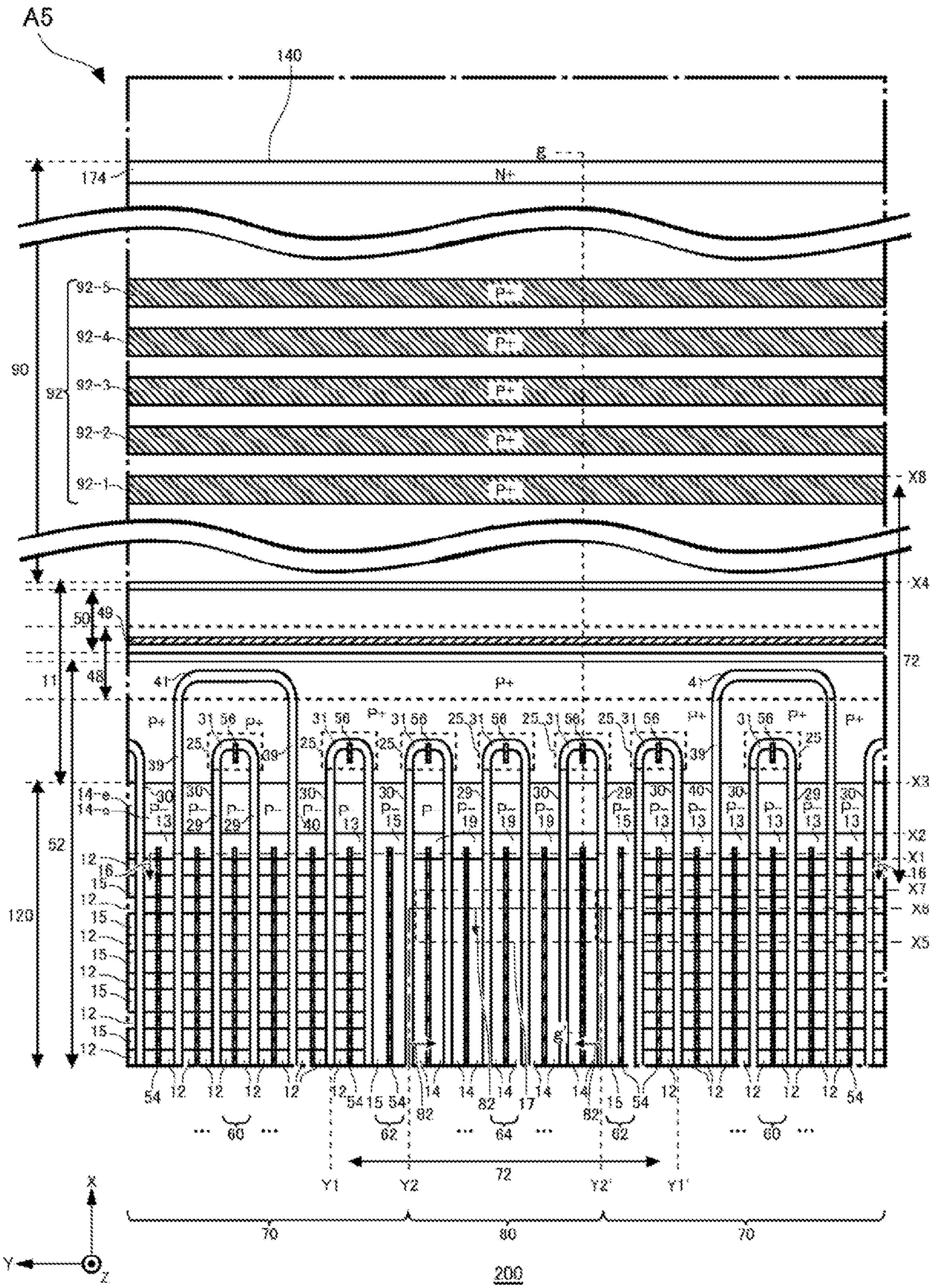
FIG. 6*a* is an enlarged view related to another exemplary region A5 in FIG. 5*a*.

FIG. 6*a* is an enlarged view related to another exemplary region A5 in FIG. 5*a*. The semiconductor device 200 in the present example is different from the semiconductor device 100 shown in FIG. 5*b* in that, as shown in FIG. 6*a*, an end portion of the lifetime control region 72 on the X-axis direction negative side is arranged between the end portion X1 and the end portion X7 in the X-axis direction.

Figure 6B:
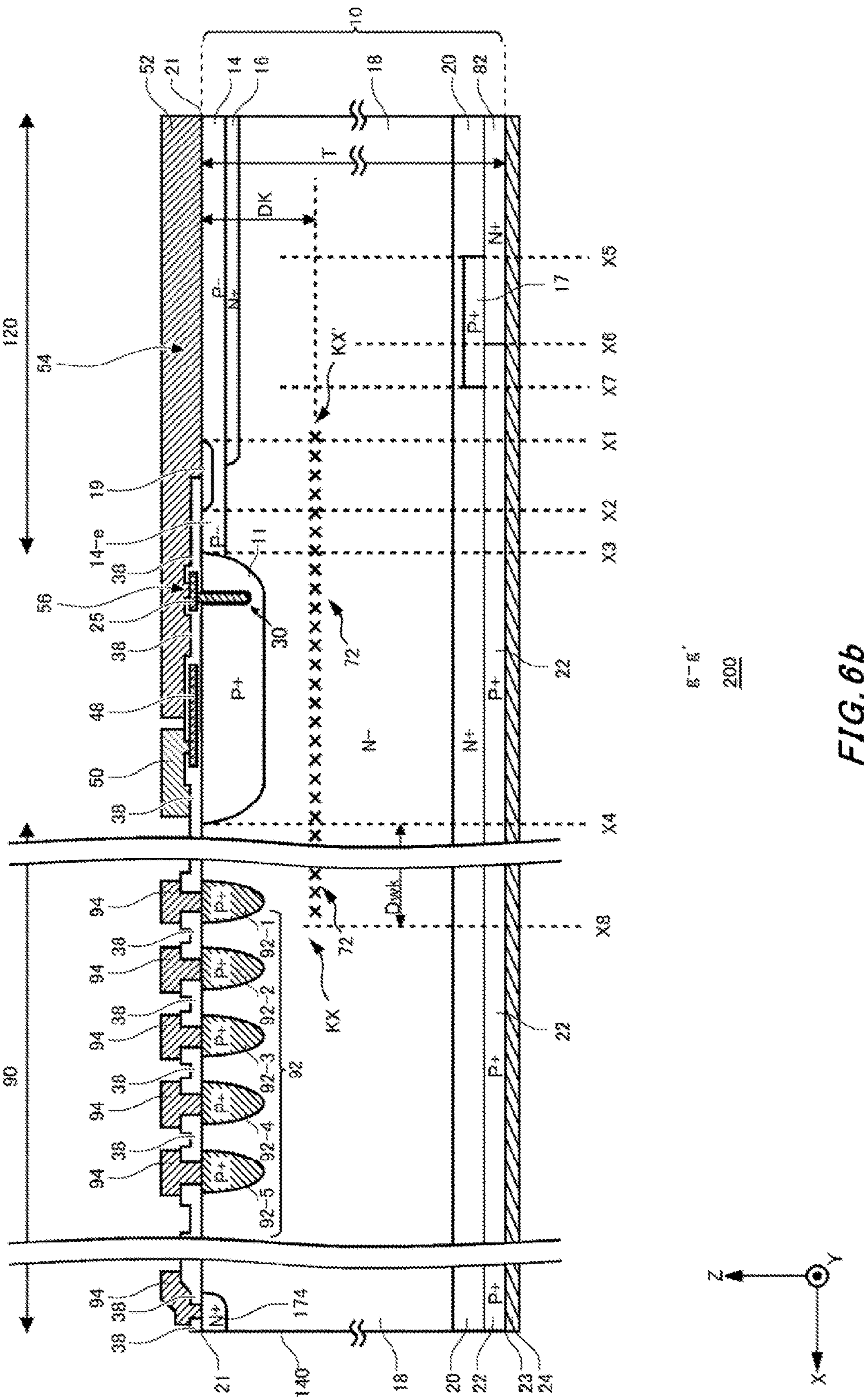
FIG. 6*b* is a figure showing an exemplary cross-section taken along g-g' in FIG. 6*a*.

FIG. 6*b* is a figure showing an exemplary cross-section taken along g-g' in FIG. 6*a*. The semiconductor device 200 in the present example is different from the d-d' cross-section in FIG. 5*d* in that the end portion KX' of the lifetime control region 72 is arranged between the end portion X1 and the end portion X7 in the X-axis direction.

In the semiconductor device 200 in the present example, the lifetime control region 72 is provided below the second contact region 19. That is, the lifetime control region 72 is provided between the end portion X1 and the end portion X2 in the X-axis direction.

Since, in the semiconductor device 200 in the present example, the lifetime control region 72 is provided below the second contact region 19, injection of carriers (holes in the present example) from the second contact region 19 to the second cathode region 82 can be suppressed. Because of this, the reverse recovery withstand capability of the diode portion 80 can be improved.

Figure 7A:
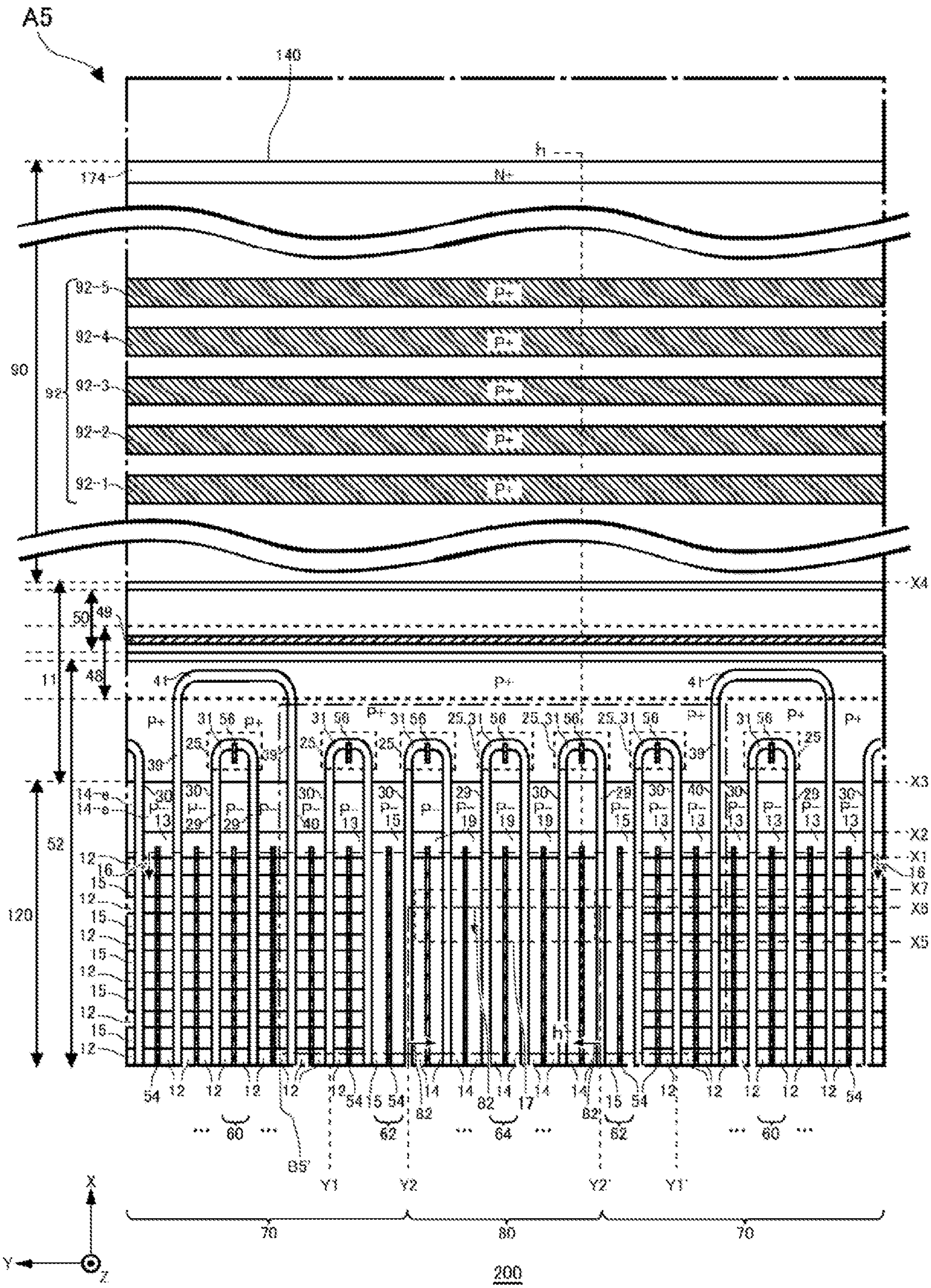
FIG. 7*a* is an enlarged view related to another exemplary region A5 in FIG. 5*a*.

FIG. 7*a* is an enlarged view related to another exemplary region A5 in FIG. 5*a*. The semiconductor device 200 in the present example is different from the semiconductor device 200 shown in FIG. 5*b* in that, as shown in FIG. 7*a*, a lifetime control region 72 is not provided.

Figure 7B:
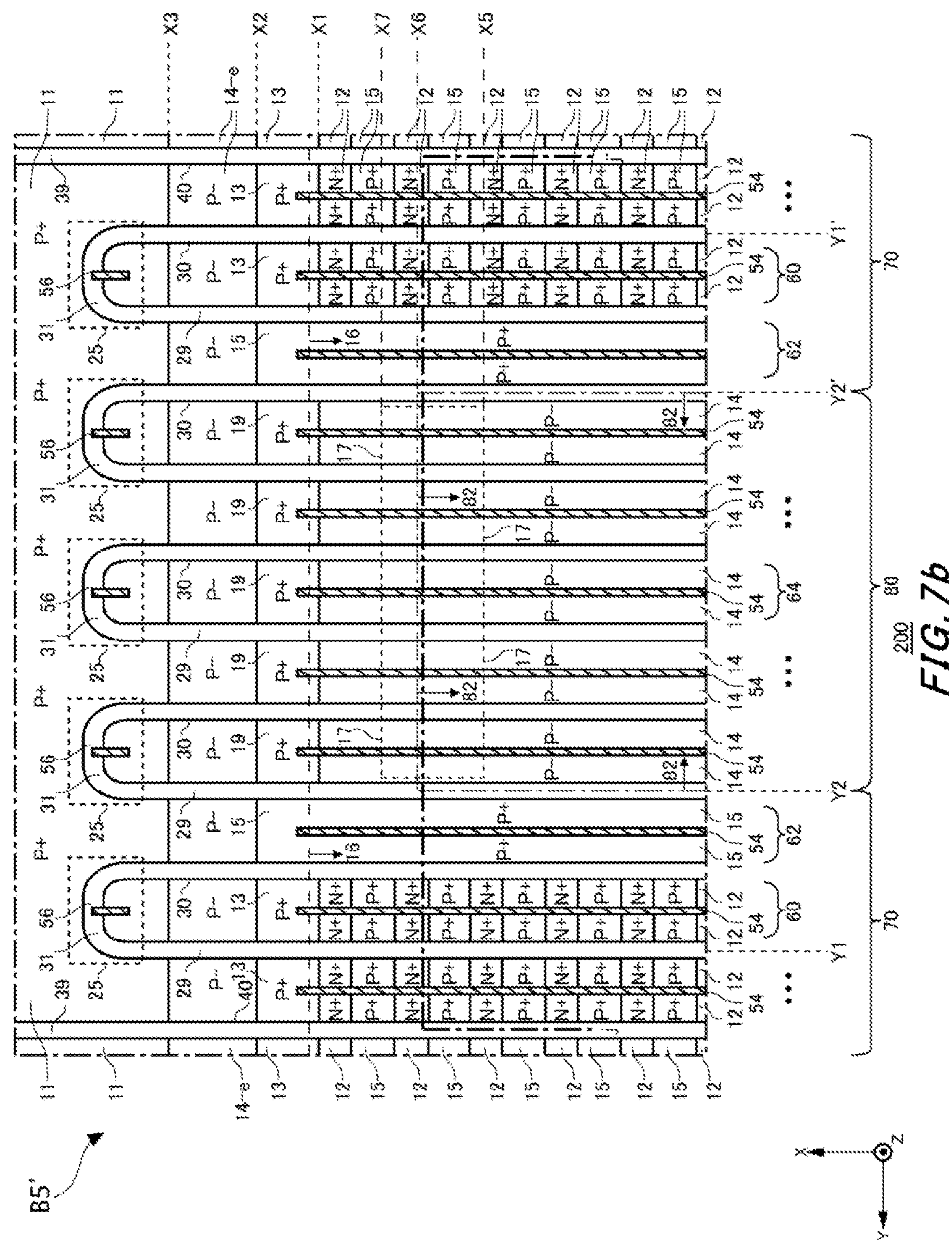
FIG. 7*b* is an enlarged view of a region B5' in FIG. 7*a*.

FIG. 7*b* is an enlarged view of a region B5' in FIG. 7*a*. The semiconductor device 200 in the present example is not provided with a lifetime control region 72.

Figure 7C:
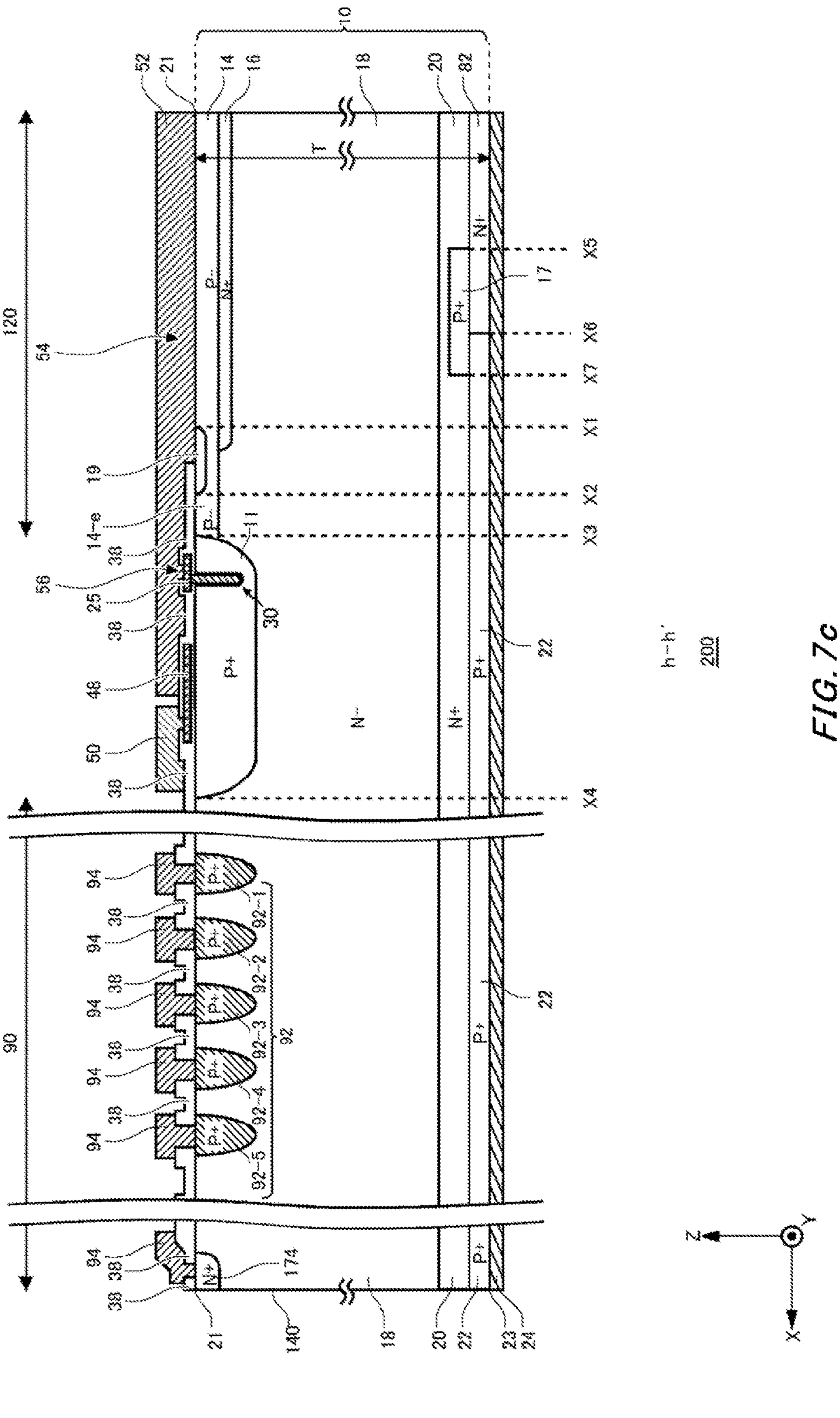
FIG. 7*c* is a figure showing an exemplary cross-section taken along h-h' in FIG. 7*b*.

FIG. 7*c* is a figure showing an exemplary cross-section taken along h-h' in FIG. 7*a*. The configuration of the h-h' cross-section in the semiconductor device 200 in the present example is different from the configuration of the d-d' cross-section shown in FIG. 5*d* in that a lifetime control region 72 is not provided.

In addition, since, in the semiconductor device 200 in the present example, the first floating region 17 is provided above the second cathode region 82 and collector region 22, injection of carriers (electrons in the present example) from the second cathode region 82 to the second contact region 19 and well region 11) can be suppressed. Because of this, the reverse recovery withstand capability of the diode portion 80 can be improved.

Figure 7D:
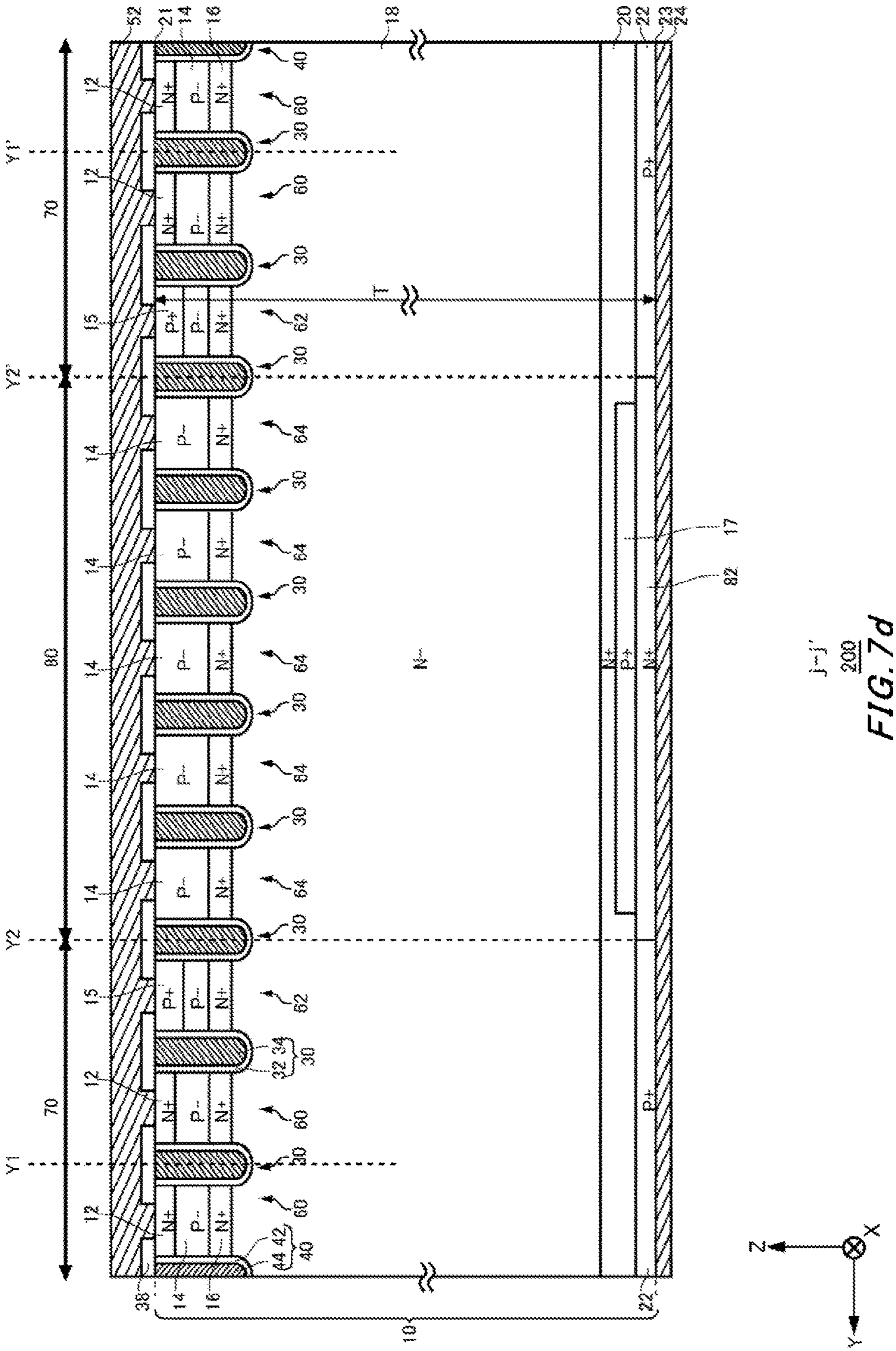
FIG. 7*d* is a figure showing an exemplary cross-section taken along j-j' in FIG. 7*b*.

FIG. 7*d* is a figure showing an exemplary cross-section taken along j-j' in FIG. 7*b*. The configuration of the j-j' cross-section in the semiconductor device 200 in the present example is different from the configuration of the e-e' cross-section shown in FIG. 5*e* in that a lifetime control region 72 is not provided in the e-e' cross-section shown in FIG. 5*e*.

The semiconductor device 200 in the present example is not provided with a lifetime control region 72 on the upper surface 21 side of the semiconductor substrate 10. Because of this, leakage current at transistor portions 70 can be more suppressed than in the semiconductor device 200 shown in FIG. 5*e*.

Figure 8A:
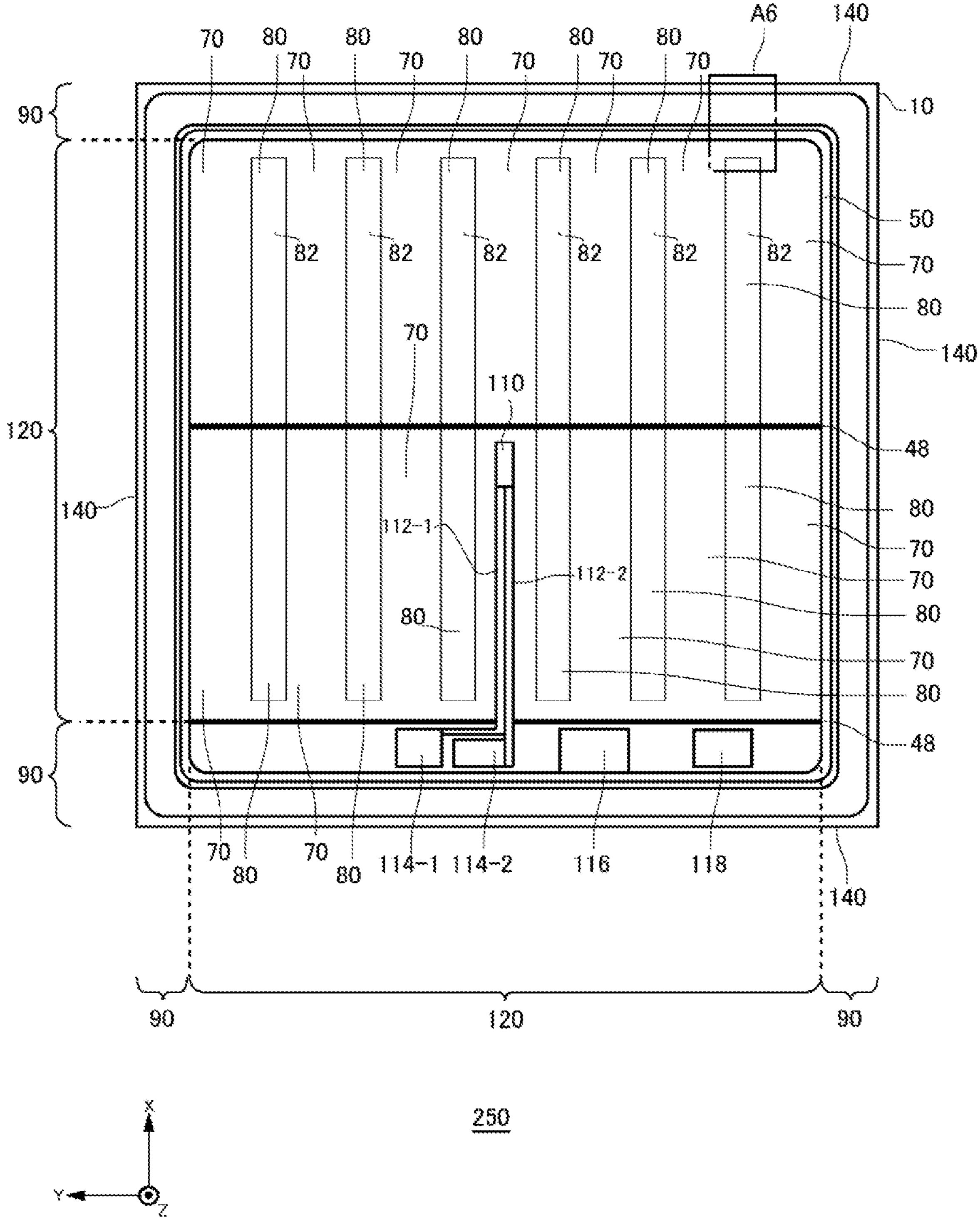
FIG. 8*a* is a figure showing the upper surface of a semiconductor device 250 in a second comparative example.

FIG. 8*a* is a figure showing the upper surface of a semiconductor device 250 in a second comparative example. As described below in explanations with reference to FIG. 8*b* and FIG. 8*c*, the semiconductor device 250 is different from the semiconductor device 200 shown in FIG. 5*a* in that a lifetime control region 72 is not provided on the upper surface 21 side of the semiconductor substrate 10, and a first floating region 17 is not provided on the lower surface 23 side.

Figure 8B:
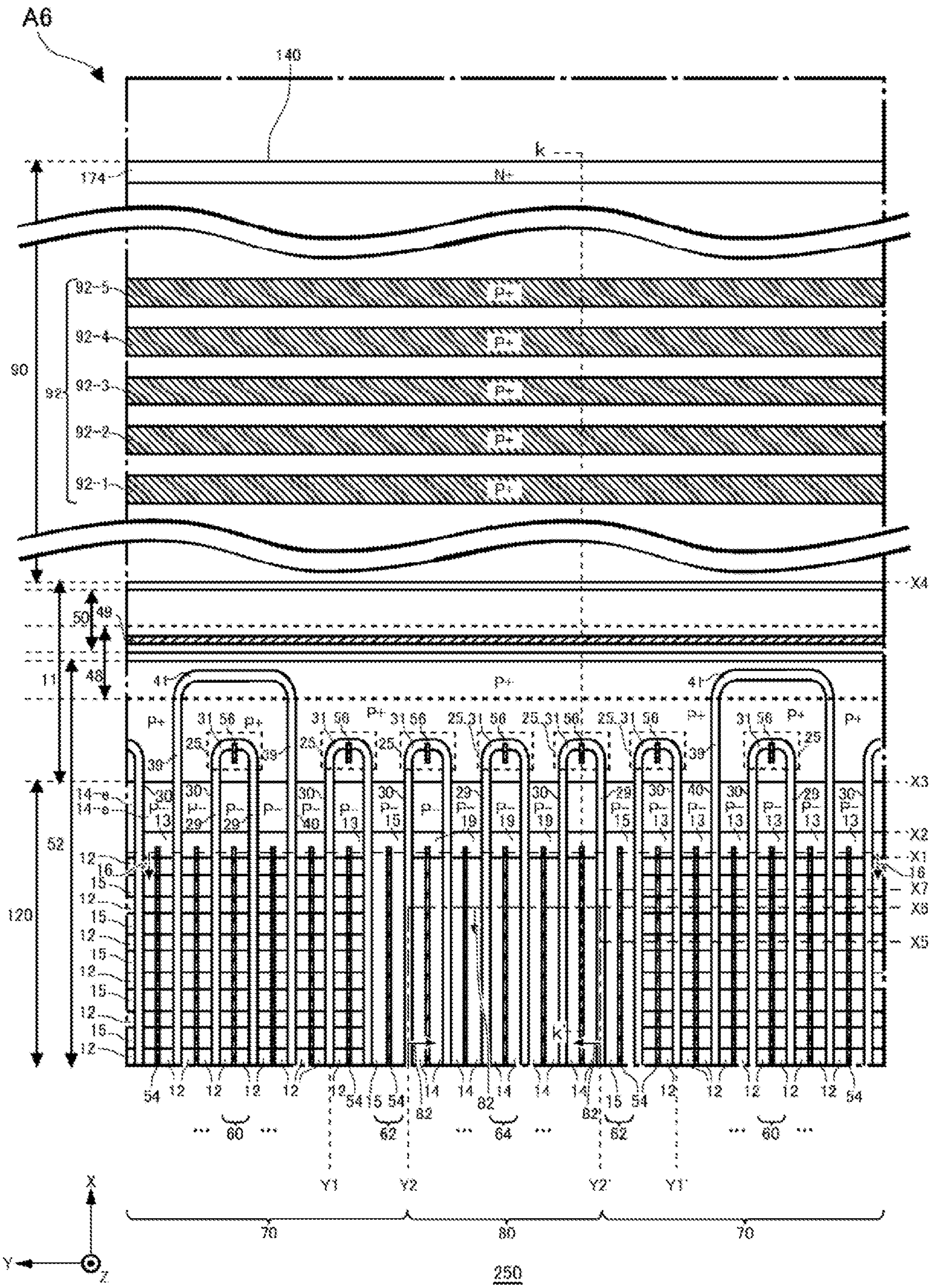
FIG. 8*b* is an enlarged view of a region A6 in FIG. 8*a*.

FIG. 8*b* is an enlarged view of a region A6 in FIG. 8*a*. The semiconductor device 250 is not provided with a lifetime control region 72. In addition, the semiconductor device 250 is not provided with a first floating region 17.

Figure 8C:
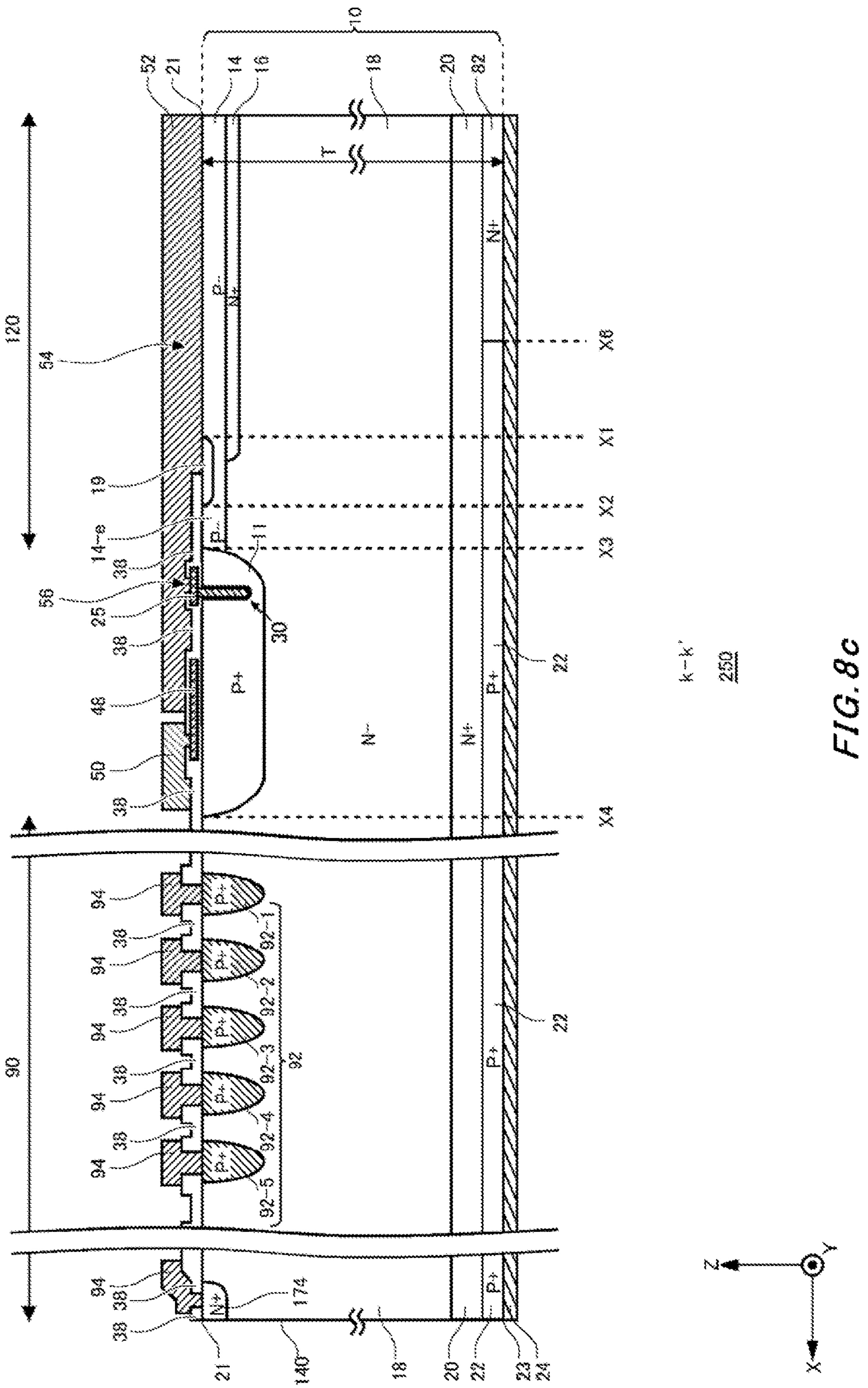
FIG. 8*c* is a figure showing an exemplary cross-section taken along k-k' in FIG. 8*b*.

FIG. 8*c* is a figure showing an exemplary cross-section taken along k-k' in FIG. 8*b*. The configuration of the k-k' cross-section in the semiconductor device 250 is different from the configuration of the d-d' cross-section shown in FIG. 5*d* in that a lifetime control region 72 is not provided. In addition, the configuration of the k-k' cross-section in the semiconductor device 250 is different from the configuration of the d-d' cross-section shown in FIG. 5*d* in that a first floating region 17 is not provided.

The semiconductor device 250 is not provided with a lifetime control region 72 on the upper surface 21 side of the semiconductor substrate 10. Because of this, injection of carriers (holes in the present example) from the second contact region 19 to the second cathode region 82 cannot be suppressed. Because of this, the reverse recovery withstand capability of the diode portion 80 cannot be improved.

The semiconductor device 250 is not provided with a first floating region 17 on the lower surface 23 side of the semiconductor substrate 10. Because of this, injection of carriers (electrons in the present example) from the second cathode region 82 to the second contact region 19 and well region 11 cannot be suppressed. Because of this, the reverse recovery withstand capability of the diode portion 80 cannot be improved.

Figure 9A:
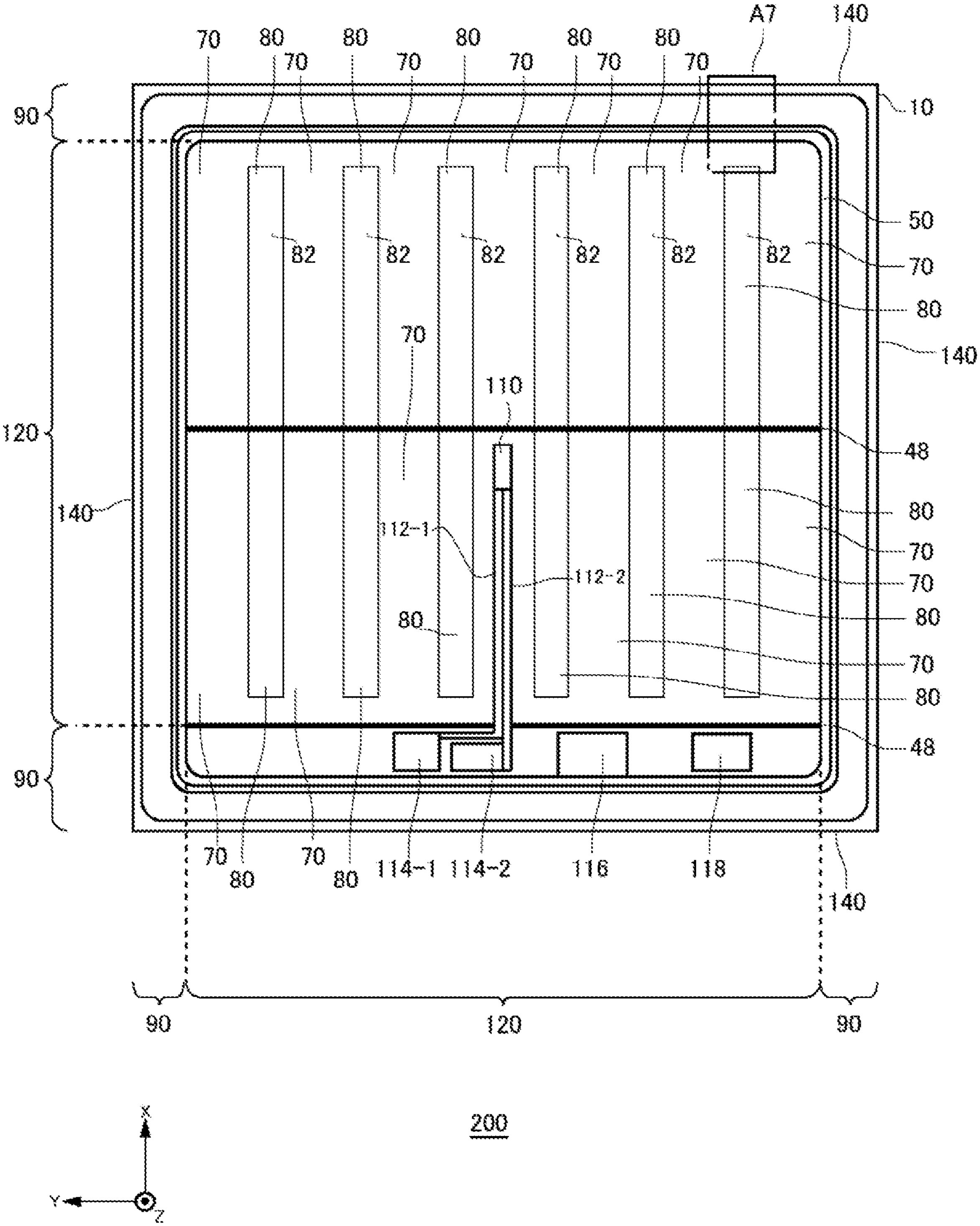
FIG. 9*a* is a figure showing another exemplary upper surface of the semiconductor device 200 according to the present embodiment.

FIG. 9*a* is a figure showing another exemplary upper surface of the semiconductor device 200 according to the present embodiment. The semiconductor device 200 in the present example is different from the semiconductor device 200 shown in FIG. 5*a* in that ends of the second cathode region 82 on the X-axis direction positive side and negative side are arranged closer to the middle of the active portion 120 than in the example shown in FIG. 5*a*. In addition, as described below in explanations with reference to FIG. 9*b* to FIG. 9*d*, it is different from the semiconductor device 200 shown in FIG. 5*a* in that a first floating region 17 and a lifetime control region 72 are not provided.

Figure 9B:
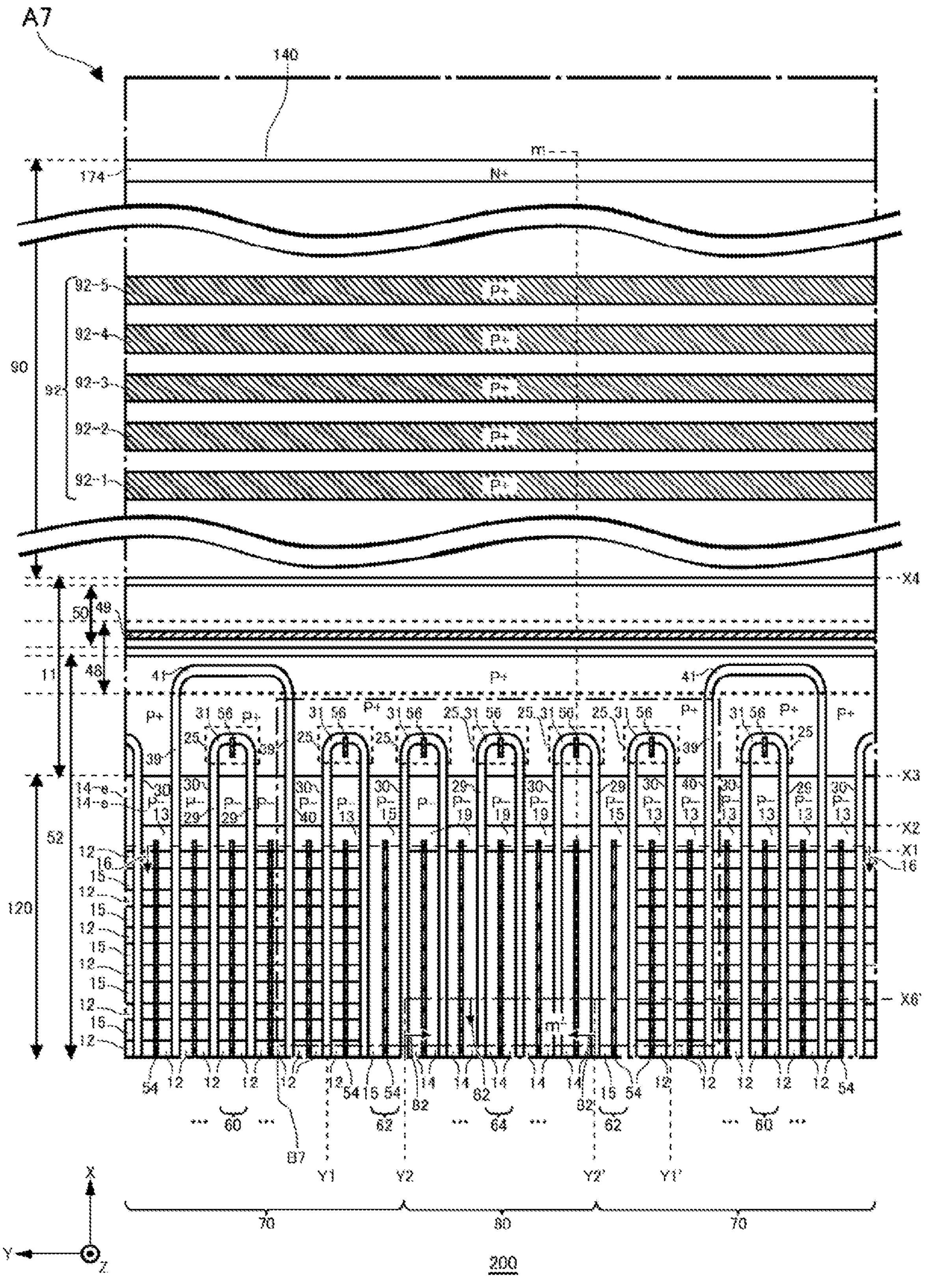
FIG. 9*b* is an enlarged view of a region A7 in FIG. 9*a*.

FIG. 9*b* is an enlarged view of a region A7 in FIG. 9*a*. The semiconductor device 200 in the present example is different from the semiconductor device 200 shown in FIG. 5*b* in that, as shown in FIG. 9*b*, an end portion of the second cathode region 82 on the X-axis direction positive side is provided closer to the middle of the active portion 120 than in the example shown in FIG. 5*b*, that is, provided apart from the edge termination structure portion 90. The end portion X6' is an end portion of the second cathode region 82 on the X-axis direction positive side. In addition, it is different from the semiconductor device 200 shown in FIG. 5*b* in that a lifetime control region 72 and a first floating region 17 are not provided.

Figure 9C:
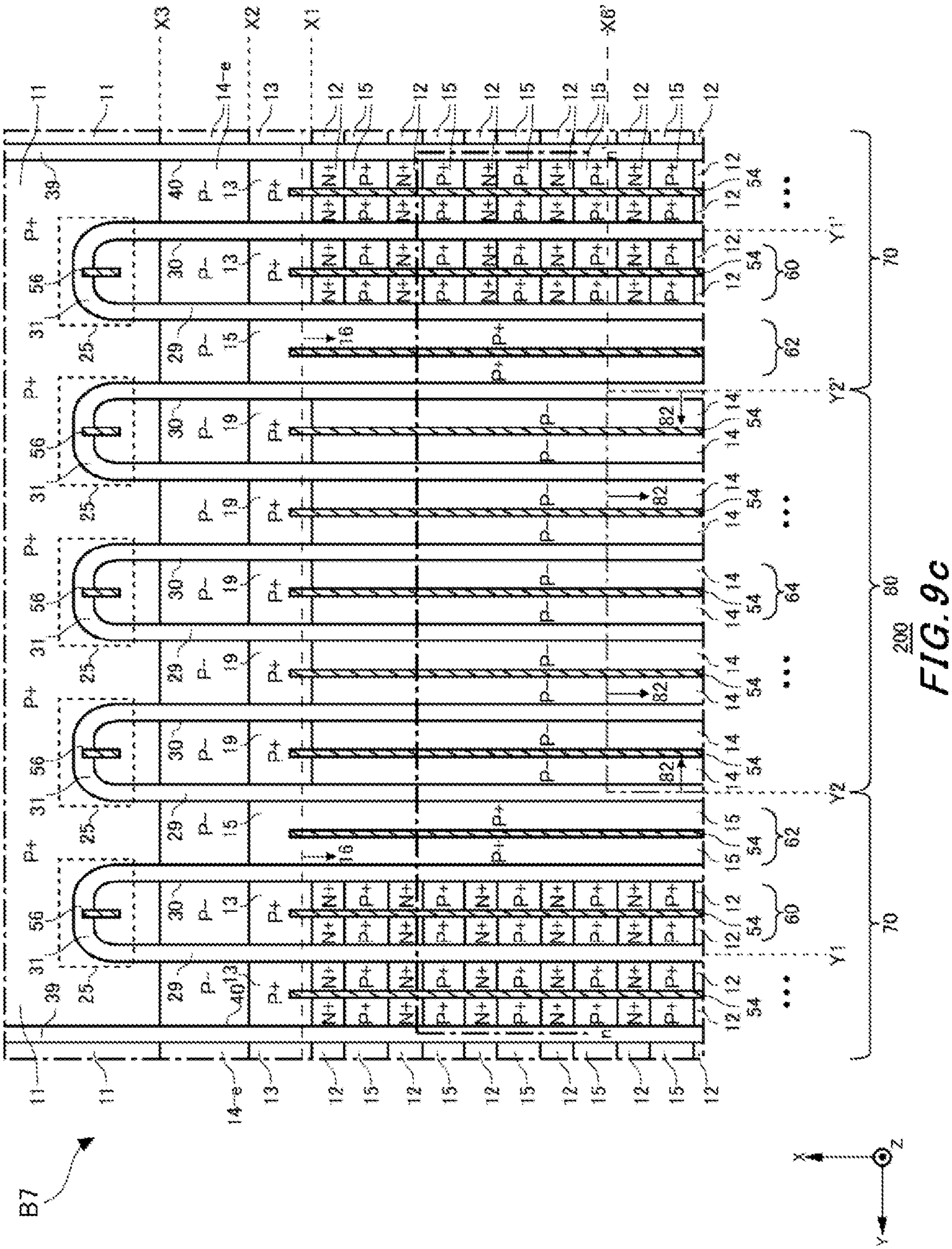
FIG. 9*c* is an enlarged view of a region B7 in FIG. 9*b*.

FIG. 9*c* is an enlarged view of a region B7 in FIG. 9*b*. In the semiconductor device 200 in the present example, as shown in FIG. 9*c*, the end portion X6' is provided closer to the active portion 120 than the end portion X6 shown in FIG. 5*c* is. In addition, a first floating region 17 is not provided.

Figure 9D:
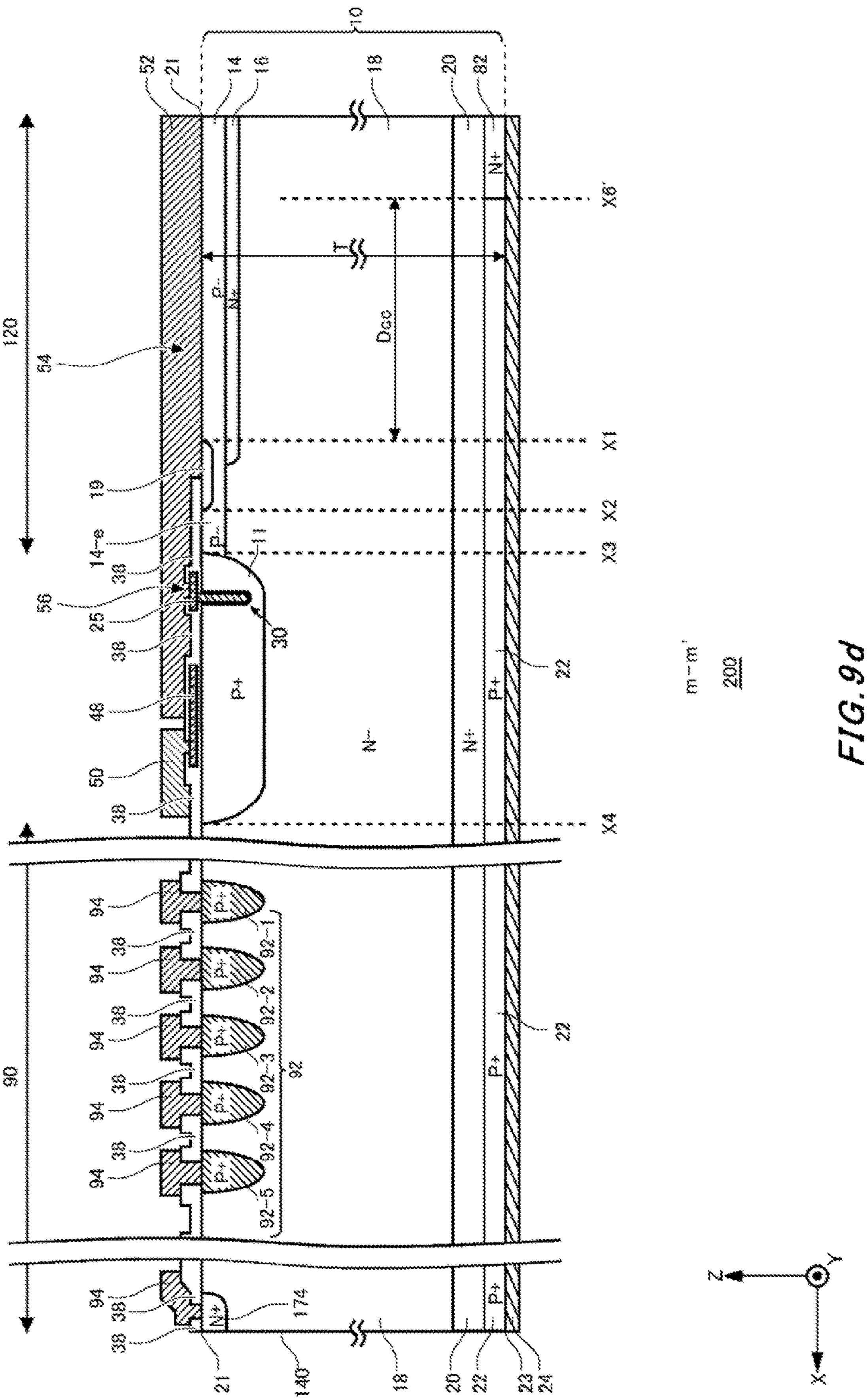
FIG. 9*d* is a figure showing an exemplary cross-section taken along m-m' in FIG. 9*b*.

FIG. 9*d* is a figure showing an exemplary cross-section taken along m-m' in FIG. 9*b*. The configuration of the m-m' cross-section in the semiconductor device 200 in the present example is different from the configuration of the d-d' cross-section shown in FIG. 5*d* in that the end portion X6' portion is provided closer to the middle of the active portion 120 than the end portion X6 shown in FIG. 5*d* is, that is, provided apart from the edge termination structure portion 90. In addition, the configuration of the m-m' cross-section in the semiconductor device 200 in the present example is different from the configuration of the d-d' cross-section shown in FIG. 5*d* in that a lifetime control region 72 and a first floating region 17 are not provided.

The distance Dcc is a distance in the X-axis direction between the end portion X1, in the X-axis direction and on the active portion 120's middle side, of the second contact region 19 and the end portion X6', in the X-axis direction and on the peripheral end 140 side, of the second cathode region 82. The distance Dcc may be longer than the thickness T of the semiconductor substrate 10. By making the distance Dcc longer than the thickness T, injection of carriers (holes in the present example) from the second contact region 19 to the second cathode region 82 can be suppressed. Because of this, the reverse recovery withstand capability of the diode portion 80 can be improved.

The distance Dcc may be 100 μm or longer. In order to suppress injection of carriers from the second contact region 19 to the second cathode region 82, the distance Dcc is preferably 200 μm or longer, and is more preferably 300 μm or longer.

Figure 9E:
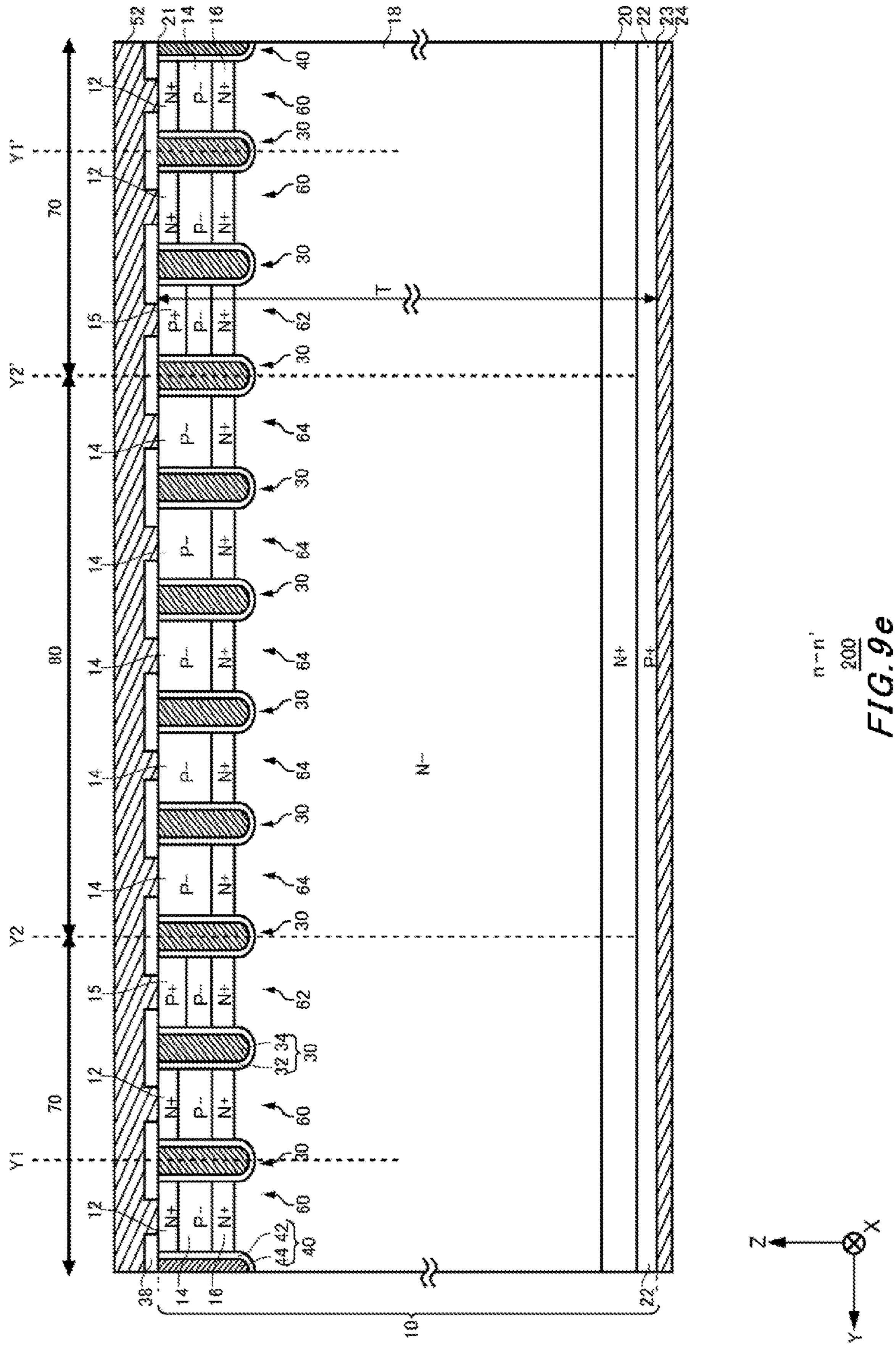
FIG. 9*e* is a figure showing an exemplary cross-section taken along n-n' in FIG. 9*c*.

FIG. 9*e* is a figure showing an exemplary cross-section taken along n-n' in FIG. 9*c*. The n-n' cross-section is a Y-Z cross-section from a transistor portion 70 contacting the diode portion 80 on the Y-axis direction positive side to a transistor portion 70 contacting the diode portion 80 on the Y-axis direction negative side. Note that the n-n' cross-section is a cross-section at the same position in the X-axis direction as the position of the e-e' cross-section in the example shown in FIG. 5*e*.

The configuration of the n-n' cross-section in the semiconductor device 200 in the present example is different from the configuration of the e-e' cross-section in the example shown in FIG. 5*e* in that the lower surface 23 is provided not with a second cathode region 82, but with a collector region 22 in the example shown in FIG. 5*e*. At the lower surface 23 in the n-n' cross-section, the collector region 22 is continuous in the Y-axis direction.

The semiconductor device 200 in the present example is not provided with a lifetime control region 72 on the upper surface 21 side of the semiconductor substrate 10. Because of this, leakage current at transistor portions 70 can be more suppressed than in the semiconductor device 200 shown in FIG. 5*e*.

Figure 10A:
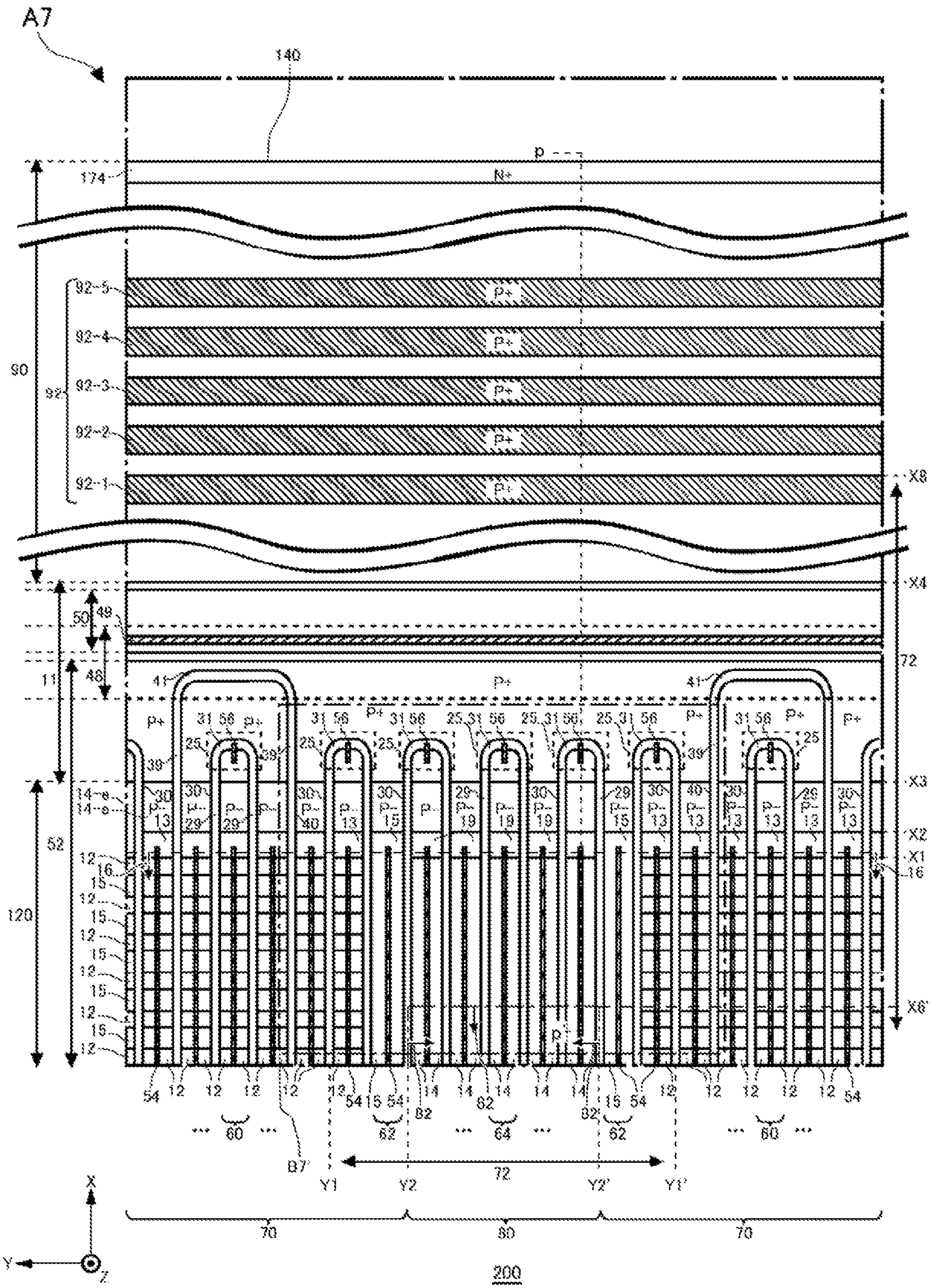
FIG. 10*a* is an enlarged view related to another exemplary region A7 in FIG. 9*a*.

FIG. 10*a* is an enlarged view related to another exemplary region A7 in FIG. 9*a*. The semiconductor device 200 in the present example is different from the semiconductor device 200 shown in FIG. 9*b* in that, as shown in FIG. 10*a*, the lifetime control region 72 is provided. In the top view in FIG. 10*a*, the position of the lifetime control region 72 in the Y-axis direction is the same as the position shown in the top view in FIG. 5*b*. The position of the lifetime control region 72 in the X-axis direction is different from that in the semiconductor device 200 shown in FIG. 5*b* in that it covers the X-axis direction negative side past the end portion X6' of the second cathode region 82, that is, covers the X-axis direction negative side past the position shown in the top view in FIG. 5*b*.

Figure 10B:
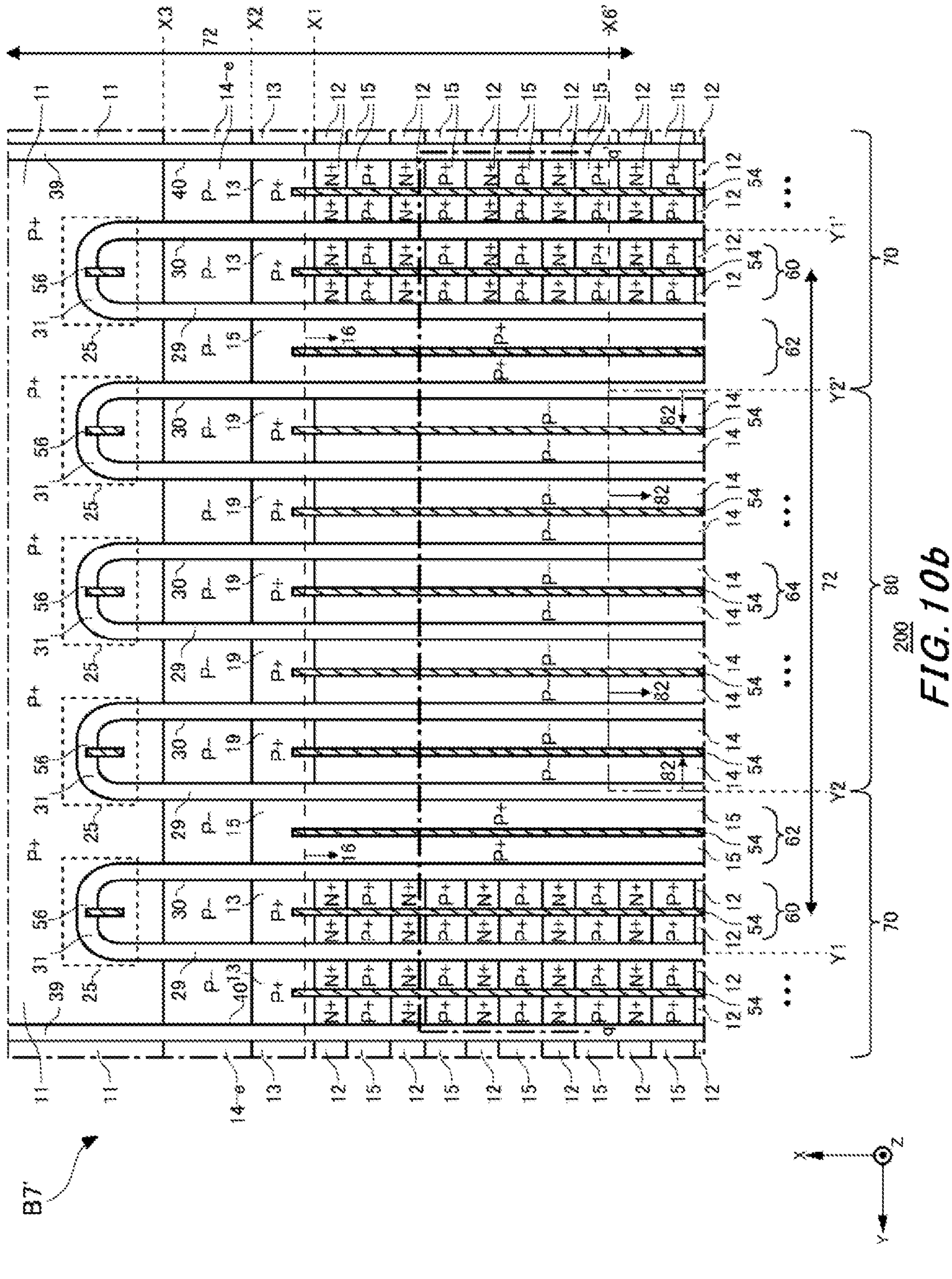
FIG. 10*b* is an enlarged view of a region B7' in FIG. 10*a*.

FIG. 10*b* is an enlarged view of a region B7' in FIG. 10*a*. In FIG. 10*b*, the lifetime control region 72 is provided to reach the X-axis direction negative side past the end portion X6'.

Figure 10C:
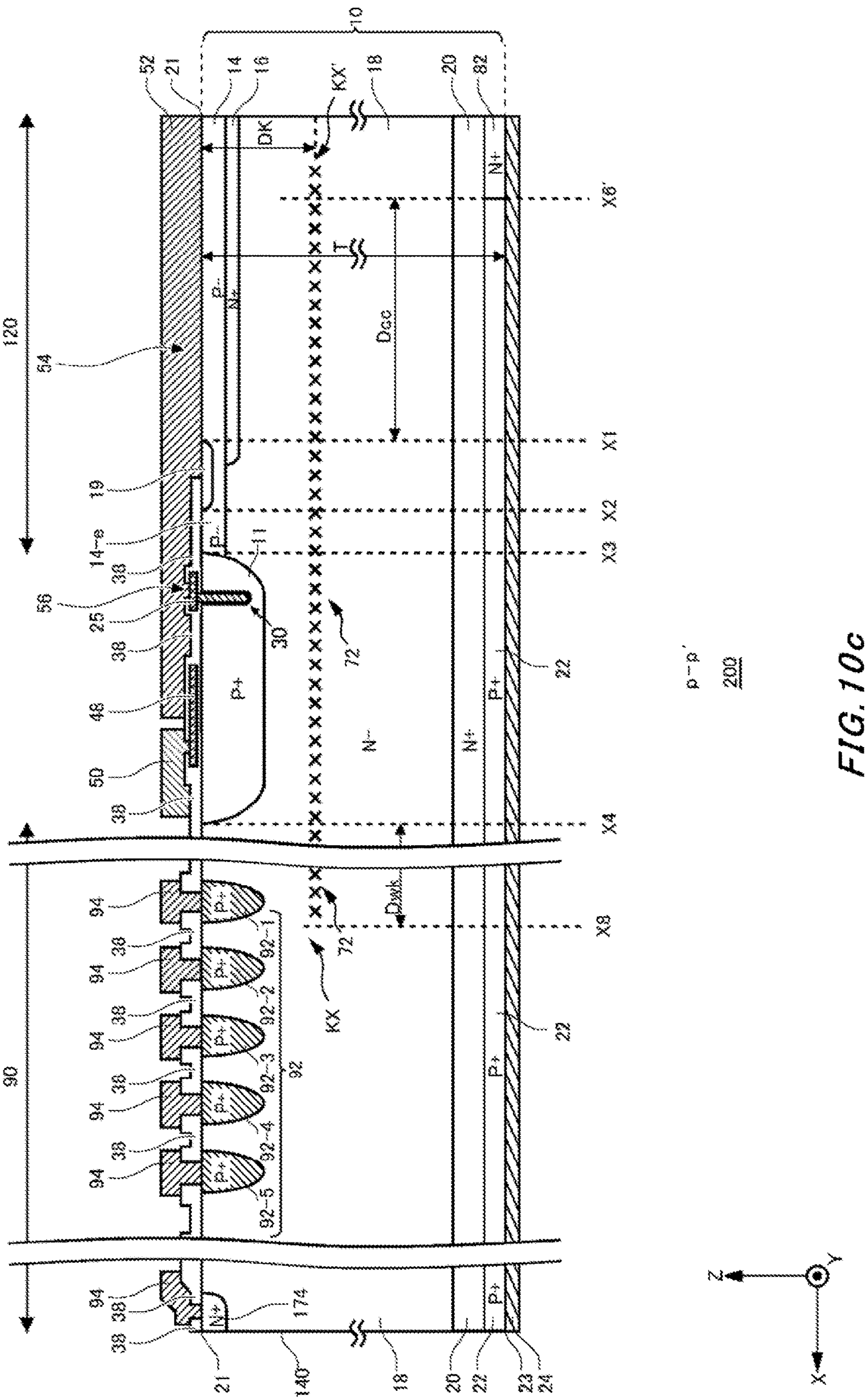
FIG. 10*c* is a figure showing an exemplary cross-section taken along p-p' in FIG. 10*a*.

FIG. 10*c* is a figure showing an exemplary cross-section taken along p-p' in FIG. 10*a*. The configuration of the p-p' cross-section in the semiconductor device 200 shown in FIG. 10*c* is different from the configuration of the m-m' cross-section in the semiconductor device 200 shown in FIG. 9*d* in that the lifetime control region 72 is provided on the upper surface 21 side.

In the present example, the end portion KX' of the lifetime control region 72 on the X-axis direction negative side is provided on the X-axis direction negative side relative to the end portion X6' of the second cathode region 82 on the X-axis direction positive side. That is, in the present example, part of the lifetime control region 72 and part of the second cathode region 82 overlap in the top view of the semiconductor substrate 10.

The semiconductor device 200 in the present example is provided with the lifetime control region 72 on the upper surface 21 side and, in the X-axis direction, between the end portion X1 of the second contact region 19 on the active portion 120's middle side and the end portion X6' of the second cathode region 82 on the peripheral end 140 side. Because of this, carriers (holes in the present example) that move from the second contact region 19 to the second cathode region 82 are easily cancelled out with electrons in the lifetime control region 72, and it is difficult for the carriers to reach the second cathode region 82. Because of this, the reverse recovery withstand capability of the diode portion 80 can be more improved than in the semiconductor device 200 shown in FIG. 9*d*.

Figure 10D:
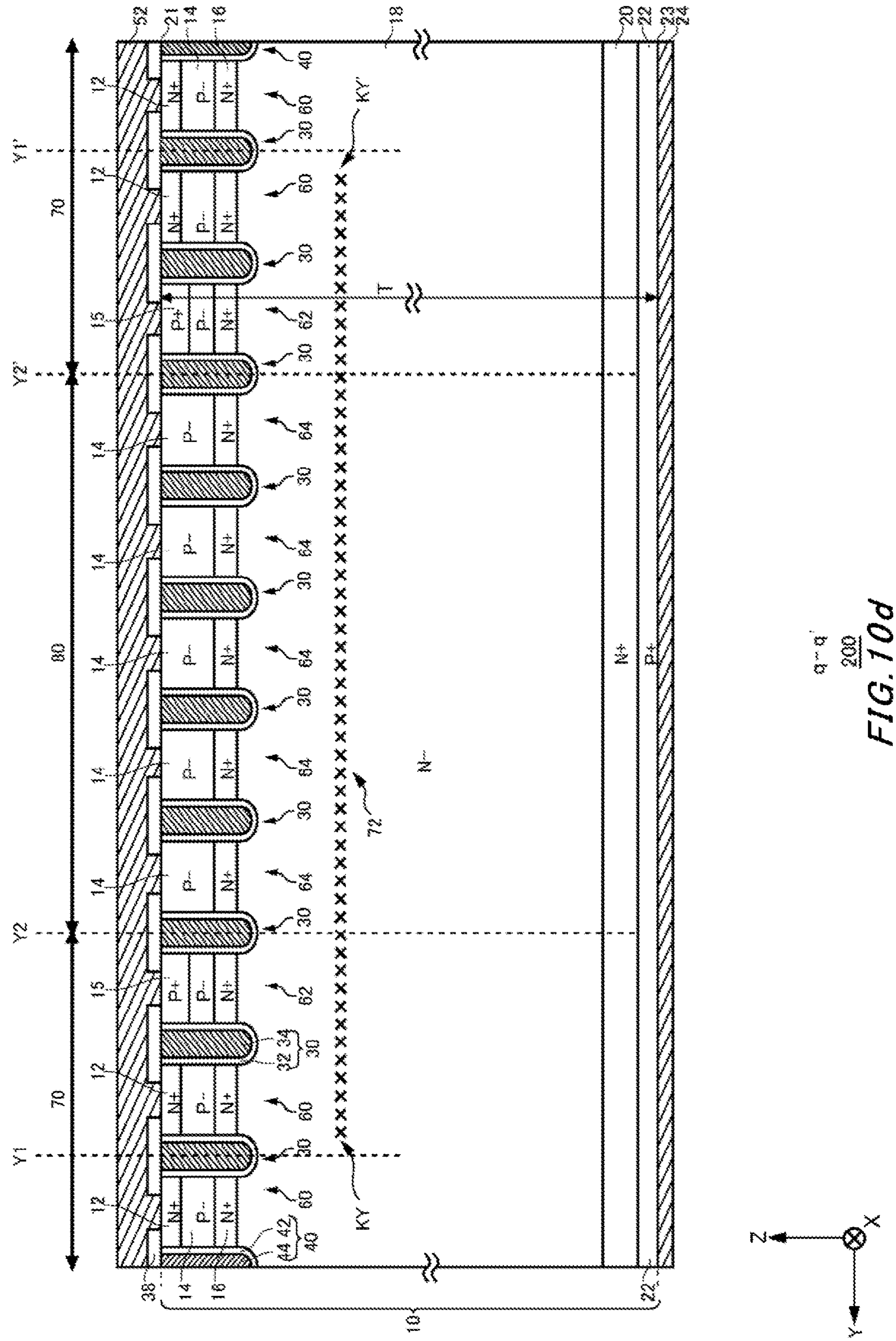
FIG. 10*d* is a figure showing an exemplary cross-section taken along q-q' in FIG. 10*b*.

FIG. 10*d* is a figure showing an exemplary cross-section taken along q-q' in FIG. 10*b*. The configuration of the q-q' cross-section in the semiconductor device 200 in the present example is different from the configuration of the n-n' cross-section in the semiconductor device 200 shown in FIG. 9*e* in that the lifetime control region 72 is provided on the upper surface 21 side.

In the semiconductor device 200 in the present example, as shown in FIG. 10*d*, a lifetime control region 72 is not provided below gate trench portions 40 in transistor portions 70. Because of this, leakage current at the transistor portions 70 can be suppressed.

Figure 11A:
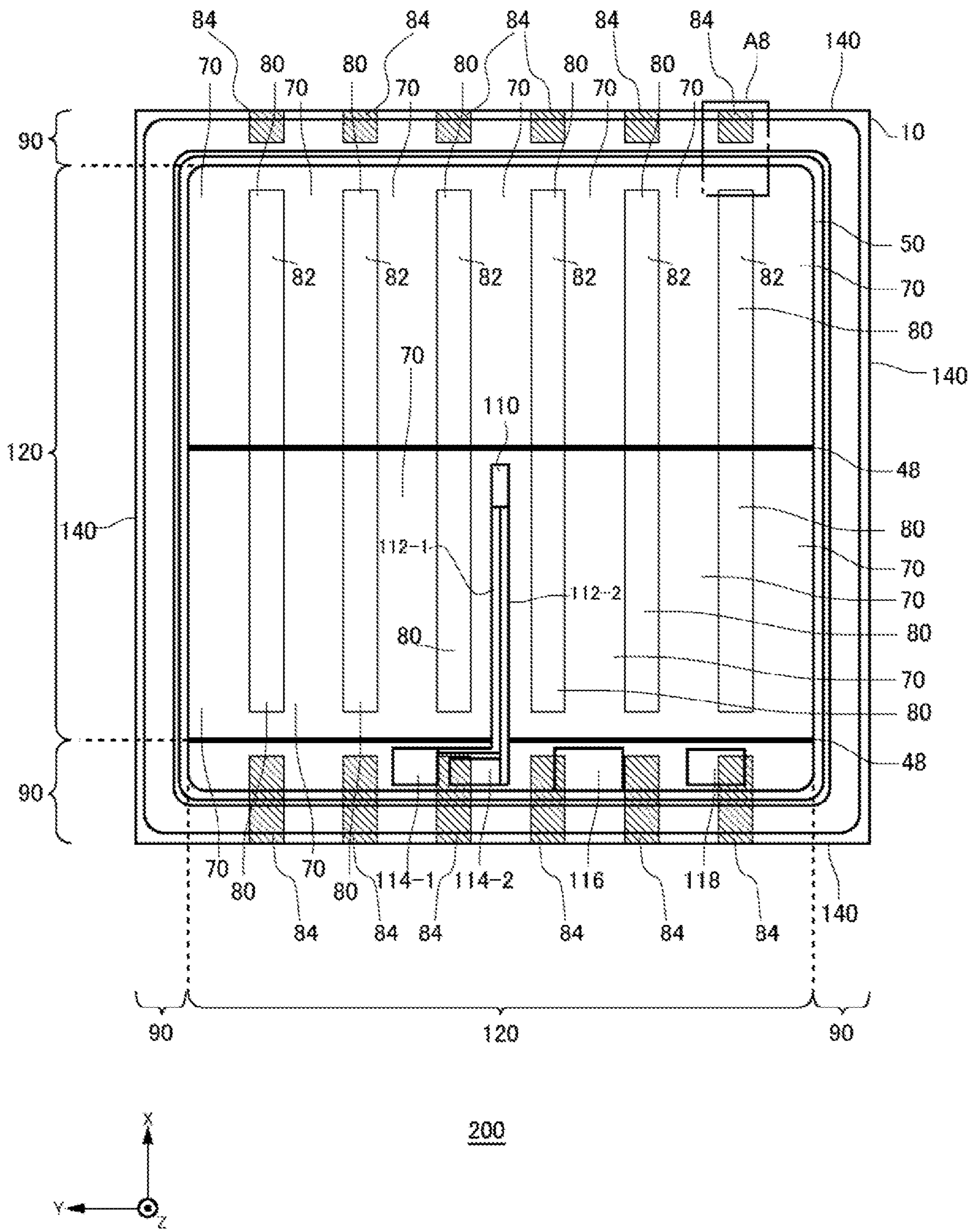
FIG. 11*a* is a figure showing another exemplary upper surface of the semiconductor device 200 according to the present embodiment.

FIG. 11*a* is a figure showing another exemplary upper surface of the semiconductor device 200 according to the present embodiment. The semiconductor device 200 in the present example is different from the semiconductor device 200 shown in FIG. 9*a* in that first-conductivity type termination regions 84 are provided in the edge termination structure portion 90. In FIG. 11*a*, regions provided with the termination regions 84 are indicated by shaded portions.

The termination regions 84 are provided on imaginarily extended lines of the diode portions 80 in the X-axis direction. The widths of the termination regions 84 in the Y-axis direction may be equal to the widths of the diode portions 80 in the Y-axis direction.

The termination regions 84 in the present example are of N+ type, for example. The doping concentration of the termination regions 84 may be the same as the doping concentration of the second cathode region 82. In addition, the doping concentration of the termination regions 84 may be the same also as the doping concentration of the first cathode region 83.

Figure 11B:
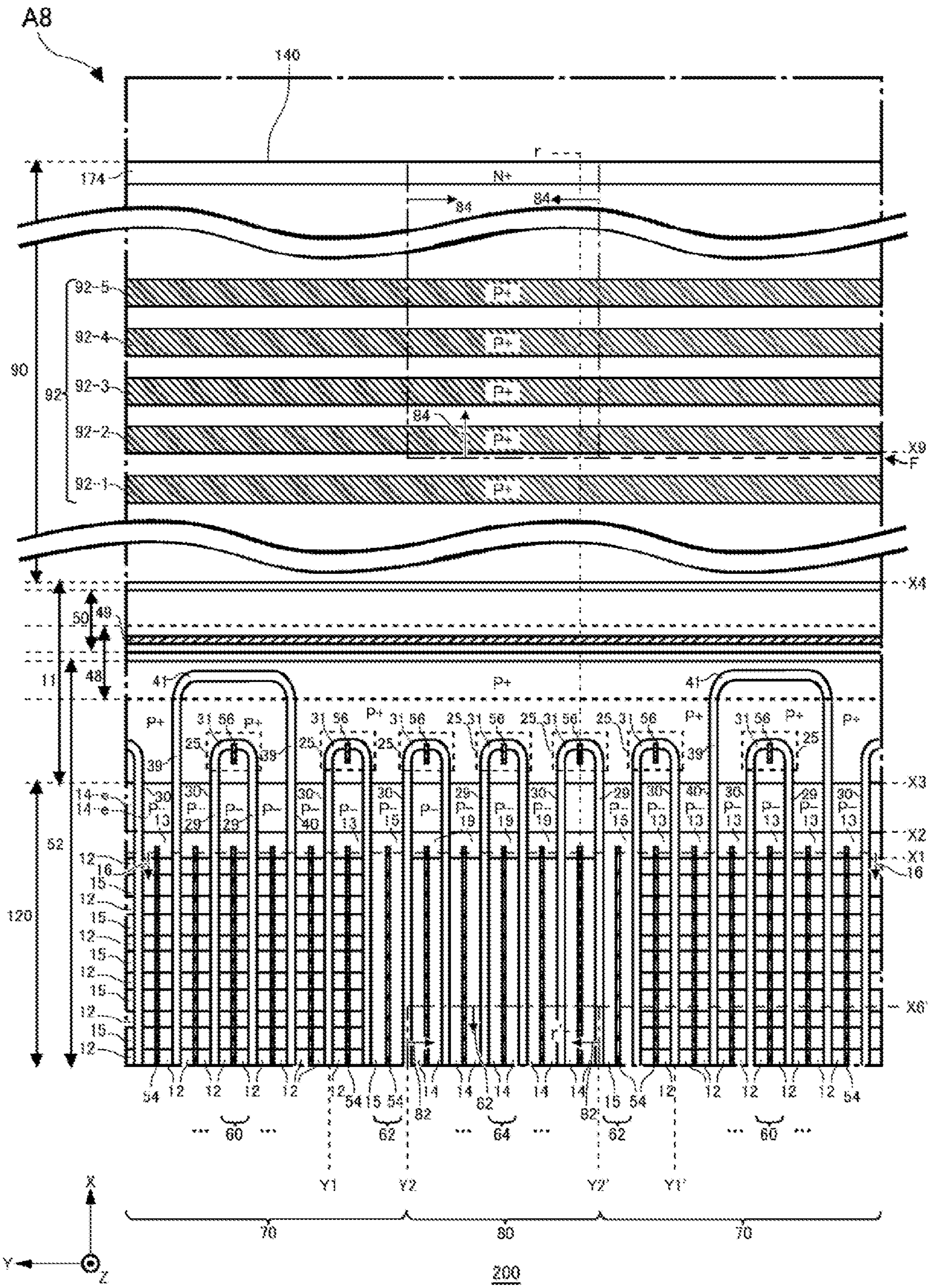
FIG. 11*b* is an enlarged view of a region A8 in FIG. 11*a*.

FIG. 11*b* is an enlarged view of a region A8 in FIG. 11*a*. The end portion F is an end portion of a termination region 84 on the X-axis direction negative side. The end portion F may be arranged closer to the peripheral end 140 than the end portion X4 of the well region 11 on the X-axis direction positive side is, that is, than an end portion of the edge termination structure portion 90 on the X-axis direction negative side is. In the example shown in FIG. 11*b*, the end portion F is arranged to match the end portion X9 of the guard ring 92-2 on the X-axis direction negative side.

Figure 11C:
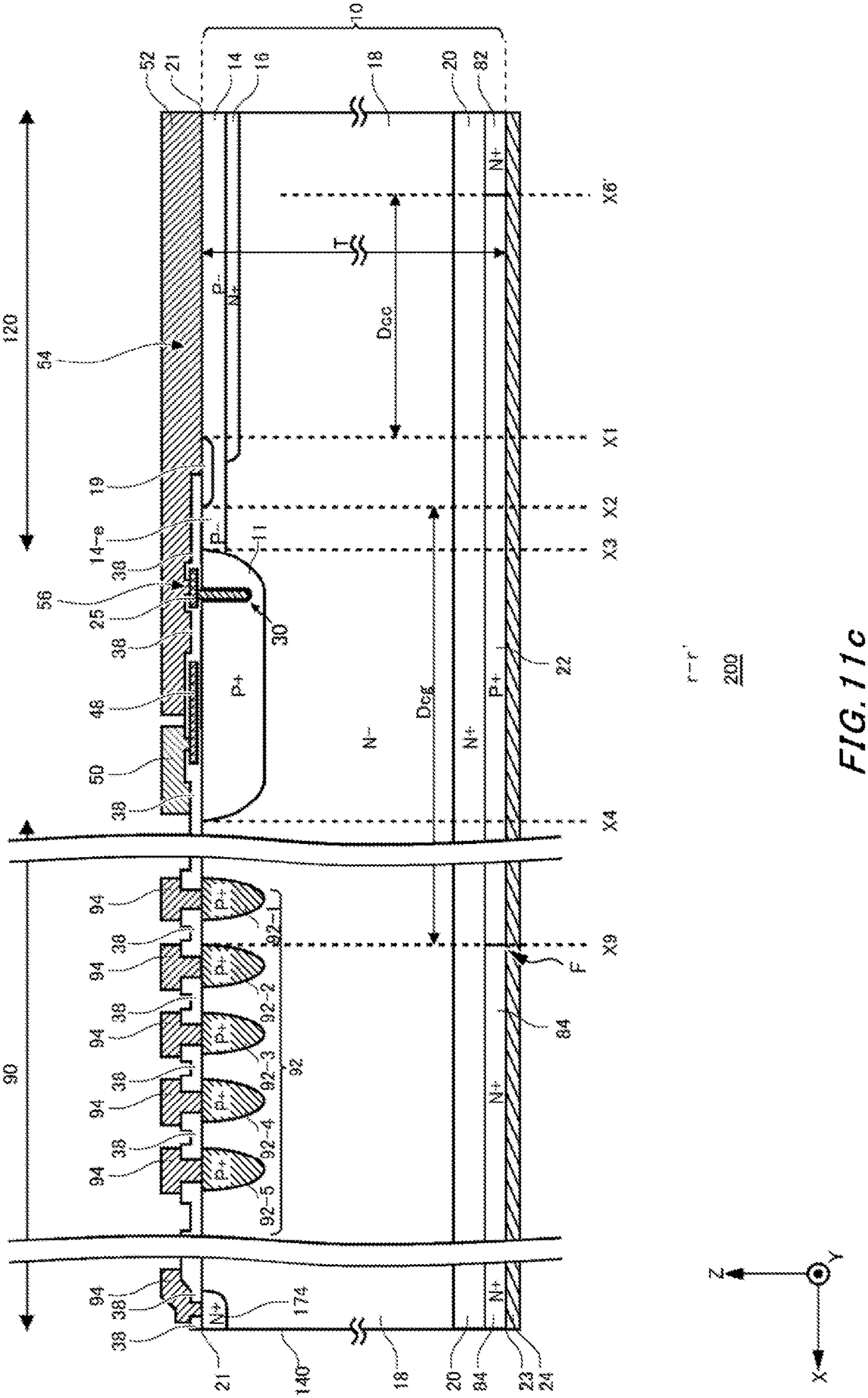
FIG. 11*c* is a figure showing an exemplary cross-section taken along r-r' in FIG. 11*b*.

FIG. 11*c* is a figure showing an exemplary cross-section taken along r-r' in FIG. 11*b*. The configuration of the r-r' cross-section in the semiconductor device 200 in the present example is different from the configuration of the m-m' cross-section in the semiconductor device 200 shown in FIG. 9*d* in that a termination region 84 in the edge termination structure portion 90 is provided.

The termination region 84 is provided closer to the peripheral end 140 than the collector region 22 is in the top view of the semiconductor substrate 10, and in contact with the lower surface 23. In the present example, the end portion F of the termination region 84 on the X-axis direction negative side is provided to match the end portion X9 of the guard ring 92-2 on the X-axis direction negative side. In the X-axis direction, the position of an end portion of the termination region 84 on the X-axis direction positive side may match the peripheral end 140. On the X-axis direction negative side of the termination region 84, a collector region 22 may be provided in contact with the termination region 84. The collector region 22 may be sandwiched by the second cathode region 82 and the termination region 84 in the X-axis direction.

The distance Dcg is a distance in the X-axis direction between the end portion X2, in the X-axis direction and on the peripheral end 140 side, of the second contact region 19 and the end portion F, in the X-axis direction and on the active portion 120 side, of the termination region 84, in the top view of the semiconductor substrate 10. The distance Dcg may be longer than the thickness T of the semiconductor substrate 10. By making the distance Dcg longer than the thickness T, injection of carriers (holes in the present example) from the second contact region 19 to the termination region 84 can be suppressed. Because of this, the reverse recovery withstand capability of the diode portion 80 can be improved.

The distance Dcg may be longer than the distance Dcc. By making the distance Dcg equal to or longer than the distance Dcc, injection of carriers (holes in the present example) from the second contact region 19 to the termination region 84 can be suppressed further. Because of this, the reverse recovery withstand capability of the diode portion 80 can be improved further.

The distance Dcg may be 100 μm or longer. In order to suppress injection of carriers from the second contact region 19 to the termination region 84, the distance Dcg is preferably 200 μm or longer, and is more preferably 300 μm or longer.

Furthermore, since, in the semiconductor device 200 in the present example, the first-conductivity type (N+ type) termination region 84 is provided on the peripheral end 140 side of the lower surface 23 in the diode portion 80, injection of carriers (holes in the present example) from the peripheral end 140 side of the diode portion 80 to the transistor portion 70 can be suppressed at the time of operation of transistor portions 70 contacting the diode portion 80 in the Y-axis direction. Because of this, the trade-off between the ON voltage and turn-off loss of the transistor portions 70 can be made favorable.

Figure 12A:
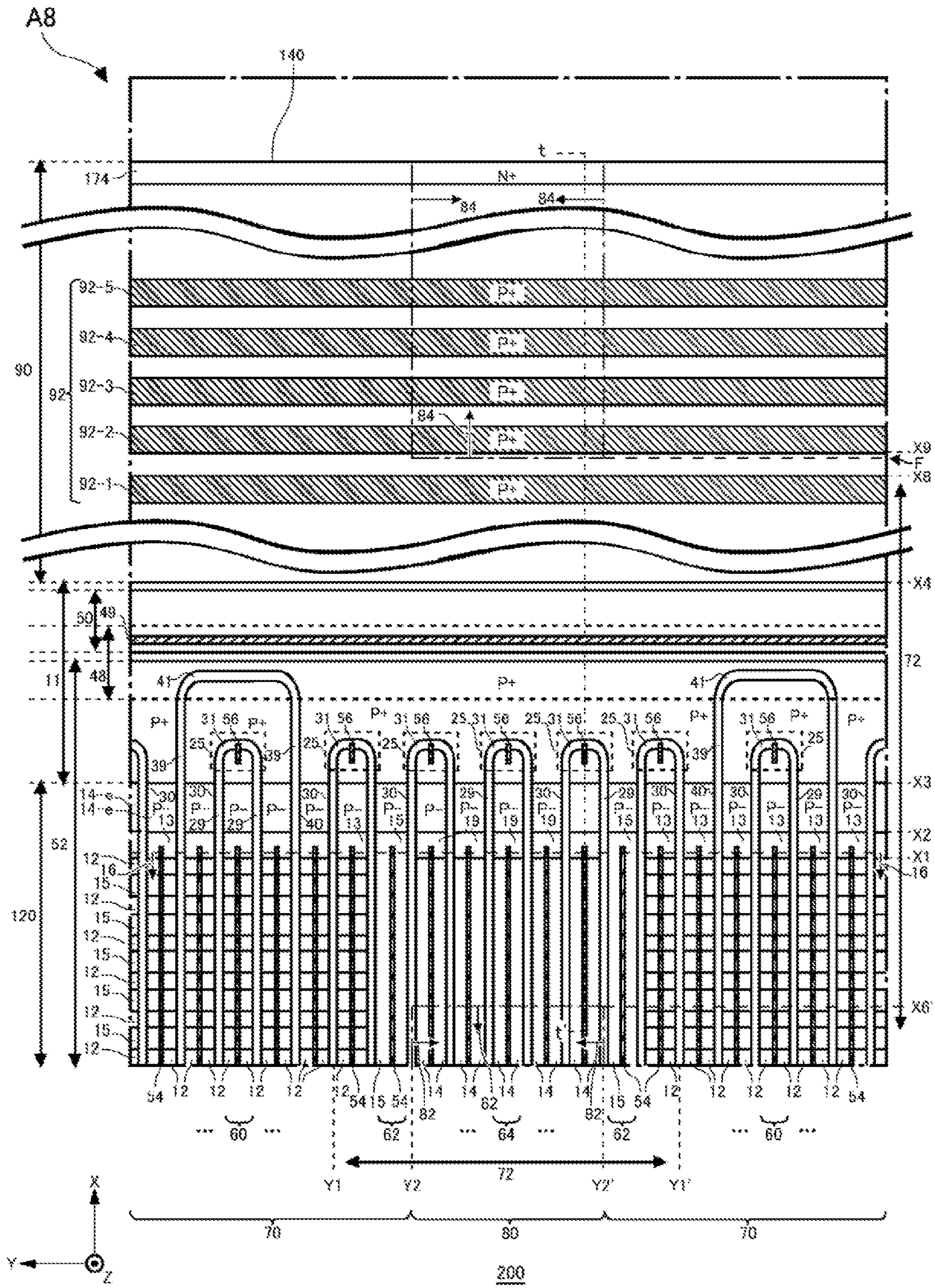
FIG. 12*a* is an enlarged view related to another exemplary region A8 in FIG. 11*a*.

FIG. 12*a* is an enlarged view related to another exemplary region A8 in FIG. 11*a*. The semiconductor device 200 in the present example is different from the semiconductor device 200 shown in FIG. 11*b* in that, as shown in FIG. 12*a*, the lifetime control region 72 is provided. In the top view in FIG. 12*a*, the position of the lifetime control region 72 in the Y-axis direction is the same as the position shown in the top view in FIG. 11*b*. The position of the lifetime control region 72 in the X-axis direction is different from that in the semiconductor device 200 shown in FIG. 11*b* in that it covers the X-axis direction negative side past the end portion X6' of the second cathode region 82, that is, covers the X-axis direction negative side past the position shown in the top view in FIG. 11*b*.

Figure 12B:
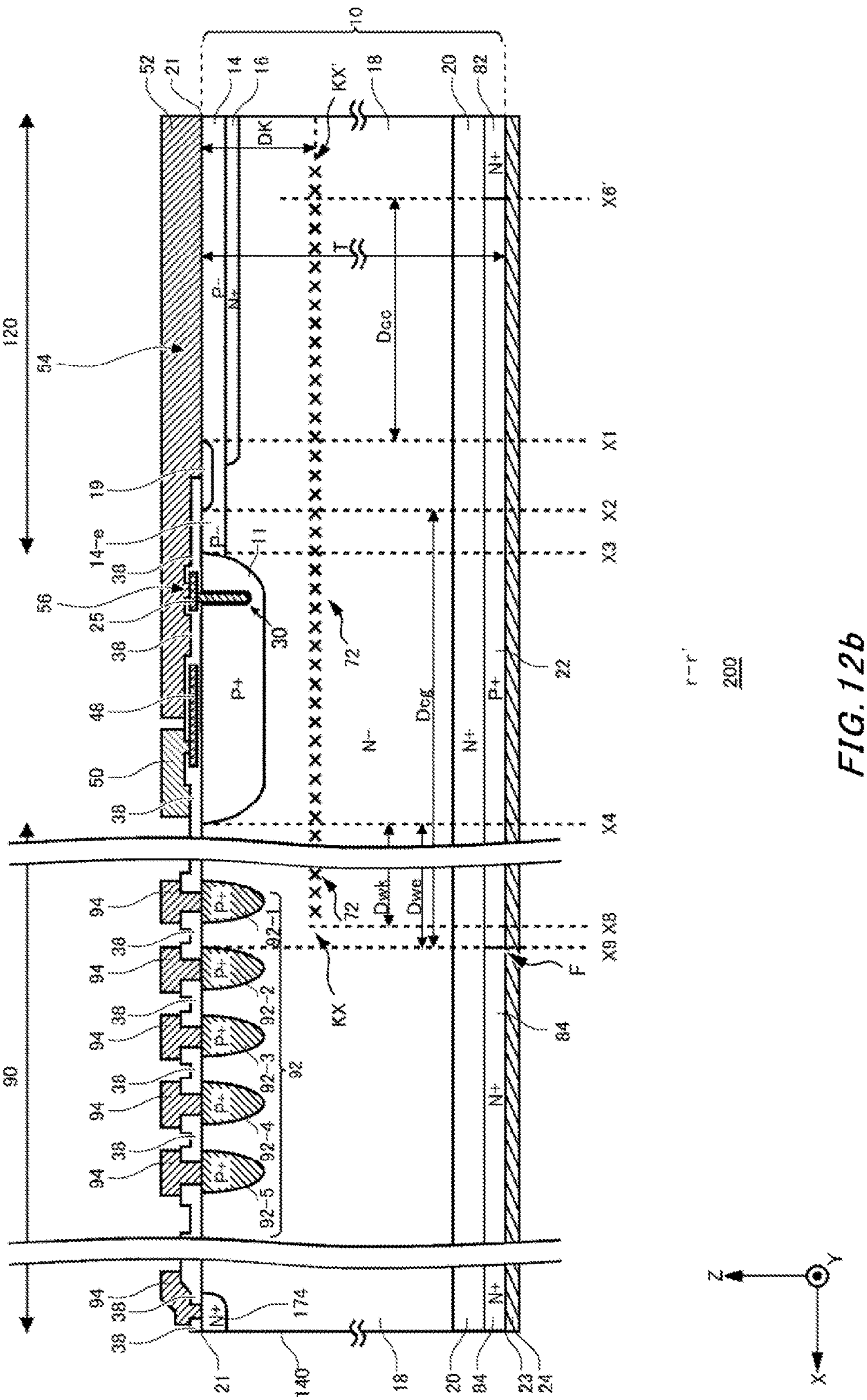
FIG. 12*b* is a figure showing an exemplary cross-section taken along t-t' in FIG. 12*a*.

FIG. 12*b* is a figure showing an exemplary cross-section taken along t-t' in FIG. 12*a*. The configuration of the t-t' cross-section in the semiconductor device 200 shown in FIG. 12*b* is different from the configuration of the r-r' cross-section in the semiconductor device 200 shown in FIG. 11*c* in that the lifetime control region 72 is provided on the upper surface 21 side.

In the present example, the position X8 of the end portion KX of the lifetime control region 72 on the X-axis direction positive side is arranged, in the X-axis direction, between the end portion X4 of the well region 11 on the X-axis direction positive side and the end portion F of the termination region 84. That is, in the present example, the distance Dwk in the X-axis direction between the end portion X4 and the end portion KX is shorter than the distance Dwe in the X-axis direction between the end portion X4 and the end portion F.

The semiconductor device 200 in the present example is provided with the lifetime control region 72 on the upper surface 21 side and, in the X-axis direction, between the end portion X4 of the well region 11 on the peripheral end 140 side and the end portion F of the termination region 84 on the active portion 120 side. Because of this, carriers (holes in the present example) that move from the well region 11 to the termination region 84 are easily cancelled out with electrons in the lifetime control region 72, and it is difficult for the carriers to reach the termination region 84. Because of this, the reverse recovery withstand capability of the diode portion 80 can be more improved than in the semiconductor device 200 shown in FIG. 11*c*.

Figure 13A:
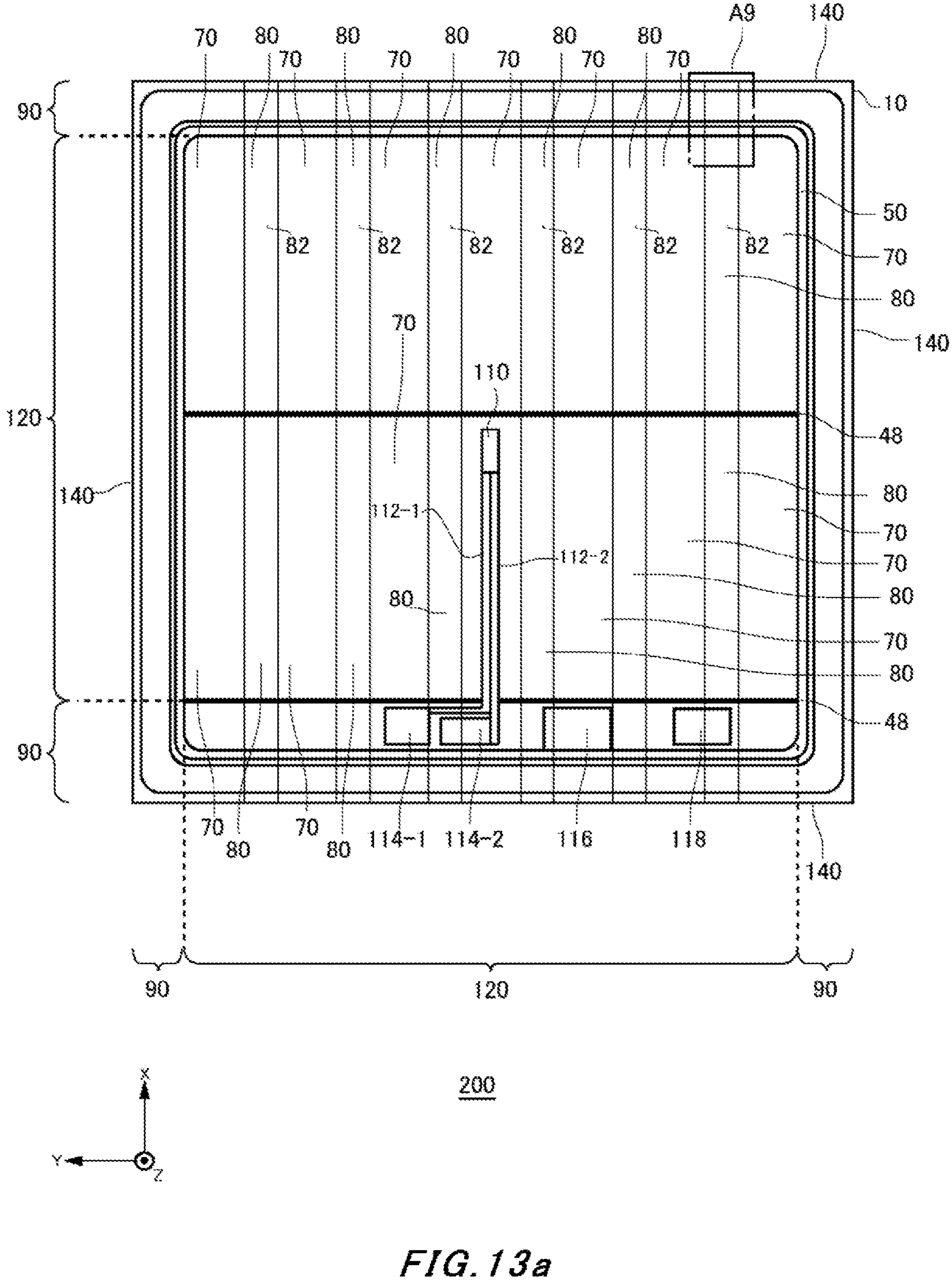
FIG. 13*a* is a figure showing another exemplary upper surface of the semiconductor device 200 according to the present embodiment.

FIG. 13*a* is a figure showing another exemplary upper surface of the semiconductor device 200 according to the present embodiment. The semiconductor device 200 in the present example is different from the semiconductor device 200 shown in FIG. 5*a* in that ends of the second cathode region 82 on the X-axis direction positive side and negative side are arranged in the peripheral end 140. In addition, as described below in explanations with reference to FIG. 13*b* to FIG. 13*d*, it is different from the semiconductor device 200 shown in FIG. 5*a* in the position of the first floating region 17 in the x-axis direction and in that a lifetime control region 72 is not provided.

Figure 13B:
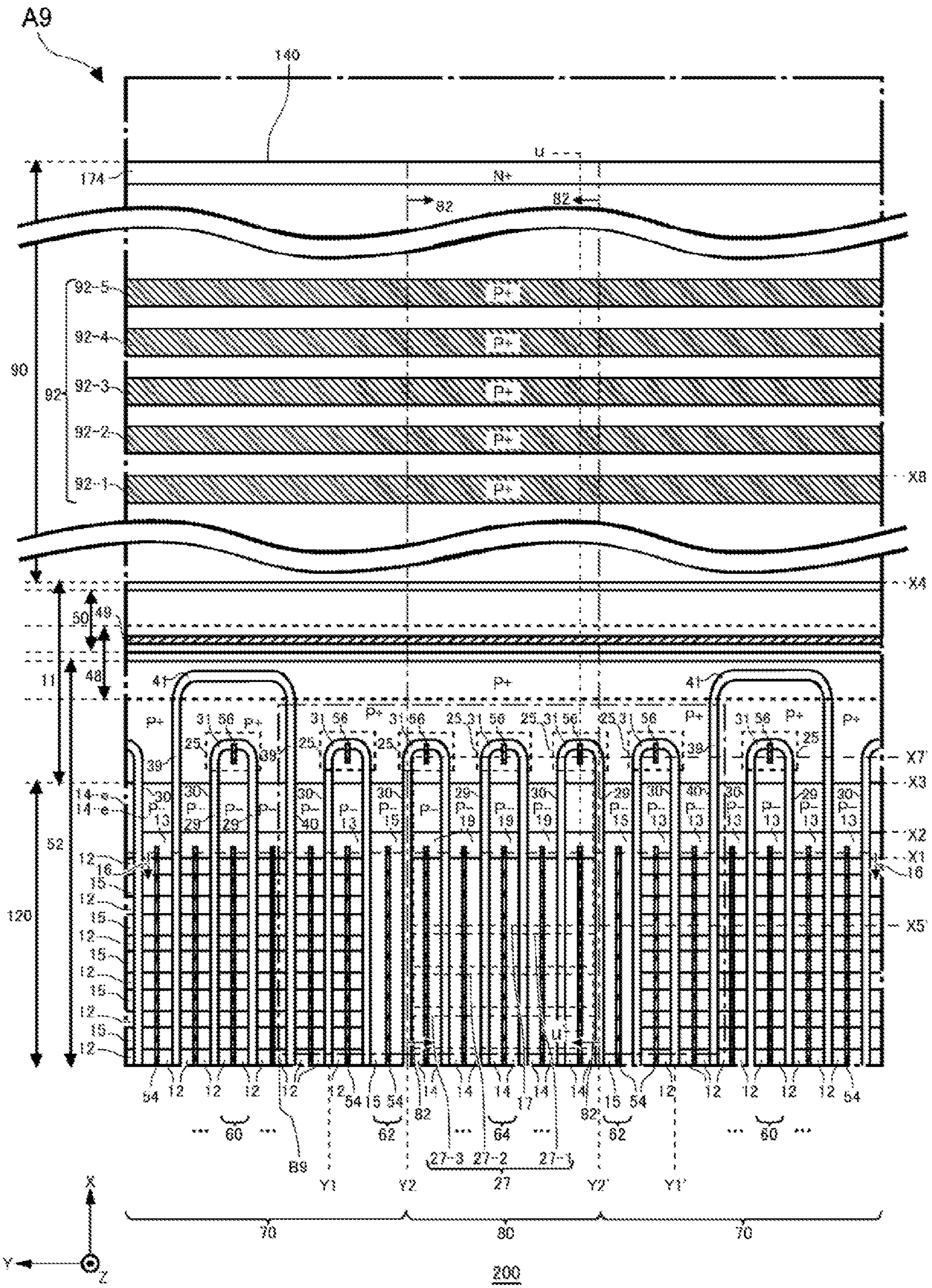
FIG. 13*b* is an enlarged view of a region A9 in FIG. 13*a*.

FIG. 13*b* is an enlarged view of a region A9 in FIG. 13*a*. As shown in FIG. 13*b*, in the semiconductor device 200 in the present example, the second cathode region 82 is continuous from the active portion 120 side of the diode portion 80 to the peripheral end 140.

In the semiconductor device 200 in the present example, the first floating region 17 is provided in a range in the X-axis direction from the active portion 120 to the well region 11 on the lower surface 23 side, in the top view in FIG. 13*b*. The end portion X5' is an end portion of the first floating region 17 on the X-axis direction negative side. The end portion X7' is an end portion of the first floating region 17 on the X-axis direction positive side.

In the semiconductor device 200 in the present example, second-conductivity type second floating regions 27 are provided closer to the middle of the active portion 120 than the first floating region 17 is, in the top view of the FIG. 13*b*. The second floating regions 27 are provided on the lower surface 23 side. A plurality of second floating regions 27 may be provided in the X-axis direction. Although, in FIG. 13*b*, three second floating regions 27, a second floating region 27-1, a second floating region 27-2 and a second floating region 27-3, are provided, second floating regions 27 may be further provided outside the region A9 and closer to the middle of the active portion 120.

The second floating regions 27 in the present example are of P+ type, for example. The doping concentration of the second floating regions 27 may be the same as the doping concentration of the first floating region 17.

Figure 13C:
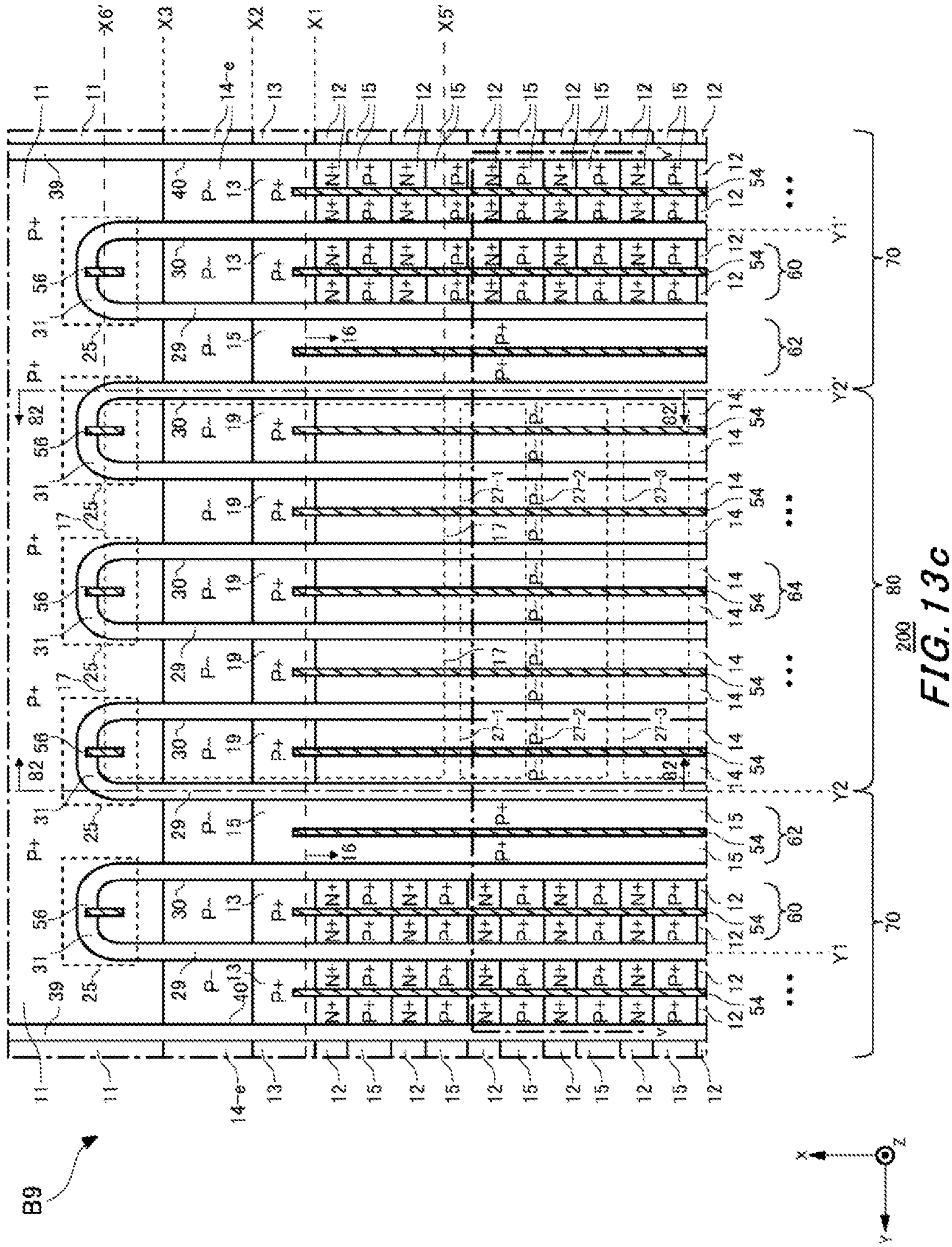
FIG. 13*c* is an enlarged view of a region B9 in FIG. 13*b*.

FIG. 13*c* is an enlarged view of a region B9 in FIG. 13*b*. As shown in FIG. 13*c*, in the region B9, the second cathode region 82 is provided in a range from the active portion 120 side to the well region 11.

In the semiconductor device 200 in the present example, as shown in FIG. 13*c*, the first floating region 17 and second floating regions 27 are provided on the inner side of the second cathode region 82 in the Y-axis direction. The first floating region 17 is provided to overlap the second contact region 19 in the top view in FIG. 13*c*. The first floating region 17 in the present example is provided to overlap, in the X-axis direction, a region extending from part of the base region 14 to part of the well region 11.

On the X-axis direction negative side of the first floating region 17, the second floating regions 27 are provided. A plurality of second floating regions 27 may be provided. In the region B9, for example, three second floating regions 27, the second floating region 27-1, second floating region 27-2, and second floating region 27-3, are provided.

Figure 13D:
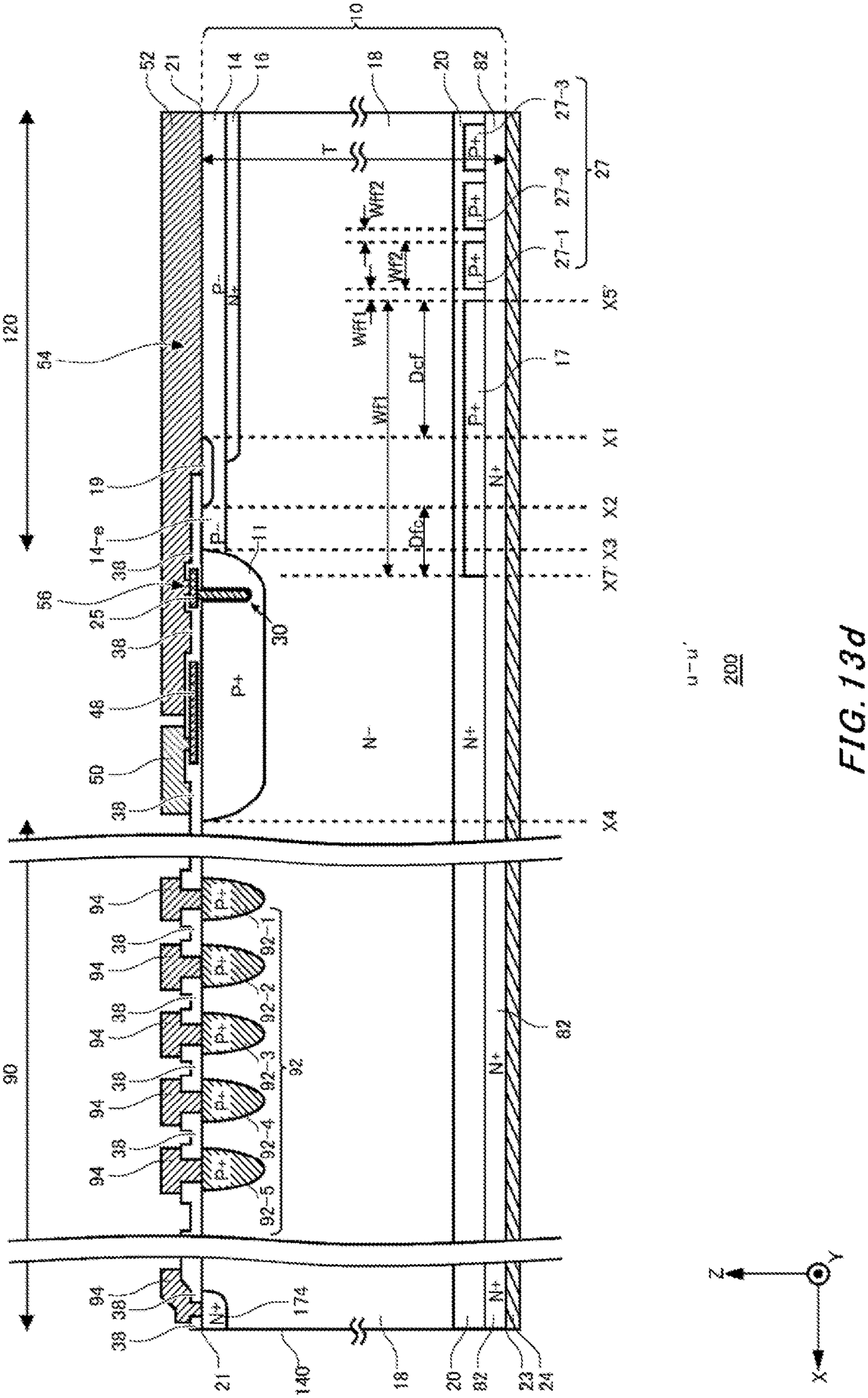
FIG. 13*d* is a figure showing an exemplary cross-section taken along u-u' in FIG. 13*b*.

FIG. 13*d* is a figure showing an exemplary cross-section taken along u-u' in FIG. 13*b*. The u-u' cross-section is an X-Z plane that passes through the channel stopper 174, the guard rings 92, the well region 11, a dummy trench portion 30, a base region 14-*e*, a second contact region 19 and a base region 14. In addition, the u-u' cross-section is an X-Z plane that passes through a contact hole 54 and a contact hole 56 above the upper surface 21.

The semiconductor device 200 in the present example is provided with the first floating region 17 and second floating regions 27 on the lower surface 23 side. The first floating region 17 and the second floating regions 27 may be arrayed in the X-axis direction. At least part of the first floating region 17 and the second contact region 19 may be provided to overlap in the X-axis direction.

The distance Dcf is a distance in the X-axis direction between the end portion X5', in the X-axis direction and on the active portion 120's middle side, of the first floating region 17 and the end portion X1, in the X-axis direction and on the active portion 120's middle side, of the second contact region 19. In addition, the distance Dfc is a distance in the X-axis direction between the end portion X7', in the X-axis direction and on the peripheral end 140 side, of the first floating region 17 and the end portion X2, in the X-axis direction and on the peripheral end 140 side, of the second contact region 19.

The distance Dcf may be longer than the distance Dfc. By making the distance Dcf longer than the distance Dfc, injection of carriers (electrons in the present example) from the second cathode region 82 to the second contact region 19 and well region 11 can be suppressed. Because of this, the reverse recovery withstand capability of the diode portion 80 can be improved.

The distance Dcf may be 50 μm to 150 μm inclusive. The distance Dcf is 100 μm, for example. The distance Dfc may be 20 μm to 80 μm inclusive. The distance Dfc is 50 μm, for example.

The second floating regions 27 may be provided closer to the middle of the active portion 120 than the first floating region 17 is. The second floating region 27 may be provided at approximately the same depth as the first floating region 17 in the Z-axis direction. A plurality of second floating regions 27 may be arrayed in the X-axis direction. A plurality of second floating regions 27 may be arrayed also on the X-axis direction negative side outside the u-u' cross-section.

Since, in the semiconductor device 200 in the present example, the first floating region 17 and second floating regions 27 are arrayed in the X-axis direction, injection of carriers (electrons in the present example) from the second cathode region 82 to the second contact region 19 and well region 11 can be more suppressed than in the case where second floating regions 27 are not provided. Because of this, the reverse recovery withstand capability of the diode portion 80 can be improved further.

The width Wf1 is a width of the first floating region 17 in the X-axis direction. The width Wf2 is a width of the second floating region 27-1 in the X-axis direction. The width Wf1 may be larger than the width Wf2. The width Wf1 may be 200% to 1000% inclusive of the width Wf2. By making the width Wf1 larger than the width Wf2, injection of carriers (electrons in the present example) from the second cathode region 82 to the second contact region 19 and well region 11 can be suppressed. Because of this, the reverse recovery withstand capability of the diode portion 80 can be improved.

The width Wff1 is an interval in the X-axis direction between the first floating region 17 and the second floating region 27-1. The width Wff2 is an interval in the X-axis direction between the second floating region 27-1 and the second floating region 27-2. A plurality of second floating regions 27 may be provided in the X-axis direction at intervals equal to the width Wff2. The width Wff1 and the width Wff1 may be the same, but may be different. The width Wff1 and width Wff2 may be 5% to 50% inclusive of the width Wf2.

Figure 13E:
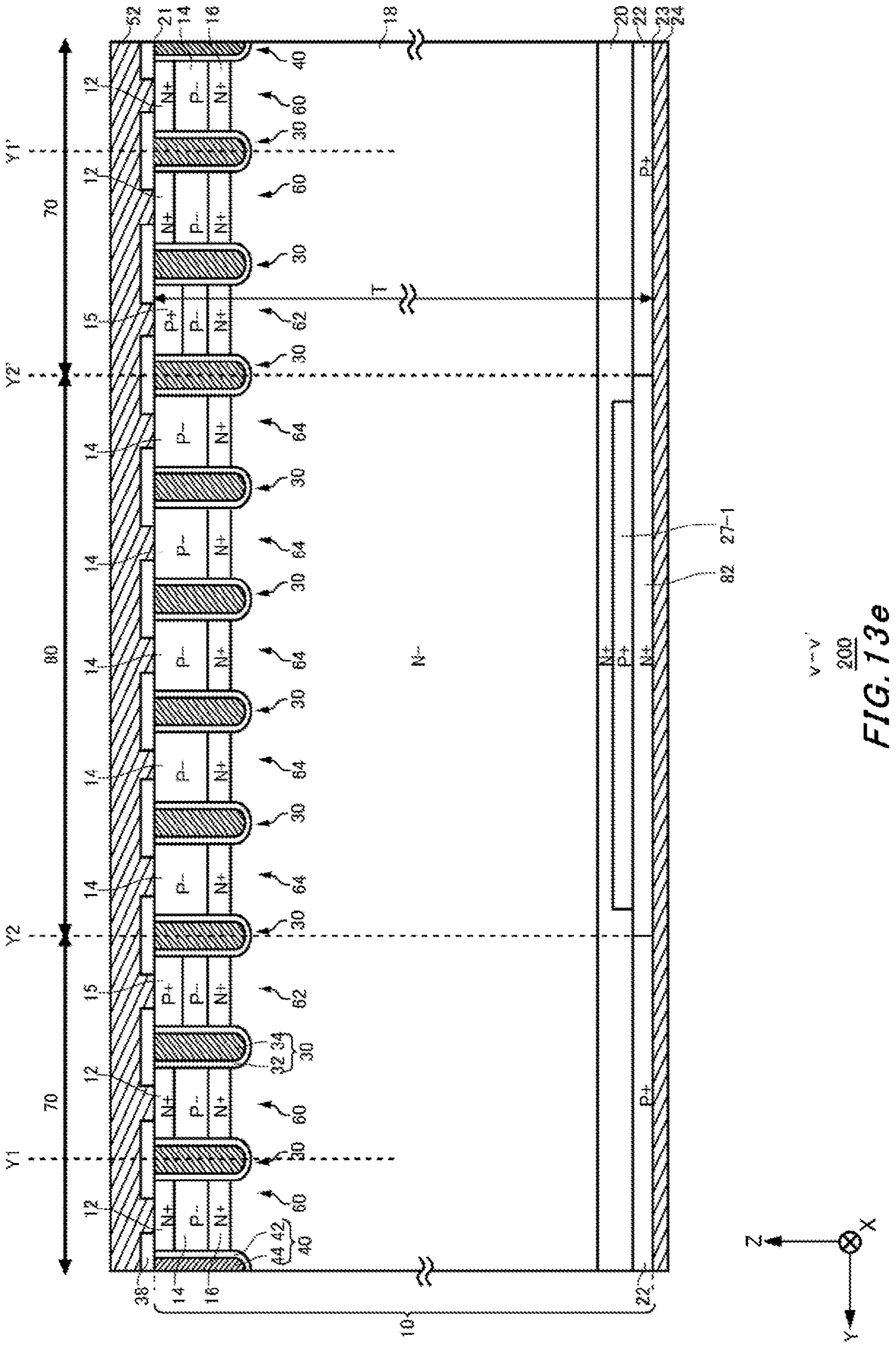
FIG. 13*e* is a figure showing an exemplary cross-section taken along v-v' in FIG. 13*c*.

FIG. 13*e* is a figure showing an exemplary cross-section taken along v-v' in FIG. 13*c*. The v-v' cross-section is a Y-Z cross-section from a transistor portion 70 contacting the diode portion 80 on the Y-axis direction positive side to a transistor portion 70 contacting the diode portion 80 on the Y-axis direction negative side. In addition, the v-v' cross-section is a Y-Z cross-section that passes through emitter regions 12, third contact regions 15 of second mesa portions, and base regions 14 of the diode portion 80.

The configuration of the v-v' cross-section in the semiconductor device 200 in the present example is different from the configuration of the j-j' cross-section shown in FIG. 7*d* in that a second floating region 27-1 is provided in place of the first floating region 17. The position of the second floating region 27-1 in the Y-axis direction may be approximately the same as the position of the first floating region 17 in the Y-axis direction in the example shown in FIG. 7*d*.

The semiconductor device 200 in the present example is not provided with a lifetime control region 72 on the upper surface 21 side of the semiconductor substrate 10. Because of this, leakage current at transistor portions 70 can be more suppressed than in the semiconductor device 200 shown in FIG. 5*e*.

Figure 14A:
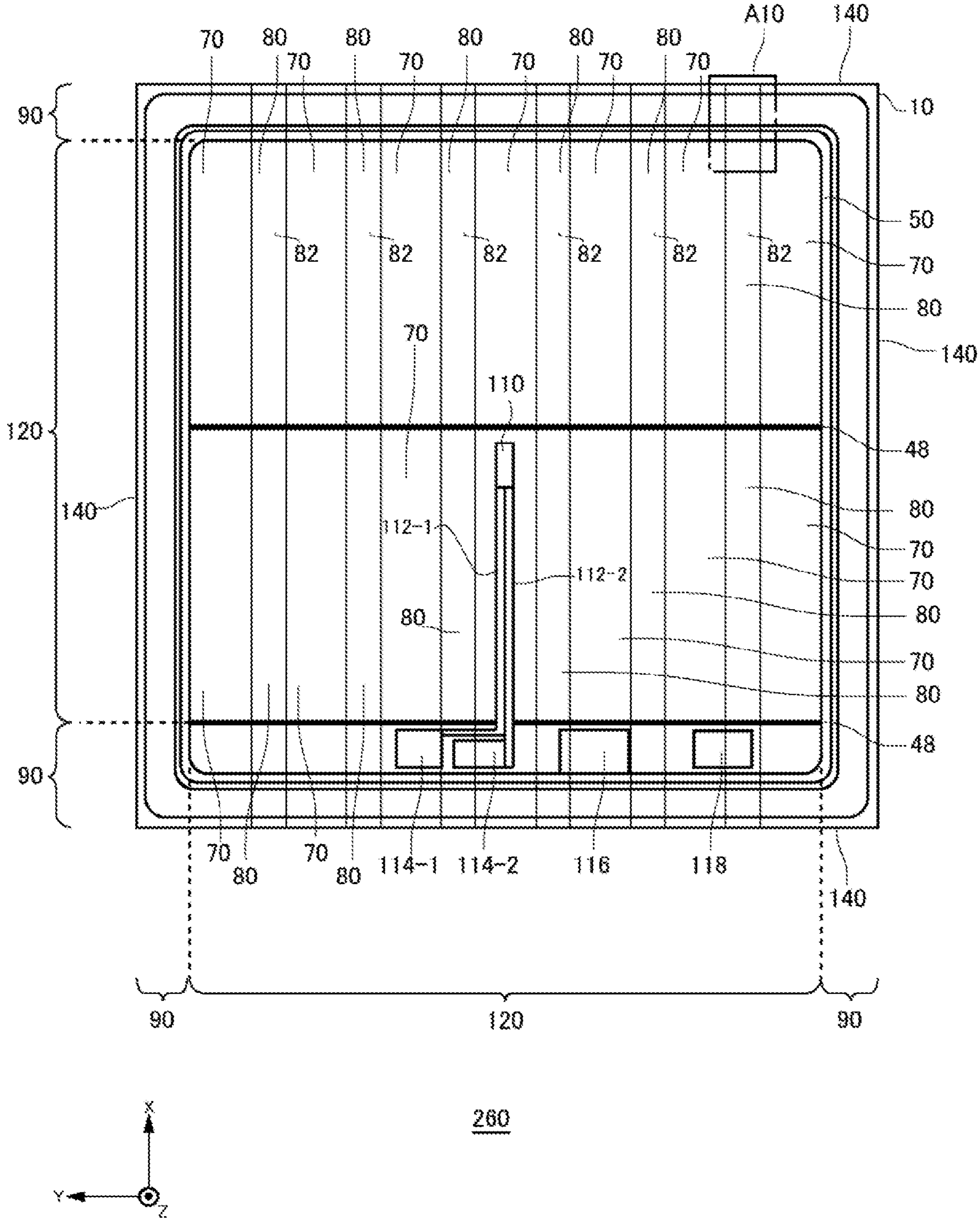
FIG. 14*a* is a figure showing the upper surface of a semiconductor device 260 in a third comparative example.

FIG. 14*a* is a figure showing the upper surface of a semiconductor device 260 in a third comparative example. As described below in explanations with reference to FIG. 14*b* and FIG. 14*c*, the semiconductor device 260 in the third comparative example is different from the semiconductor device 200 shown in FIG. 13*a* in that a first floating region 17 and second floating regions 27 are not provided.

Figure 14B:
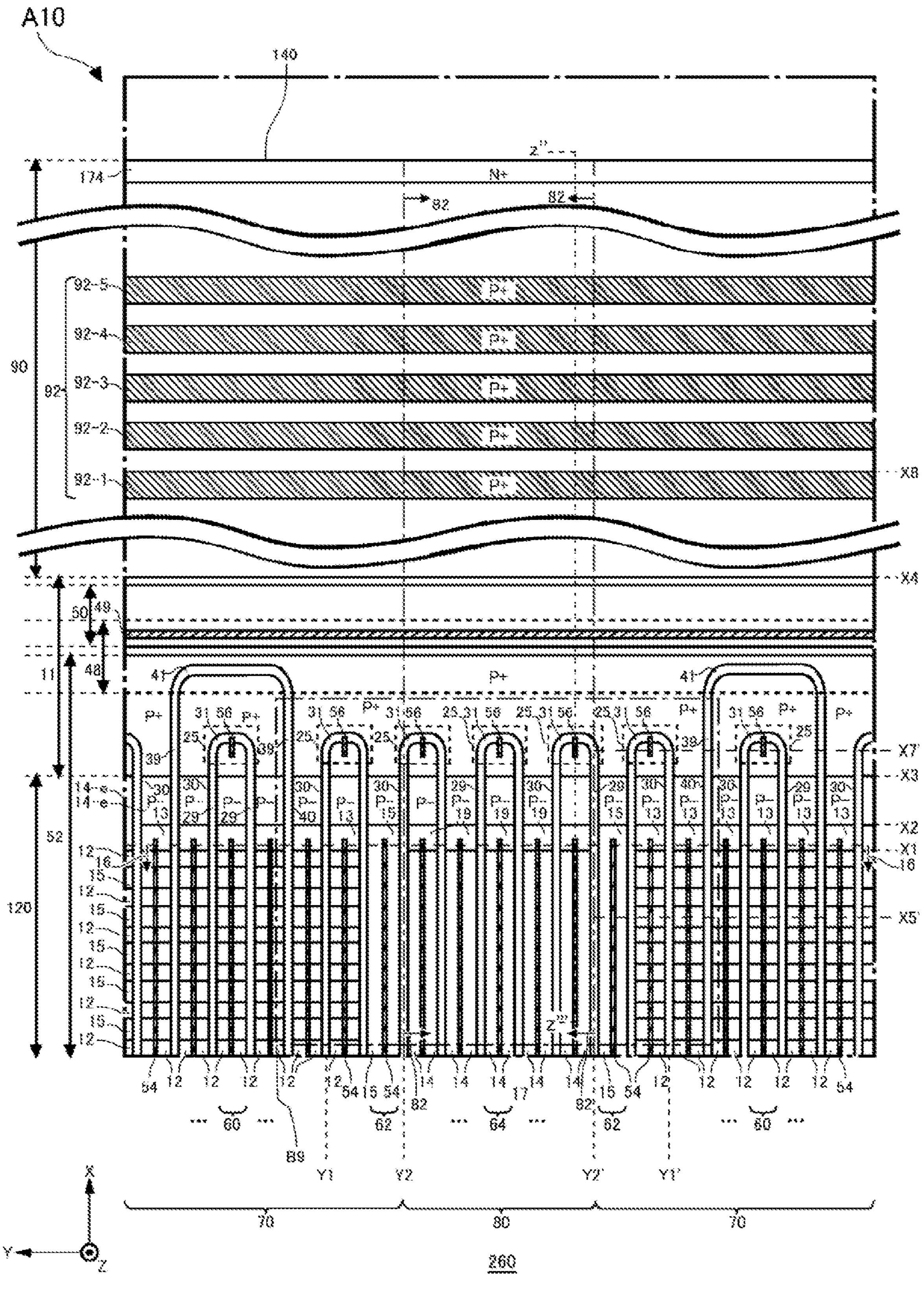
FIG. 14*b* is an enlarged view of a region A10 in FIG. 14*a*.

FIG. 14*b* is an enlarged view of a region A10 in FIG. 14*a*. The semiconductor device 260 in the third comparative example is not provided with a first floating region 17 and second floating regions 27.

Figure 14C:
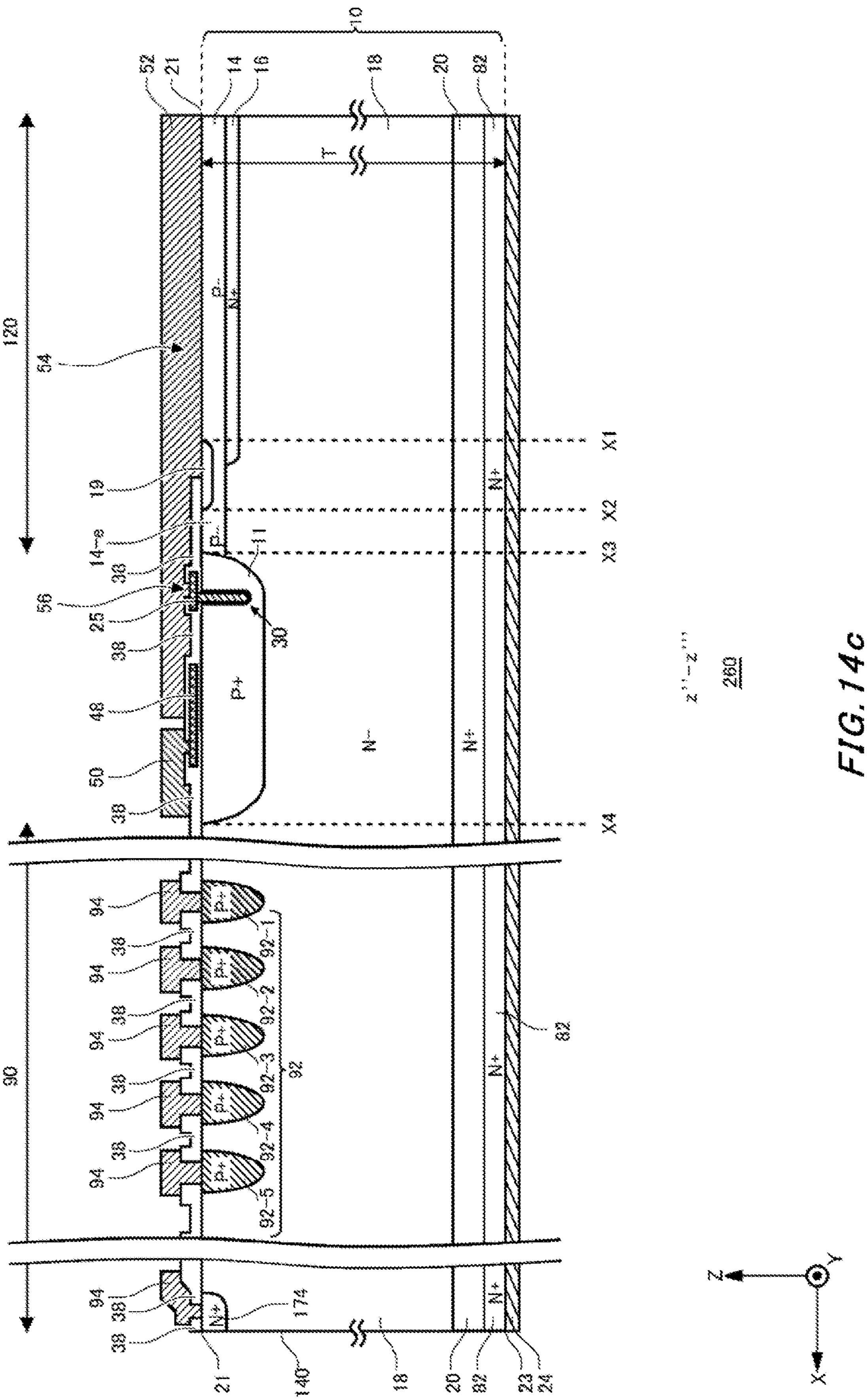
FIG. 14*c* is a figure showing an exemplary cross-section taken along z''-z''' in FIG. 14*b*.

FIG. 14*c* is a figure showing an exemplary cross-section taken along z''-z''' in FIG. 14*b*. The configuration of the z''-z''' cross-section in the semiconductor device 260 in the third comparative example is different from the configuration of the u-u' cross-section shown in FIG. 13*d* in that a first floating region 17 and second floating regions 27 are not provided.

The semiconductor device 260 in the third comparative example is not provided with a first floating region 17 and second floating regions 27 on the lower surface 23 side in the semiconductor substrate 10. Because of this, injection of carriers (electrons in the present example) from the second cathode region 82 to the second contact region 19 and well region 11 cannot be suppressed. Because of this, the reverse recovery withstand capability of the diode portion 80 cannot be improved.

In addition, the semiconductor device 260 in the third comparative example is not provided with a lifetime control region 72 on the lower surface 23 side of the semiconductor substrate 10. Because of this, injection of carriers (holes in the present example) from the second contact region 19 to the active portion 120's middle side of the second cathode region 82 cannot be suppressed. Because of this, the reverse recovery withstand capability of the diode portion 80 cannot be improved.

Figure 15A:
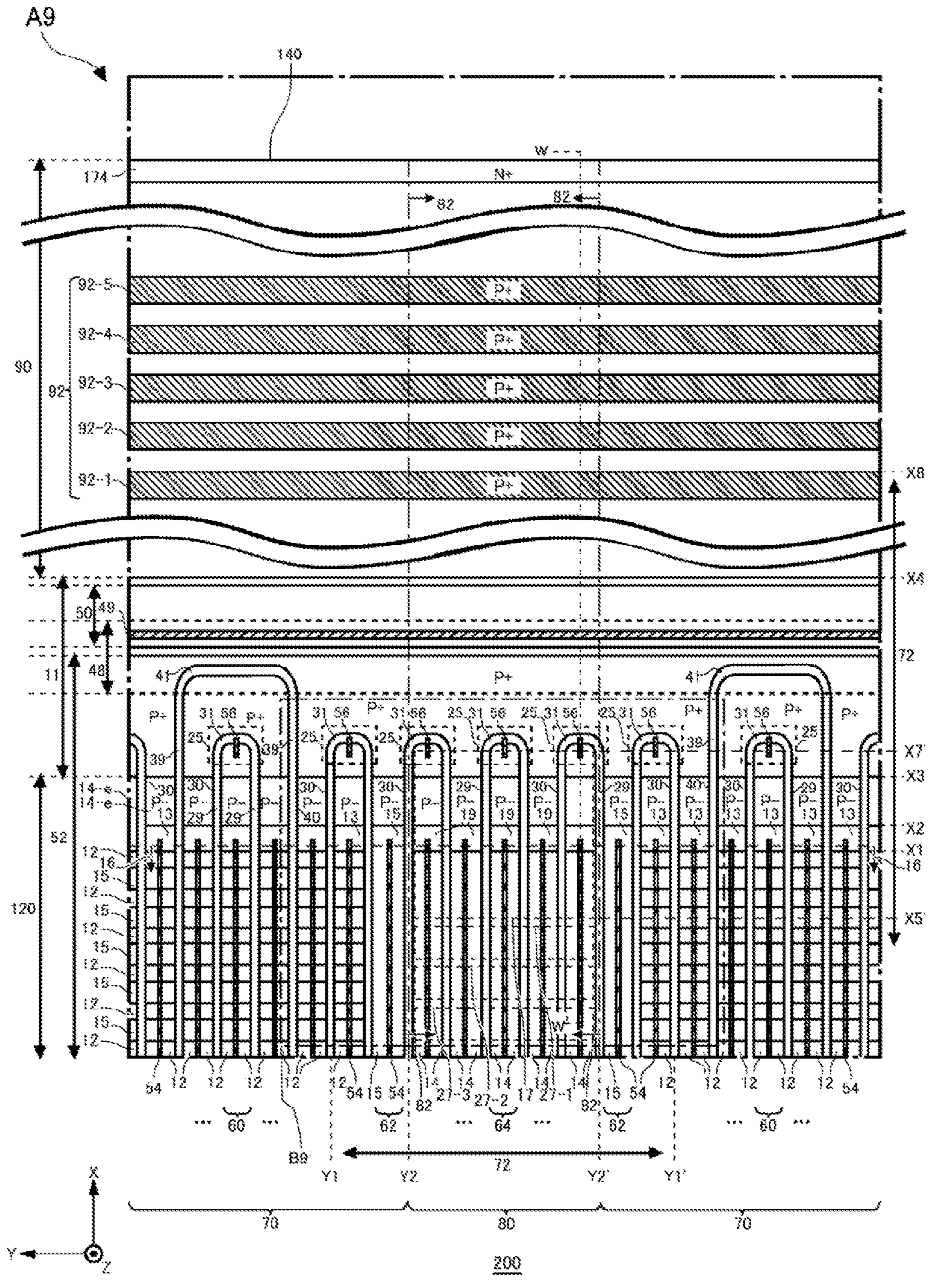
FIG. 15*a* is an enlarged view related to another exemplary region A9 in FIG. 13*a*.

FIG. 15*a* is an enlarged view related to another exemplary region A9 in FIG. 13*a*. The semiconductor device 200 in the present example is different from the semiconductor device 200 shown in FIG. 13*b* in that, as shown in FIG. 15*a*, the lifetime control region 72 is provided in the semiconductor device 200 shown in FIG. 13*b*. In the top view in FIG. 15*a*, the position of the lifetime control region 72 in the Y-axis direction is the same as the position shown in the top view in FIG. 5*b*. The position of the lifetime control region 72 in the X-axis direction covers the X-axis direction negative side past the end portion X5' of the first floating region 17 on the X-axis direction negative side.

Figure 15B:
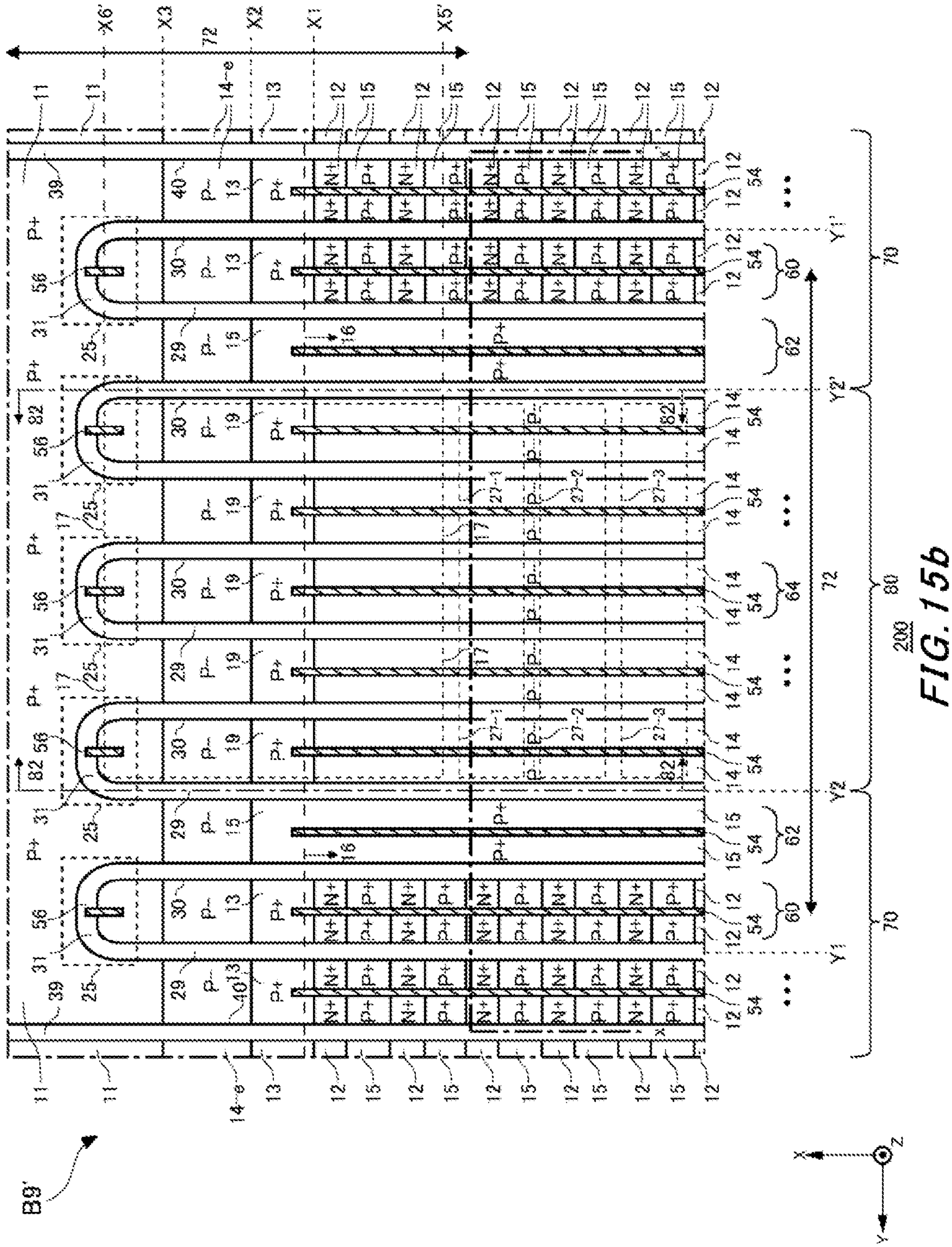
FIG. 15*b* is an enlarged view of a region B9' in FIG. 15*a*.

FIG. 15*b* is an enlarged view of a region B9' in FIG. 15*a*. In FIG. 15*b*, the lifetime control region 72 is provided to reach the X-axis direction negative side past the end portion X5'.

Figure 15C:
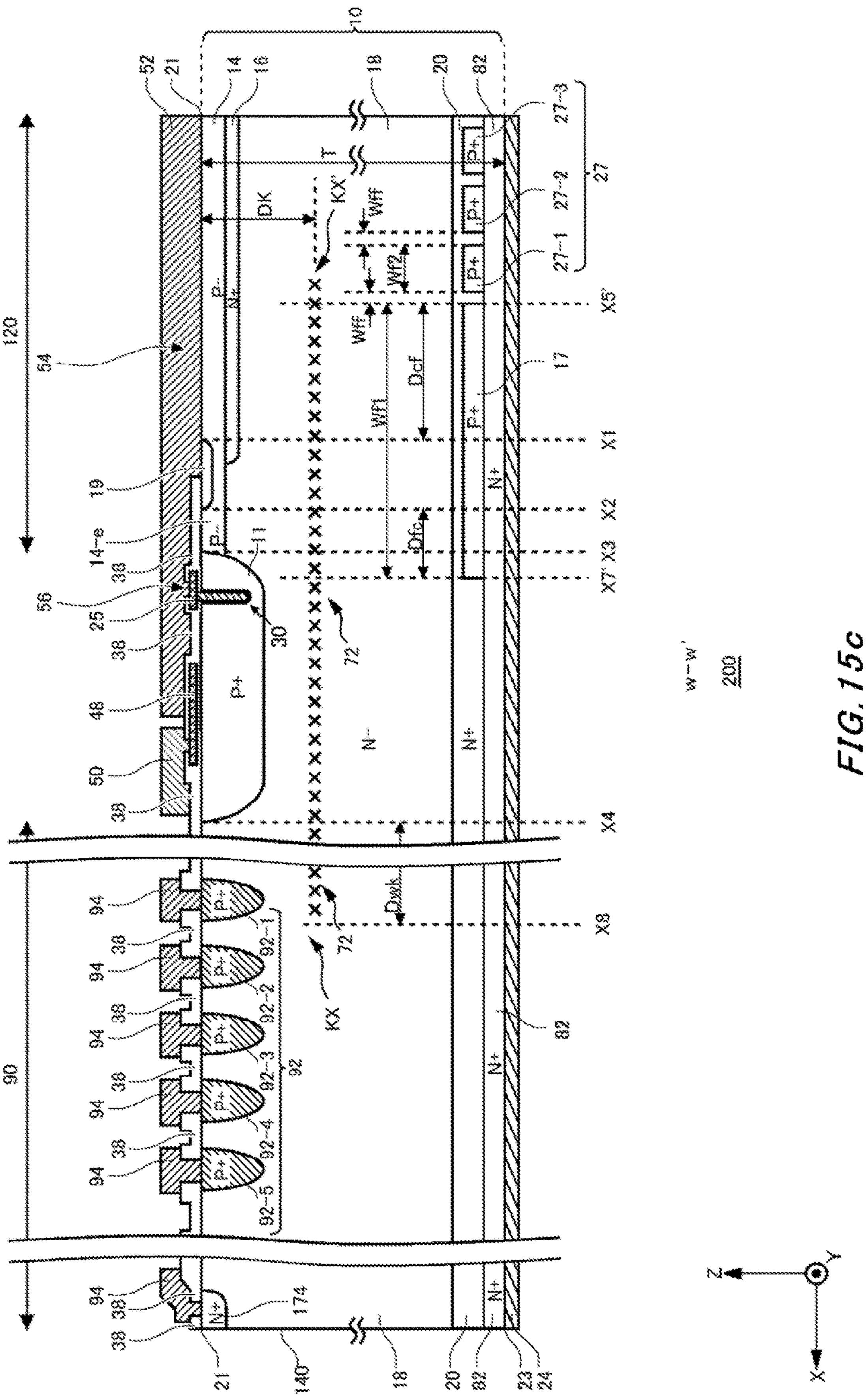
FIG. 15*c* is a figure showing an exemplary cross-section taken along w-w' in FIG. 15*a*.

FIG. 15*c* is a figure showing an exemplary cross-section taken along w-w' in FIG. 15*a*. The configuration of the w-w' cross-section in the semiconductor device 200 shown in FIG. 15*c* is different from the configuration of the u-u' cross-section in the semiconductor device 200 shown in FIG. 13*d* in that the lifetime control region 72 is provided on the upper surface 21 side.

In the present example, the lifetime control region 72 is provided continuously in the X-axis direction from the edge termination structure portion 90 to the active portion 120. The end portion KX' of the lifetime control region 72 on the X-axis direction negative side may be provided on the X-axis direction negative side relative to the end portion X5' of the first floating region 17 on the X-axis direction negative side. That is, in the present example, part of the lifetime control region 72 and the first floating region 17 overlap in the top view of the semiconductor substrate 10.

The end portion KX' may be arranged between the end portion X5' and the end portion X1 in the X-axis direction in FIG. 15*c*. That is, part of the lifetime control region 72 and part of the first floating region 17 may overlap in the top view of the semiconductor substrate 10.

In the semiconductor device 200 in the present example, the end portion KX' reaches the X-axis direction negative side relative to the end portion X5' in the X-axis direction. That is, the lifetime control region 72 is provided on the X-axis direction negative side relative to the end portion X1 of the second contact region 19 on the active portion 120's middle side. Because of this, carriers (holes in the present example) that move from the second contact region 19 to the active portion 120's middle side of the second cathode region 82 are easily cancelled out with electrons in the lifetime control region 72, and it is difficult for the carriers to reach the second cathode region 82. Because of this, the reverse recovery withstand capability of the diode portion 80 can be more improved than in the semiconductor device 200 shown in FIG. 13*d*.

Figure 15D:
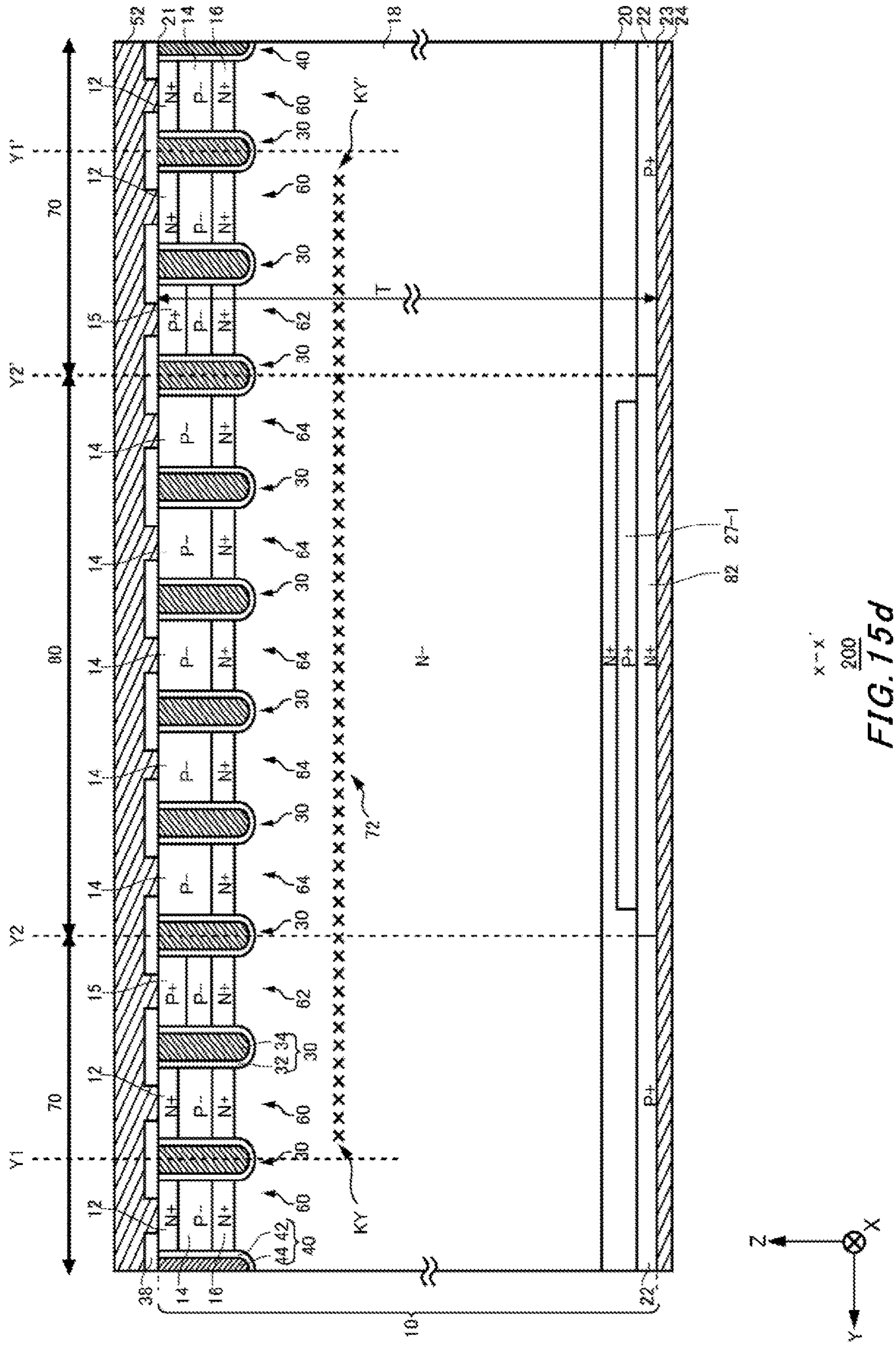
FIG. 15*d* is a figure showing an exemplary cross-section taken along x-x' in FIG. 15*b*.

FIG. 15*d* is a figure showing an exemplary cross-section taken along x-x' in FIG. 15*b*. The configuration of the x-x' cross-section in the semiconductor device 200 in the present example is different from the configuration of the v-v' cross-section in the semiconductor device 200 shown in FIG. 13*e* in that the lifetime control region 72 is provided on the upper surface 21 side.

In the semiconductor device 200 in the present example, as shown in FIG. 15*d*, a lifetime control region 72 is not provided below gate trench portions 40 in transistor portions 70. Because of this, leakage current at the transistor portions 70 can be suppressed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: semiconductor substrate; 11: well region; 12: emitter region; 13: first contact region; 14: base region; 15: third contact region; 16: accumulation region; 17: first floating region; 18: drift region; 19: second contact region; 20: buffer region; 21: upper surface; 22: collector region; 23: lower surface; 24: collector electrode; 25: connection portion; 27: second floating region; 27-1: second floating region; 27-2: second floating region; 27-3: second floating region; 29: extending part; 30: dummy trench portion; 31: connecting part; 32: dummy insulating film; 34: dummy conductive portion; 38: interlayer dielectric film; 39: extending part; 40: gate trench portion; 41: connecting part; 42: gate insulating film; 44: gate conductive portion; 48: gate runner; 49: contact hole; 50: gate metal layer; 52: emitter electrode; 54: contact hole; 56: contact hole; 60: first mesa portion; 62: second mesa portion; 64: third mesa portion; 70: transistor portion; 72: lifetime control region; 80: diode portion; 82: second cathode region; 83: first cathode region; 84: termination region; 90: edge termination structure portion; 92: guard ring; 92-1: guard ring; 92-2; guard ring; 92-3: guard ring; 97-4: guard ring; 92-5: guard ring; 94: field plate; 100: semiconductor device; 112: temperature sensing wire; 114: temperature measuring pad; 114-1: anode pad; 114-2: cathode pad; 116: gate pad; 118: emitter pad; 120: active portion; 140: peripheral end; 150: semiconductor device; 174: channel stopper; 200: semiconductor device; 250: semiconductor device; 260: semiconductor device

What is claimed is:

1. A semiconductor device comprising:

a semiconductor substrate;

an active portion that is provided in the semiconductor substrate and through which current flows between an upper surface and a lower surface of the semiconductor substrate;

a transistor portion provided in the active portion;

a diode portion that is provided in the active portion and arrayed next to the transistor portion along a predetermined array direction in a top view of the semiconductor substrate;

an edge termination structure portion provided between a peripheral end of the semiconductor substrate and the active portion in the top view of the semiconductor substrate; and a lifetime control region including a lifetime killer, the lifetime control region being provided closer to the upper surface of the semiconductor substrate than the lower surface of the semiconductor substrate and across a boundary between the diode portion and the edge termination structure portion, the lifetime control region bordering the diode portion in a direction of extension orthogonal to the array direction in the top view of the semiconductor substrate;

wherein, in the top view, the lifetime control region overlaps a portion of the upper surface of the semiconductor substrate that directly contacts an electrode in the active portion in the direction of extension.

2. The semiconductor device according to claim 1, wherein the edge termination structure portion is provided with a second-conductivity type well region in contact with the upper surface of the semiconductor substrate, and the lifetime control region is provided below the well region and terminates at a position closer to the peripheral end than the well region terminates.

3. The semiconductor device according to claim 1, wherein the diode portion has:

a second-conductivity type contact region provided in contact with the upper surface of the semiconductor substrate;

a first-conductivity type cathode region provided in contact with the lower surface of the semiconductor substrate; and an electrically floating, second-conductivity type first floating region provided above the cathode region, and in the top view, at least part of the first floating region and the contact region overlap in the direction of extension.

4. The semiconductor device according to claim 3, wherein a distance in the direction of extension between an end portion of the first floating region which is closer to the active portion and an end portion of the contact region which is closer to the active portion is longer than a distance in the direction of extension between an end portion of the first floating region which is closer to the peripheral end and an end portion of the contact region which is closer to the peripheral end.

5. The semiconductor device according to claim 3, wherein the diode portion has an electrically floating, second-conductivity type second floating region above the cathode region, and the first floating region and the second floating region are arrayed next to each other in the direction of extension.

6. The semiconductor device according to claim 5, wherein, in the direction of extension, a width of the first floating region is larger than a width of the second floating region.

7. The semiconductor device according to claim 3, wherein the lifetime control region is provided below the contact region.

8. The semiconductor device according to claim 3, wherein a second-conductivity type collector region is provided in contact with the lower surface of the semiconductor substrate at a position closer to the peripheral end than the cathode region is, in the top view, the first floating region is provided above the cathode region and above the collector region, and in the top view, at least part of the lifetime control region and at least part of the first floating region overlap in the direction of extension.

9. The semiconductor device according to claim 8, wherein the cathode region and the collector region are provided in contact with each other, and in the top view, an end portion, in the direction of extension, of the lifetime control region which is closer to the active portion terminates between a boundary between the cathode region and the collector region and an end portion, in the direction of extension, of the first floating region which is closer to the active portion.

10. The semiconductor device according to claim 9, wherein a first-conductivity type termination region is provided at a position closer to the peripheral end than the collector region is, in the top view, and in contact with the lower surface of the semiconductor substrate.

11. The semiconductor device according to claim 10, wherein, in the top view, a distance in the direction of extension between an end portion, in the direction of extension, of the contact region which is closer to the peripheral end and an end portion, in the direction of extension, of the termination region which is closer to the active portion is longer than a thickness of the semiconductor substrate.

12. The semiconductor device according to claim 10, wherein a distance in the direction of extension between an end portion of the contact region which is closer to the active portion and an end portion of the cathode region which is closer to the peripheral end is shorter than a distance in the direction of extension between an end portion of the contact region which is closer to the peripheral end and an end portion of the termination region which is closer to the active portion.

13. The semiconductor device according to claim 3, wherein, in the top view, a distance in the direction of extension between an end portion, in the direction of extension, of the contact region which is closer to the active portion and an end portion, in the direction of extension, of the cathode region which is closer to the peripheral end is longer than a thickness of the semiconductor substrate.

14. The semiconductor device according to claim 13, wherein the distance is 100 μm or longer.

15. The semiconductor device according to claim 1, wherein, in the top view in the direction of extension, the lifetime control region overlaps the cathode region.

16. The semiconductor device according to claim 1, wherein, in the top view in the direction of extension, the lifetime control region does not overlap the cathode region.

17. The semiconductor device according to claim 2, further comprising a guard ring region that is provided closer to the peripheral end than the well region, and that includes one or more guard rings;

wherein, in the top view in the direction of extension, the lifetime control region overlaps the guard ring region.

18. The semiconductor device according to claim 1, further comprising:

a second-conductivity type contact region that is provided in contact with the upper surface of the semiconductor substrate and overlaps, in the top view in the direction of extension, the portion of the upper surface of the semiconductor substrate that directly contacts the electrode.

19. The semiconductor device according to claim 1, further comprising:

an accumulation region that overlaps the lifetime control region.

20. A semiconductor device comprising:

a semiconductor substrate;

an active portion that is provided in the semiconductor substrate and through which current flows between an upper surface and a lower surface of the semiconductor substrate;

a transistor portion provided in the active portion;

a diode portion that is provided in the active portion and arrayed next to the transistor portion along a predetermined array direction in a top view of the semiconductor substrate;

an edge termination structure portion provided between a peripheral end of the semiconductor substrate and the active portion in the top view of the semiconductor substrate;

a lifetime control region including a lifetime killer, the lifetime control region being provided closer to the upper surface of the semiconductor substrate than the lower surface of the semiconductor substrate and across a boundary between the diode portion and the edge termination structure portion, the lifetime control region bordering the diode portion in a direction of extension orthogonal to the array direction in the top view of the semiconductor substrate; and a first-conductivity type cathode region provided in the diode portion in contact with the lower surface of the semiconductor substrate, an end portion of the cathode region closest to the peripheral end of the semiconductor substrate being provided a distance from an end closest to the peripheral end of the semiconductor substrate of a portion of the upper surface of the semiconductor substrate that directly contacts an electrode in the active portion in the top view in the direction of extension, the distance being no less than a thickness of the semiconductor substrate.

21. The semiconductor device according to claim 20, wherein, in the top view in the direction of extension, the lifetime control region overlaps the cathode region.

* * * * *